(12) United States Patent
George et al.

(10) Patent No.: US 9,729,883 B2
(45) Date of Patent: Aug. 8, 2017

(54) ENTROPY CODING OF MOTION VECTOR DIFFERENCES

(71) Applicant: GE Video Compression, LLC, Albany, NY (US)

(72) Inventors: Valeri George, Berlin (DE); Benjamin Bross, Berlin (DE); Heiner Kirchhoffer, Berlin (DE); Detlev Marpe, Berlin (DE); Tung Nguyen, Berlin (DE); Matthias Preiss, Berlin (DE); Mischa Siekmann, Berlin (DE); Jan Stegemann, Berlin (DE); Thomas Wiegand, Berlin (DE)

(73) Assignee: GE VIDEO COMPRESSION, LLC, Albany, NY (US)

( * ) Notice: Subject to any disclaimer, the term of this patent is extended or adjusted under 35 U.S.C. 154(b) by 0 days.

(21) Appl. No.: 15/238,523

(22) Filed: Aug. 16, 2016

(65) Prior Publication Data

US 2016/0360223 A1 Dec. 8, 2016

Related U.S. Application Data

(63) Continuation of application No. 14/108,108, filed on Dec. 16, 2013, now Pat. No. 9,473,170, which is a
(Continued)

(51) Int. Cl.
*H04B 1/66* (2006.01)
*H04N 19/13* (2014.01)
(Continued)

(52) U.S. Cl.
CPC .............. *H04N 19/13* (2014.11); *H03M 7/42* (2013.01); *H04N 19/124* (2014.11);
(Continued)

(58) Field of Classification Search
CPC ..................................................... H04N 19/13
See application file for complete search history.

(56) References Cited

U.S. PATENT DOCUMENTS 5,381,145 A 1/1995 Allen
5,717,394 A 2/1998 Schwartz
(Continued)

FOREIGN PATENT DOCUMENTS

CN 1878309 A 12/2006
CN 101005287 A 7/2007
(Continued)

OTHER PUBLICATIONS

Wiegand "WD3: Working Draft 3 of High-Efficiency Video Coding", 6. JCT-VC Meeting; 97. MPEG Meeting; Mar. 16-23, 2011; Geneva; URL: http://wftp3.itu.int/av-arch/jctvc-site/2011_03_E_Geneva/, No. JCTVC-E603.*
(Continued)

*Primary Examiner* — Jamie Atala
*Assistant Examiner* — Fabio Lima
(74) *Attorney, Agent, or Firm* — Pillsbury Winthrop Shaw Pittman LLP

(57) ABSTRACT

An entropy decoder is configured to, for horizontal and vertical components of motion vector differences, derive a truncated unary code from the data stream using context-adaptive binary entropy decoding with exactly one context per bin position of the truncated unary code, which is common for horizontal and vertical components of the motion vector differences, and an Exp-Golomb code using a constant equi-probability bypass mode to obtain the binarizations of the motion vector differences. A desymbolizer is configured to debinarize the binarizations of the motion vector difference syntax elements to obtain integer values of the horizontal and vertical components of the motion vector (Continued)

differences. A reconstructor is configured to reconstruct a video based on the integer values of the horizontal and vertical components of the motion vector differences.

28 Claims, 14 Drawing Sheets

Related U.S. Application Data continuation of application No. PCT/EP2012/061613, filed on Jun. 18, 2012.

(60) Provisional application No. 61/508,506, filed on Jul. 15, 2011, provisional application No. 61/497,794, filed on Jun. 16, 2011.

(51) Int. Cl.
*H03M 7/42* (2006.01)
*H04N 19/52* (2014.01)
*H04N 19/50* (2014.01)
*H04N 19/70* (2014.01)
*H04N 19/61* (2014.01)
*H04N 19/124* (2014.01)
*H04N 19/513* (2014.01)
*H04N 19/91* (2014.01)

(52) U.S. Cl.
CPC ........... *H04N 19/50* (2014.11); *H04N 19/513* (2014.11); *H04N 19/52* (2014.11); *H04N 19/61* (2014.11); *H04N 19/70* (2014.11); *H04N 19/91* (2014.11)

(56) References Cited

U.S. PATENT DOCUMENTS

| | | | |
|---|---|---|---|
| 5,847,776 A | 12/1998 | Khmelnitsky | |
| 6,771,197 B1 | 8/2004 | Yedidia | |
| 6,894,628 B2 | 5/2005 | Marpe | |
| 6,900,748 B2 | 5/2005 | Marpe | |
| 6,943,710 B2 | 9/2005 | Marpe | |
| 7,221,296 B2 | 5/2007 | Ziauddin | |
| 7,884,743 B2 | 2/2011 | Sakaguchi | |
| 7,932,843 B2 | 4/2011 | Demircin | |
| 8,351,500 B2 | 1/2013 | Shimofure | |
| 9,490,838 B2 * | 11/2016 | Schwarz | H03M 7/4006 |
| 2005/0012648 A1 | 1/2005 | Marpe et al. | |
| 2005/0036551 A1 | 2/2005 | Winger | |
| 2005/0038837 A1 * | 2/2005 | Marpe | H03M 7/40 708/200 |
| 2007/0009027 A1 | 1/2007 | Zhu et al. | |
| 2007/0040711 A1 * | 2/2007 | Ziauddin | H03M 7/4006 341/51 |
| 2007/0041653 A1 | 2/2007 | Lafon | |
| 2008/0162432 A1 | 7/2008 | Wang | |
| 2008/0298464 A1 | 12/2008 | Hinz et al. | |
| 2009/0002379 A1 | 1/2009 | Baeza | |
| 2009/0201986 A1 * | 8/2009 | Schwarz | H03M 7/4006 375/240.02 |
| 2009/0256729 A1 | 10/2009 | Schneider | |
| 2009/0304071 A1 | 12/2009 | Shi et al. | |
| 2010/0303147 A1 | 12/2010 | Miyazaki | |
| 2010/0316118 A1 | 12/2010 | Li et al. | |
| 2011/0206135 A1 | 8/2011 | Drugeon | |
| 2012/0014429 A1 | 1/2012 | Zhao | |
| 2013/0188700 A1 | 7/2013 | Guo et al. | |

FOREIGN PATENT DOCUMENTS

| | | |
|---|---|---|
| CN | 101478672 A | 7/2009 |
| CN | 101517899 A | 8/2009 |
| EP | 1294193 A1 | 3/2003 |
| JP | 2003153265 A | 5/2003 |
| JP | 2005525018 A | 8/2005 |
| JP | 20050223533 A | 8/2005 |
| JP | 2007020141 | 1/2007 |
| JP | 2007228582 A | 9/2007 |
| JP | 2007300455 A | 11/2007 |
| JP | 2007306370 A | 11/2007 |
| JP | 2009171188 A | 7/2009 |
| JP | 2009525627 A | 7/2009 |
| JP | 2009268031 A | 11/2009 |
| JP | 2010268094 A | 11/2010 |
| JP | 2010538547 A | 12/2010 |
| JP | 2012147248 A | 8/2012 |
| KR | 20060038189 A | 5/2006 |
| RU | 2336661 C2 | 10/2008 |
| RU | 2371881 C1 | 10/2009 |
| WO | 2009017301 A1 | 2/2009 |
| WO | 2009/029797 A1 | 3/2009 |

OTHER PUBLICATIONS

Sze "Simplified MVD context selection (Extension of JCTVC-E324)", 6. JCT-VC Meeting; Jul. 14, 2011-Jul. 22, 2011; Torino; URL: http://phenix.it-sudparis.eu/jct/doc_end_user/current_document.php?id=2596 , No. JCTVC-F133, Jun. 30, 2011.*

Decision on Grant, dated Mar. 14, 2016, issued in parallel Russian patent application No. 2014101164, with English translation, 26 pages.

Office Action, dated May 9, 2016, issued in parallel Chinese patent application No. 201280039832.3, with English translation, 10 pages.

Sullivan, G., "Meeting report of the first meeting of the Joint Collaborative Team on Video Coding (JVT-VC), JCT-VC Management", 16 pages.

Decision on Grant, dated May 12, 2016, issued in parallel Japanese patent application No. 2014-515231, 3 pages.

Marpe, et al., Entropy coding in video compression using probability interval partitioning, Picture Coding Symposium (PCS), 2010, pp. 66-69, 5 pages.

Office Action, dated Apr. 26, 2016, issued in parallel Chinese patent application No. 2012800399222, with English translation, 14 pages.

Office Action, dated Mar. 3, 2015, issued in arallel Japanese patent application No. 2014-515229, with English translation, 19 pages.

Kirchhoffer et al., "Reduced complexity PIPE coding using systematic v2v code [online], Joint Collaborative Team on Video Coding (JCT-VC) of ITU-T SG16 WP3 and iSO/IEC JTC1/SC29/WG11, 4th Meeting", Daegu, KR, Jan. 18, 2011 [JCTVC-D380], pp. 1-10, 11 pages.

Encoder-side description of test model under consideration, Joint Collaborative Team in Video Coding (JCT-VC) of ITU-T SG16 WP3 and ISO/IÄEC JTC1/SC29/WG11, Jul. 28, 2010, 2nd Meeting: Geneva, CH, pp. 1-2, 15-19, 8 pages.

Office Action, dated Mar. 3, 2015, issued in parallel Japanese patent application No. 2014-515230, with English translation, 11 pages.

Office Action, dated May 19, 2016, issued in parallel Russian patent application No. 2014101166, with English translation, 5 pages.

Dorot V, L. et al., "Explanatory Dictionary on Modern Computer Vocabulary", 3rd revised and expanded edition, St. Petersburg, "BHV-Petersburg", p. 381, 314 and 452; 6 pages.

Wnken. M. et al., "Description of video coding technology proposal by Fraunhofer HHI", JCT-VC 1st Meeting: Dresden, DE, Apr. 15-23, 2010, 44 pages.

Wiegand, T. et al., "WD3: Working Draft 3 of High-Efficiency Video Coding", JCT-VC 5th Meeting: Geneva, CH, Mar. 16-23, 2011; 160 pages.

Sze, V., Simplified MVD context selection (Extension of E324); 6th Meeting: Torino, IT, Jul. 14-22, 2011; 4 pages.

Sugimoto, K, et al., "High Efficient 1 byte fixed length coding for Low Complexity Entropy Coding—PIPE/V2F", 4th meeting: Daegu, KR, Jan. 2-28, 2011; 8 pages.

Marpe, D., et al., "Novel entropy coding concept", 1st Meeting: Dresden, DE, Apr. 15-23, 2010; 18 pages.

(56) References Cited

OTHER PUBLICATIONS

Marpe, D., et al., Context-Based Adaptive Binary Arithmetic Coding in the H.264/AVC Video Compression Standard, IEEE Transactions on Circuits and Systems for Video Technology, vol. 13, No. 7, Jul. 2003, 18 pages.
Decision to Grant dated Mar. 22, 2016 in parallel Japanese Patent Application No. 2014-515230, and English translation thereto, 5 pages.
Marpe, et al., "Unified PIPE-Based Entropy Coding for HEVC", Joint Collaborative Team on Video Coding (JCT-VC) of ITU-T SG16 WP3 and ISO/IEC JTC1/SC29/WG11 6th Meeting: Torino, IT, Jul. 14-22, 2011, JCTVC-F268, pp. 1-16, 21 pages.
Winken, et al., Description of video coding technology proposal by Fraunhofer HHI, Joint Collaborative Team on Video Coding (JCT-VC), Dresden, DE, Apr. 15-23, 2010, 44 pages.
Dorot V, L. et al., "Explanatory Dictionary on Modern Computer Vocabulary", 3rd revised and expanded edition, St, Petersburg, "BHV-Petersburg", p. 381, 314 and 452; 6 pages.
Office Action dated May 19, 2016 issued in corresponding Russian Patent Application No. 2014101166, with English translation; 5 pages.
Office Action issued Sep. 2, 2016 in Chinese Application 2012800398963.
Notice of Allowance issued on Oct. 28, 2016 in U.S. Appl. No. 15/238,294.
Decision on Grant dated Dec. 1, 2016 issued in Russian Patent Application 2014101166.
Decision on Grant dated Dec. 13, 2016 issued in Ukranian Patent Application a 2016 00953.
Decision of Grant issued Nov. 8, 2016 in Japanese Application No. 2014/515229.
Decision of Grant issued Nov. 14, 2016 in Ukranian Application 2016-00952.
T. Nguyen, et al., "Modified binarization and coding of MVD for PIPE/CABAC", Joint Collaborative Team on Video Coding (JCT-VC) of ITU-T SG16 WP3 and ISO/IEC JTC1/SC29/WG11, 6th Meeting: Torino, IT, Jul. 14-22, 2011, JCTVC-F455 (version 2), URL, http://phenix.int-evry.fr/jct/doc_end_user/current_document.php?id=2930.
T. Nguyen, et al., "Modified binarization and coding of Mvd for PIPE/CABAC", Joint Collaborative Team on Video coding (JCT-VC) of ITU-T SG16 WP3 and ISO/IEC JTC1/SC29/WG11 6th Meeting: Torino, IT, Jul. 14-22, 2011, JCTVC-F455 (version 3), URL, http://phenix.it-sudparis.eu/jct/doc_end_user/documents/6_Torino/wg11/JCTVC-F455-v3.zip.
Office Action issued Dec. 1, 2016 in U.S. Appl. No. 14/108,173.
Office Action dated May 23, 2017 in Japanese Application 2016-084671.

* cited by examiner

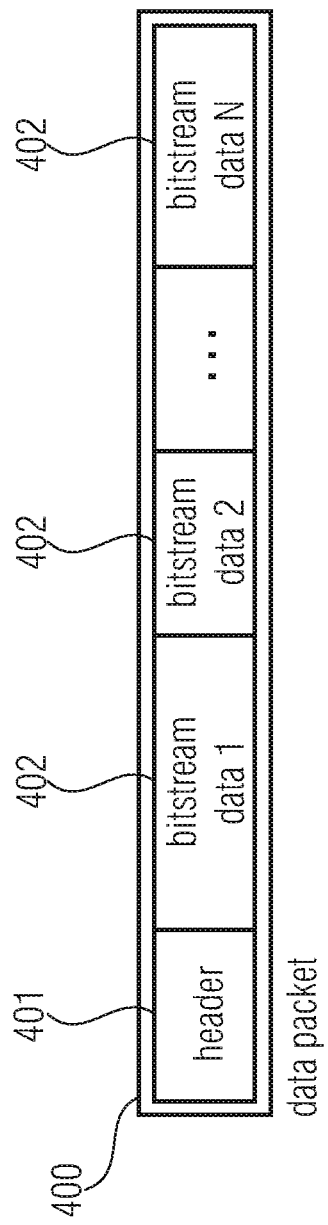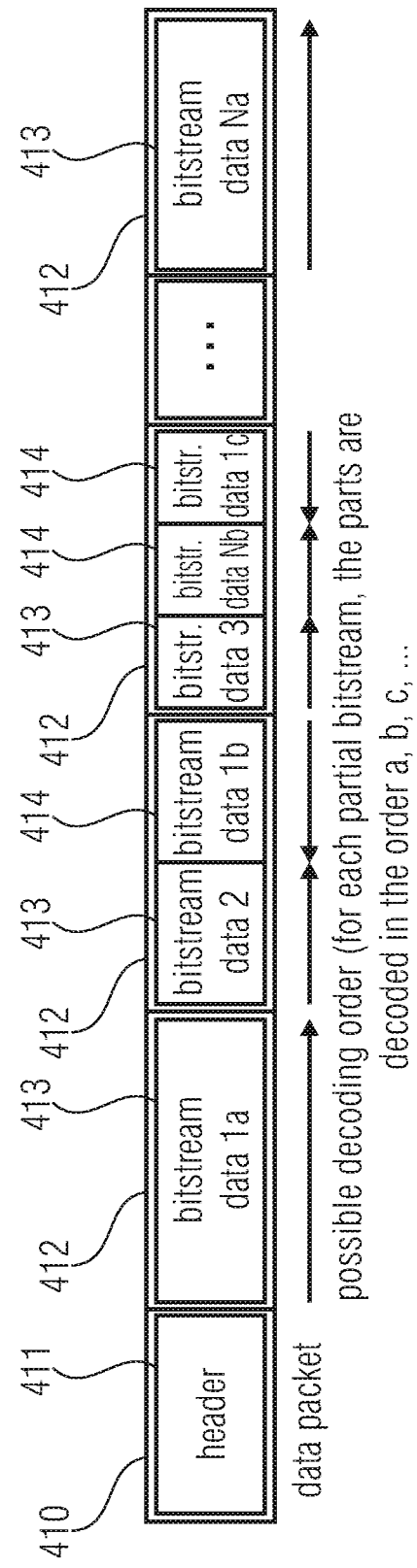

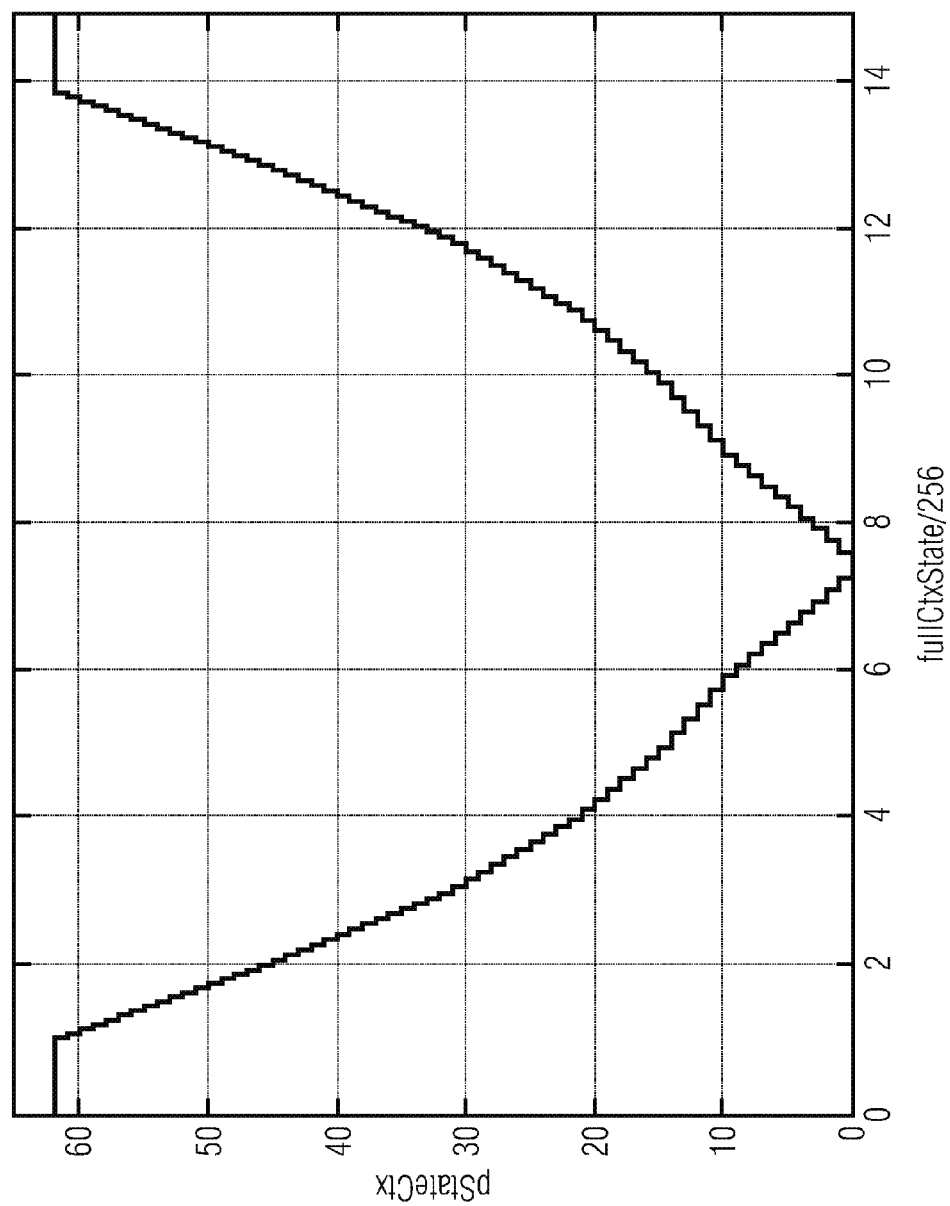

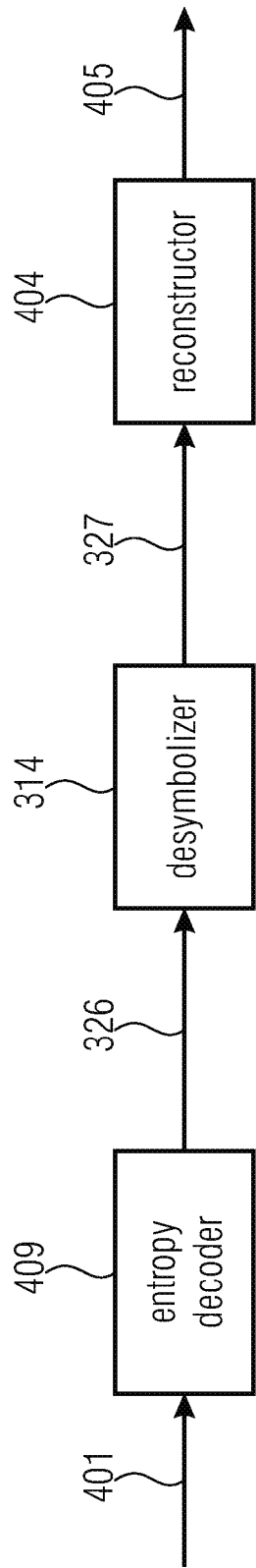
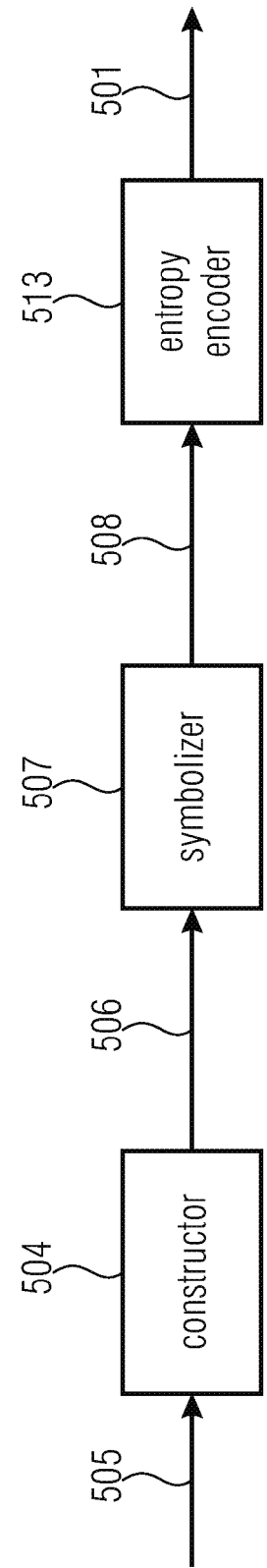

__ENTROPY CODING OF MOTION VECTOR DIFFERENCES__

CROSS-REFERENCE TO RELATED APPLICATIONS

This application is a continuation of U.S. patent application Ser. No. 14/108,108, filed Dec. 16, 2013, which is a continuation of co-pending International Application No. PCT/EP2012/061613, filed Jun. 18, 2012, and additionally claims priority from U.S. Provisional Patent Application No. 61/497,794, filed Jun. 16, 2011 and 61/508,506, filed Jul. 15, 2011, which are all incorporated herein by reference in their entirety.

BACKGROUND OF THE INVENTION

The present invention is concerned with an entropy coding concept for coding video data.

Many video codecs are known in the art. Generally, these codecs reduce the amount of data necessitated in order to represent the video content, i.e. they compress the data. In the context of video coding, it is known that the compression of the video data is advantageously achieved by sequentially applying different coding techniques: motion-compensated prediction is used in order to predict the picture content. The motion vectors determined in motion-compensated prediction as well as the prediction residuum are subject to lossless entropy coding. In order to further reduce the amount of data, the motion vectors themselves are subject to prediction so that merely motion vector differences representing the motion vector prediction residuum, have to be entropy encoded. In H.264, for example, the just-outlined procedure is applied in order to transmit the information on motion vector differences. In particular, the motion vector differences are binarized into bin strings corresponding to a combination of a truncated unary code and, from a certain cutoff value on, an exponential Golomb code. While the bins of the exponential Golomb code are easily coded using an equi-probability bypass mode with fixed probability of 0.5, several contexts are provided for the first bins. The cutoff value is chosen to be nine. Accordingly, a high amount of contexts is provided for coding the motion vector differences.

Providing a high number of contexts, however, not only increases coding complexity, but may also negatively affect the coding efficiency: if a context is visited too rarely, the probability adaptation, i.e. the adaptation of the probability estimation associated with the respective context during the cause of entropy coding, fails to perform effectively. Accordingly, the probability estimations applied inappropriately estimate the actual symbol statistics. Moreover, if for a certain bin of the binarization, several contexts are provided, the selection thereamong may necessitate the inspection of neighboring bins/syntax element values whose necessity may hamper the execution of the decoding process. On the other hand, if the number of contexts is provided too low, bins of highly varying actual symbol statistics are grouped together within one context and accordingly, the probability estimation associated with that context fails to effectively encode the bins associated therewith.

There is an ongoing need to further increase the coding efficiency of entropy coding of motion vector differences.

SUMMARY

According to an embodiment, a decoder for decoding a video from a data stream into which horizontal and vertical components of motion vector differences are coded using binarizations of the horizontal and vertical components, the binarizations equaling a truncated unary code of the horizontal and vertical components, respectively, within a first interval of the domain of the horizontal and vertical components below a cutoff value, and a combination of a prefix in form of the truncated unary code for the cutoff value and a suffix in form of a Exp-Golomb code of the horizontal and vertical components, respectively, within a second interval of the domain of the horizontal and vertical components inclusive and above the cutoff value, wherein the cutoff value is two and the Exp-Golomb code has order one, may have: an entropy decoder configured to, for the horizontal and vertical components of the motion vector differences, derive the truncated unary code from the data stream using context-adaptive binary entropy decoding with exactly one context per bin position of the truncated unary code, which is common for the horizontal and vertical components of the motion vector differences, and the Exp-Golomb code using a constant equi-probability bypass mode to obtain the binarizations of the motion vector differences; a desymbolizer configured to debinarize the binarizations of the motion vector difference syntax elements to obtain integer values of the horizontal and vertical components of the motion vector differences; a reconstructor configured to reconstruct the video based on the integer values of the horizontal and vertical components of the motion vector differences.

According to another embodiment, an encoder for encoding a video into a data stream may have: a constructor configured to predictively code the video by motion compensated prediction using motion vectors and predictively coding the motion vectors by predicting the motion vectors and setting integer values of horizontal and vertical components of motion vector differences to represent a prediction error of the predicted motion vectors; a symbolizer configured to binarize the integer values to obtain binarizations of the horizontal and vertical components of the motion vector differences, the binarizations equaling a truncated unary code of the horizontal and vertical components, respectively, within a first interval of the domain of the horizontal and vertical components below a cutoff value, and a combination of a prefix in form of the truncated unary code for the cutoff value and a suffix in form of a Exp-Golomb code of the horizontal and vertical components, respectively, within a second interval of the domain of the horizontal and vertical components inclusive and above the cutoff value, wherein the cutoff value is two and the Exp-Golomb code has order one; and an entropy encoder configured to, for the horizontal and vertical components of the motion vector differences, encode the truncated unary code into the data stream using context-adaptive binary entropy encoding with exactly one context per bin position of the truncated unary code, which is common for the horizontal and vertical components of the motion vector differences, and the Exp-Golomb code using a constant equi-probability bypass mode.

According to another embodiment, a method for decoding a video from a data stream into which horizontal and vertical components of motion vector differences are coded using binarizations of the horizontal and vertical components, the binarizations equaling a truncated unary code of the horizontal and vertical components, respectively, within a first interval of the domain of the horizontal and vertical components below a cutoff value, and a combination of a prefix in form of the truncated unary code for the cutoff value and a suffix in form of a Exp-Golomb code of the horizontal and vertical components, respectively, within a second interval of the domain of the horizontal and vertical components inclusive and above the cutoff value, wherein the cutoff value is two and the Exp-Golomb code has order one, may have the steps of: for the horizontal and vertical components of the motion vector differences, deriving the truncated unary code from the data stream using context-adaptive binary entropy decoding with exactly one context per bin position of the truncated unary code, which is common for the horizontal and vertical components of the motion vector differences, and the Exp-Golomb code using a constant equi-probability bypass mode to obtain the binarizations of the motion vector differences; debinarizing the binarizations of the motion vector difference syntax elements to obtain integer values of the horizontal and vertical components of the motion vector differences; reconstructing the video based on the integer values of the horizontal and vertical components of the motion vector differences. According to another embodiment, a method for encoding a video into a data stream may have the steps of: predictively coding the video by motion compensated prediction using motion vectors and predictively coding the motion vectors by predicting the motion vectors and setting integer values of horizontal and vertical components of motion vector differences to represent a prediction error of the predicted motion vectors; binarizing the integer values to obtain binarizations of the horizontal and vertical components of the motion vector differences, the binarizations equaling a truncated unary code of the horizontal and vertical components, respectively, within a first interval of the domain of the horizontal and vertical components below a cutoff value, and a combination of a prefix in form of the truncated unary code for the cutoff value and a suffix in form of a Exp-Golomb code of the horizontal and vertical components, respectively, within a second interval of the domain of the horizontal and vertical components inclusive and above the cutoff value, wherein the cutoff value is two and the Exp-Golomb code has order one; and for the horizontal and vertical components of the motion vector differences, encoding the truncated unary code into the data stream using context-adaptive binary entropy encoding with exactly one context per bin position of the truncated unary code, which is common for the horizontal and vertical components of the motion vector differences, and the Exp-Golomb code using a constant equi-probability bypass mode.

Another embodiment may have a computer program having a program code for performing, when running on a computer, the inventive methods.

A basic finding of the present invention is that the coding efficiency of entropy coding of motion vector differences may further be increased by reducing the cutoff value up to which the truncated unary code is used in order to binarize the motion vector differences, down to two so that there are merely two bin positions of the truncated unary code, and if an order of one is used for the exponential Golomb code for the binarization of the motion vector differences from the cutoff value on and if, additionally, exactly one context is provided for the two bin positions of the truncated unary code, respectively, so that context selection based on bins or syntax element values of neighboring image blocks is not necessitated and a too fine classification of the bins at these bin positions into contexts is avoided so that probability adaptation works properly, and if the same contexts are used for horizontal and vertical components thereby further reducing the negative effects of a too fine context subdivision.

Further, it has been found out that the just-mentioned settings with regard to the entropy coding of motion vector differences is especially valuable when combining same with advanced methods of predicting the motion vectors and reducing the necessitated amount of motion vector differences to be transmitted. For example, multiple motion vector predictors may be provided so as to obtain an ordered list of motion vector predictors, and an index into this list of motion vector predictors may be used so as to determine the actual motion vector predictor the prediction residual of which is represented by the motion vector difference in question. Although the information on the list index used has to be derivable from the data stream at the decoding side, the overall prediction quality of the motion vectors is increased and accordingly, the magnitude of the motion vector differences is further reduced so that altogether, the coding efficiency is increased further and the reduction of the cutoff value and the common use of the context for horizontal and vertical components of the motion vector differences fits to such an improved motion vector prediction. On the other hand, merging may be used in order to reduce the number of motion vector differences to be transmitted within the data stream: to this end, merging information may be conveyed within the data stream signaling to the decoder blocks of a subdivision of blocks which are grouped into a group of blocks. The motion vector differences may then be transmitted within the data stream in units of these merged groups instead of the individual blocks, thereby reducing the number of motion vector differences having to be transmitted. As this clustering of blocks reduces the inter-correlation between neighboring motion vector differences, the just-mentioned omittance of the provision of several contexts for one bin position prevents the entropy coding scheme from a too fine classification into contexts depending on neighboring motion vector differences. Rather, the merging concept already exploits the inter-correlation between motion vector differences of neighboring blocks and accordingly, one context for one bin position—the same for horizontal and vertical components—is sufficient.

BRIEF DESCRIPTION OF THE DRAWINGS

Embodiments of the present invention will be detailed subsequently referring to the appended drawings, in which:

FIG. 9 shows a schematic diagram illustrating a data packet with multiplexed partial bitstreams according to an embodiment;

FIG. 10 shows a schematic diagram illustrating a data packet with an alternative segmentation using fixed-size segments according to a further embodiment;

FIG. 15 shows mapping of pStateCtx and fullCtxState/256E.

FIG. 16 shows a decoder according to an embodiment of the present invention; and FIG. 17 shows an encoder according to an embodiment of the present invention.

DETAILED DESCRIPTION OF THE INVENTION

It is noted that during the description of the figures, elements occurring in several of these Figures are indicated with the same reference sign in each of these Figures and a repeated description of these elements as far as the functionality is concerned is avoided in order to avoid unnecessitated repetitions. Nevertheless, the functionalities and descriptions provided with respect to one figure shall also apply to other Figures unless the opposite is explicitly indicated.

In the following, firstly, embodiments of a general video coding concept are described, with respect to FIGS. 1 to 10. FIGS. 1 to 6 relate to the part of the video codec operating on the syntax level. The following FIGS. 8 to 10 relate to embodiments for the part of the code relating to the conversion of the syntax element stream to the data stream and vice versa. Then, specific aspects and embodiments of the present invention are described in form of possible implementations of the general concept representatively outlined with regard to FIGS. 1 to 10.

Figure 1:
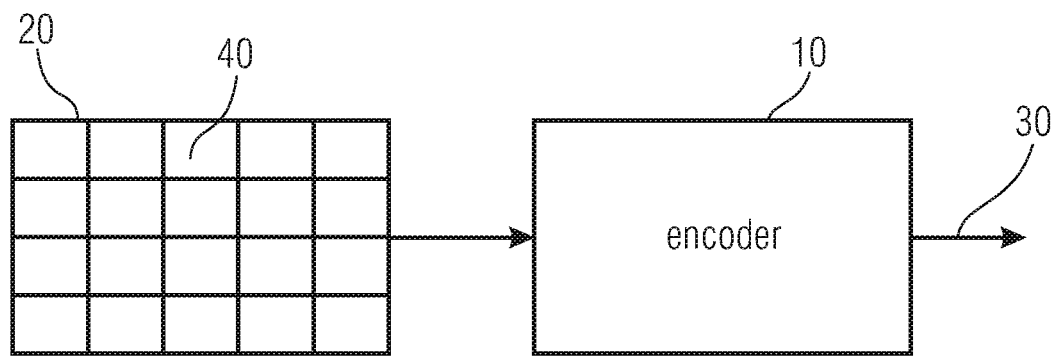
FIG. 1 shows a block diagram of an encoder according to an embodiment.

FIG. 1 shows an example for an encoder 10 in which aspects of the present application may be implemented.

The encoder encodes an array of information samples 20 into a data stream. The array of information samples may represent information samples corresponding to, for example, brightness values, color values, luma values, chroma values or the like. However, the information samples may also be depth values in case of the sample array 20 being a depth map generated by, for example, a time of light sensor or the like.

The encoder 10 is a block-based encoder. That is, encoder 10 encodes the sample array 20 into the data stream 30 in units of blocks 40. The encoding in units of blocks 40 does not necessarily mean that encoder 10 encodes these blocks 40 totally independent from each other. Rather, encoder 10 may use reconstructions of previously encoded blocks in order to extrapolate or intra-predict remaining blocks, and may use the granularity of the blocks for setting coding parameters, i.e. for setting the way each sample array region corresponding to a respective block is coded.

Further, encoder 10 is a transform coder. That is, encoder 10 encodes blocks 40 by using a transform in order to transfer the information samples within each block 40 from spatial domain into spectral domain. A two-dimensional transform such as a DCT of FFT or the like may be used. The blocks 40 are of quadratic shape or rectangular shape.

The sub-division of the sample array 20 into blocks 40 shown in FIG. 1 merely serves for illustration purposes. FIG. 1 shows the sample array 20 as being sub-divided into a regular two-dimensional arrangement of quadratic or rectangular blocks 40 which abut to each other in a non-overlapping manner. The size of the blocks 40 may be predetermined. That is, encoder 10 may not transfer an information on the block size of blocks 40 within the data stream 30 to the decoding side. For example, the decoder may expect the predetermined block size.

However, several alternatives are possible. For example, the blocks may overlap each other. The overlapping may, however, be restricted to such an extent that each block has a portion not overlapped by any neighboring block, or such that each sample of the blocks is overlapped by, at the maximum, one block among the neighboring blocks arranged in juxtaposition to the current block along a predetermined direction. The latter would mean that the left and right hand neighbor blocks may overlap the current block so as to fully cover the current block but they may not overlay each other, and the same applies for the neighbors in vertical and diagonal direction.

As a further alternative, the sub-division of sample array 20 into blocks 40 may be adapted to the content of the sample array 20 by the encoder 10 with the sub-division information on the sub-division used being transferred to the decoder side via bitstream 30.

Figure 2A:
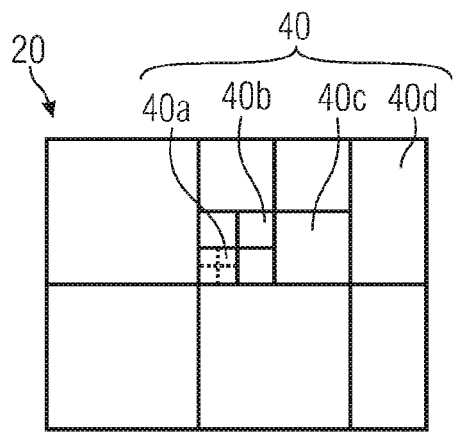
FIGS. 2A-2C schematically show different sub-divisions of a sample array such as a picture into blocks.
Figure 2B:
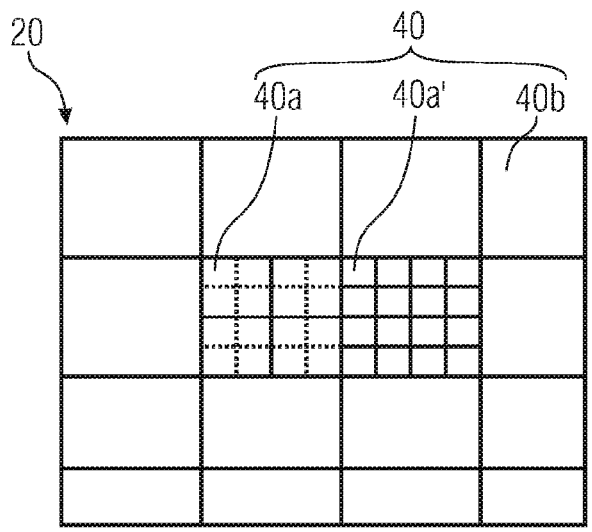
Figure 2C:
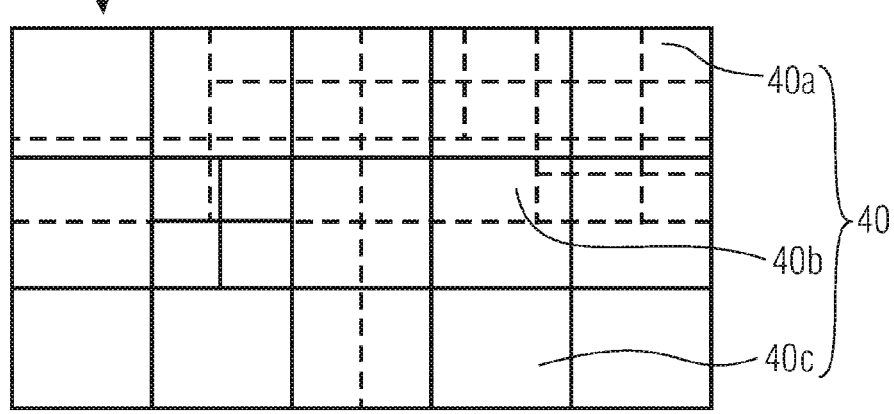

FIGS. 2A to 2C show different examples for a sub-division of a sample array 20 into blocks 40. FIG. 2A shows a quadtree-based sub-division of a sample array 20 into blocks 40 of different sizes, with representative blocks being indicated at 40a, 40b, 40c and 40d with increasing size. In accordance with the sub-division of FIG. 2A, the sample array 20 is firstly divided into a regular two-dimensional arrangement of tree blocks 40d which, in turn, have individual sub-division information associated therewith according to which a certain tree block 40d may be further sub-divided according to a quadtree structure or not. The tree block to the left of block 40d is exemplarily sub-divided into smaller blocks in accordance with a quadtree structure. The encoder 10 may perform one two-dimensional transform for each of the blocks shown with solid and dashed lines in FIG. 2A. In other words, encoder 10 may transform the array 20 in units of the block subdivision.

Instead of a quadtree-based sub-division a more general multi tree-based sub-division may be used and the number of child nodes per hierarchy level may differ between different hierarchy levels.

FIG. 2B shows another example for a sub-division. In accordance with FIG. 2B, the sample array 20 is firstly divided into macroblocks 40b arranged in a regular two-dimensional arrangement in a non-overlapping mutually abutting manner wherein each macroblock 40b has associated therewith sub-division information according to which a macroblock is not sub-divided, or, if subdivided, sub-divided in a regular two-dimensional manner into equally-sized sub-blocks so as to achieve different sub-division granularities for different macroblocks. The result is a sub-division of the sample array 20 in differently-sized blocks 40 with representatives of the different sizes being indicated at 40a, 40b and 40a'. As in FIG. 2A, the encoder 10 performs a two-dimensional transform on each of the blocks shown in FIG. 2B with the solid and dashed lines. FIG. 2C will be discussed later.

Figure 3:
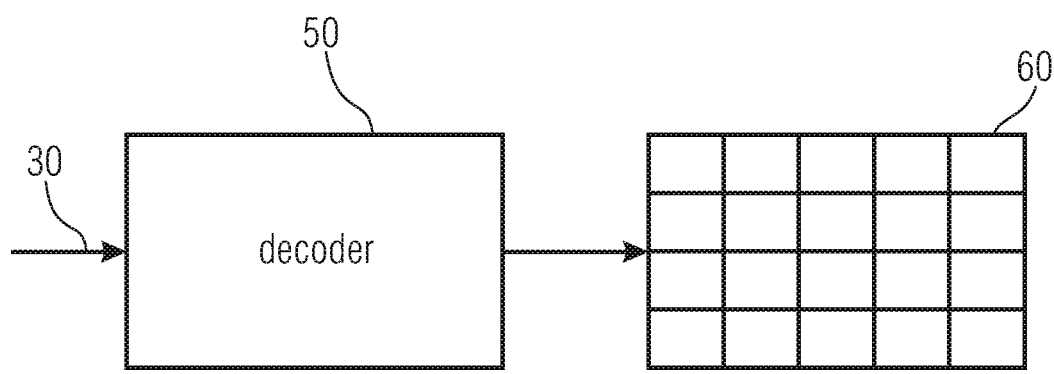
FIG. 3 shows a block diagram of a decoder according to an embodiment.

FIG. 3 shows a decoder 50 being able to decode the data stream 30 generated by encoder 10 to reconstruct a reconstructed version 60 of the sample array 20. Decoder 50 extracts from the data stream 30 the transform coefficient block for each of the blocks 40 and reconstructs the reconstructed version 60 by performing an inverse transform on each of the transform coefficient blocks.

Encoder 10 and decoder 50 may be configured to perform entropy encoding/decoding in order to insert the information on the transform coefficient blocks into, and extract this information from the data stream, respectively. Details in this regard in accordance with different embodiments are described later. It should be noted that the data stream 30 not necessarily comprises information on transform coefficient blocks for all the blocks 40 of the sample array 20. Rather, as sub-set of blocks 40 may be coded into the bitstream 30 in another way. For example, encoder 10 may decide to refrain from inserting a transform coefficient block for a certain block of blocks 40 with inserting into the bitstream 30 alternative coding parameters instead which enable the decoder 50 to predict or otherwise fill the respective block in the reconstructed version 60. For example, encoder 10 may perform a texture analysis in order to locate blocks within sample array 20 which may be filled at the decoder side by decoder by way of texture synthesis and indicate this within the bitstream accordingly.

Figure 4:
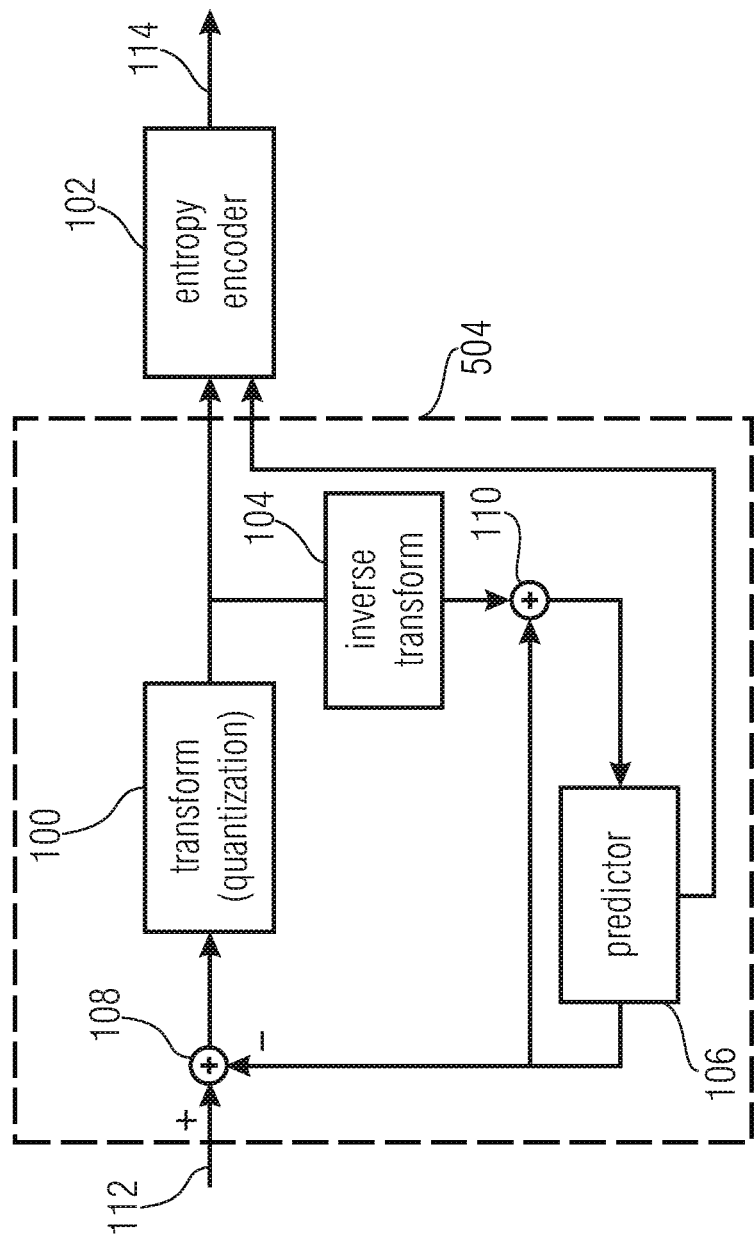
FIG. 4 shows a block diagram of an encoder according to an embodiment in more detail.

As discussed with respect to the following Figures, the transform coefficient blocks not necessarily represent a spectral domain representation of the original information samples of a respective block 40 of the sample array 20. Rather, such a transform coefficient block may represent a spectral domain representation of a prediction residual of the respective block 40. FIG. 4 shows an embodiment for such an encoder. The encoder of FIG. 4 comprises a transform stage 100, an entropy coder 102, an inverse transform stage 104, a predictor 106 and a subtractor 108 as well as an adder 110. Subtractor 108, transform stage 100 and entropy coder 102 are serially connected in the order mentioned between an input 112 and an output 114 of the encoder of FIG. 4. The inverse transform stage 104, adder 110 and predictor 106 are connected in the order mentioned between the output of transform stage 100 and the inverting input of subtractor 108, with the output of predictor 106 also being connected to a further input of adder 110.

The coder of FIG. 4 is a predictive transform-based block coder. That is, the blocks of a sample array 20 entering input 112 are predicted from previously encoded and reconstructed portions of the same sample array 20 or previously coded and reconstructed other sample arrays which may precede or succeed the current sample array 20 in presentation time. The prediction is performed by predictor 106. Subtractor 108 subtracts the prediction from such a original block and the transform stage 100 performs a two-dimensional transformation on the prediction residuals. The two-dimensional transformation itself or a subsequent measure inside transform stage 100 may lead to a quantization of the transformation coefficients within the transform coefficient blocks. The quantized transform coefficient blocks are losslessly coded by, for example, entropy encoding within entropy encoder 102 with the resulting data stream being output at output 114. The inverse transform stage 104 reconstructs the quantized residual and adder 110, in turn, combines the reconstructed residual with the corresponding prediction in order to obtain reconstructed information samples based on which predictor 106 may predict the afore-mentioned currently encoded prediction blocks. Predictor 106 may use different prediction modes such as intra prediction modes and inter prediction modes in order to predict the blocks and the prediction parameters are forwarded to entropy encoder 102 for insertion into the data stream. For each inter-predicted prediction block, respective motion data is inserted into the bitstream via entropy encoder 114 in order to enable the decoding side to redo the prediction. The motion data for a prediction block of a picture may involve a syntax portion including a syntax element representing a motion vector difference differentially coding the motion vector for the current prediction block relative to a motion vector predictor derived, for example, by way of a prescribed method from the motion vectors of neighboring already encoded prediction blocks.

That is, in accordance with the embodiment of FIG. 4, the transform coefficient blocks represent a spectral representation of a residual of the sample array rather than actual information samples thereof That is, in accordance with the embodiment of FIG. 4, a sequence of syntax elements may enter entropy encoder 102 for being entropy encoded into data stream 114. The sequence of syntax elements may comprise motion vector difference syntax elements for inter-prediction blocks and syntax elements concerning a significance map indicating positions of significant transform coefficient levels as well as syntax elements defining the significant transform coefficient levels themselves, for transform blocks.

It should be noted that several alternatives exist for the embodiment of FIG. 4 with some of them having been described within the introductory portion of the specification which description is incorporated into the description of FIG. 4 herewith.

Figure 5:
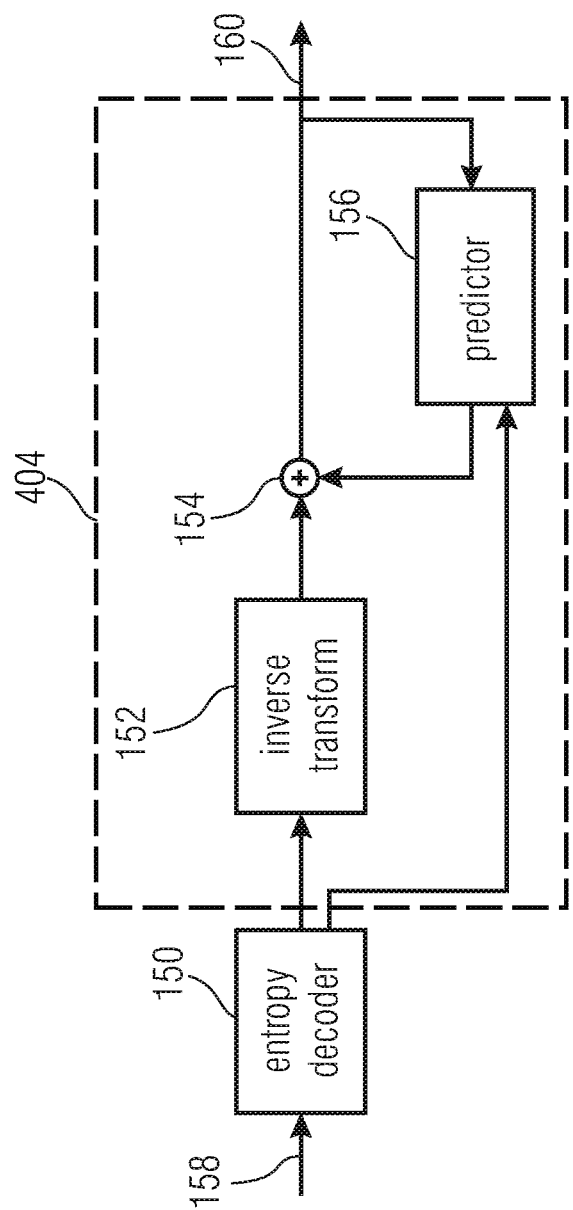
FIG. 5 shows a block diagram of a decoder according to an embodiment in more detail.

FIG. 5 shows a decoder able to decode a data stream generated by the encoder of FIG. 4. The decoder of FIG. 5 comprises an entropy decoder 150, an inverse transform stage 152, an adder 154 and a predictor 156. Entropy decoder 150, inverse transform stage 152, and adder 154 are serially connected between an input 158 and an output 160 of the decoder of FIG. 5 in the order mentioned. A further output of entropy decoder 150 is connected to predictor 156 which, in turn, is connected between the output of adder 154 and a further input thereof The entropy decoder 150 extracts, from the data stream entering the decoder of FIG. 5 at input 158, the transform coefficient blocks wherein an inverse transform is applied to the transform coefficient blocks at stage 152 in order to obtain the residual signal. The residual signal is combined with a prediction from predictor 156 at adder 154 so as to obtain a reconstructed block of the reconstructed version of the sample array at output 160. Based on the reconstructed versions, predictor 156 generates the predictions thereby rebuilding the predictions performed by predictor 106 at the encoder side. In order to obtain the same predictions as those used at the encoder side, predictor 156 uses the prediction parameters which the entropy decoder 150 also obtains from the data stream at input 158.

It should be noted that in the above-described embodiments, the spatial granularity at which the prediction and the transformation of the residual is performed, do not have to be equal to each other. This is shown in FIG. 2C. This figure shows a sub-division for the prediction blocks of the prediction granularity with solid lines and the residual granularity with dashed lines. As can be seen, the subdivisions may be selected by the encoder independent from each other. To be more precise, the data stream syntax may allow for a definition of the residual subdivision independent from the prediction subdivision. Alternatively, the residual subdivision may be an extension of the prediction subdivision so that each residual block is either equal to or a proper subset of a prediction block. This is shown on FIG. 2A and FIG. 2B, for example, where again the prediction granularity is shown with solid lines and the residual granularity with dashed lines. That is, in FIG. 2A-2C, all blocks having a reference sign associated therewith would be residual blocks for which one two-dimensional transform would be performed while the greater solid line blocks encompassing the dashed line blocks 40a, for example, would be prediction blocks for which a prediction parameter setting is performed individually.

Figure 6:
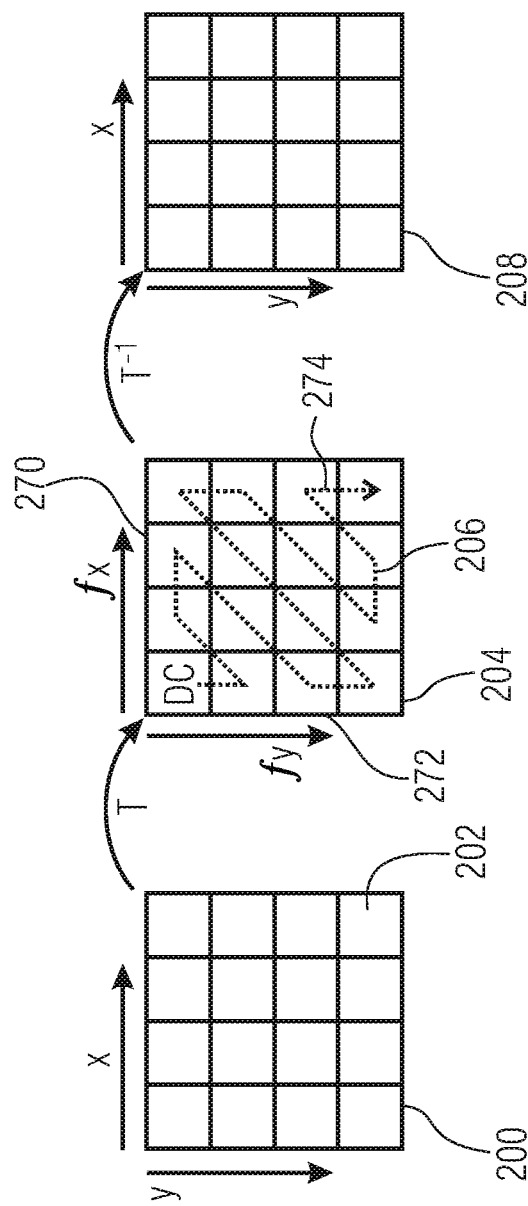
FIG. 6 schematically illustrates a transform of a block from spatial domain into spectral domain, the resulting transform block and its retransformation.

The above embodiments have in common that a block of (residual or original) samples is to be transformed at the encoder side into a transform coefficient block which, in turn, is to be inverse transformed into a reconstructed block of samples at the decoder side. This is illustrated in FIG. 6. FIG. 6 shows a block of samples 200. In case of FIG. 6, this block 200 is exemplarily quadratic and 4×4 samples 202 in size. The samples 202 are regularly arranged along a horizontal direction x and vertical direction y. By the above-mentioned two-dimensional transform T, block 200 is transformed into spectral domain, namely into a block 204 of transform coefficients 206, the transform block 204 being of the same size as block 200. That is, transform block 204 has as many transform coefficients 206 as block 200 has samples, in both horizontal direction and vertical direction. However, as transform T is a spectral transformation, the positions of the transform coefficients 206 within transform block 204 do not correspond to spatial positions but rather to spectral components of the content of block 200. In particular, the horizontal axis of transform block 204 corresponds to an axis along which the spectral frequency in the horizontal direction monotonically increases while the vertical axis corresponds to an axis along which the spatial frequency in the vertical direction monotonically increases wherein the DC component transform coefficient is positioned in a corner—here exemplarily the top left corner—of block 204 so that at the bottom right-hand corner, the transform coefficient 206 corresponding to the highest frequency in both horizontal and vertical direction is positioned. Neglecting the spatial direction, the spatial frequency to which a certain transform coefficient 206 belongs, generally increases from the top left corner to the bottom right-hand corner. By an inverse transform $T^{-1}$, the transform block 204 is re-transferred from spectral domain to spatial domain, so as to re-obtain a copy 208 of block 200. In case no quantization/loss has been introduced during the transformation, the reconstruction would be perfect.

As already noted above, it may be seen from FIG. 6 that greater block sizes of block 200 increase the spectral resolution of the resulting spectral representation 204. On the other hand, quantization noise tends to spread over the whole block 208 and thus, abrupt and very localized objects within blocks 200 tend to lead to deviations of the re-transformed block relative to the original block 200 due to quantization noise. The main advantage of using greater blocks is, however, that the ratio between the number of significant, i.e. non-zero (quantized) transform coefficients, i.e. levels, on the one hand and the number of insignificant transform coefficients on the other hand may be decreased within larger blocks compared to smaller blocks thereby enabling a better coding efficiency. In other words, frequently, the significant transform coefficient levels, i.e. the transform coefficients not quantized to zero, are distributed over the transform block 204 sparsely. Due to this, in accordance with the embodiments described in more detail below, the positions of the significant transform coefficient levels is signaled within the data stream by way of a significance map. Separately therefrom, the values of the significant transform coefficient, i.e., the transform coefficient levels in case of the transform coefficients being quantized, are transmitted within the data stream.

All the encoders and decoders described above, are, thus, configured to deal with a certain syntax of syntax elements. That is, the afore-mentioned syntax elements such as the transform coefficient levels, syntax elements concerning the significance map of transform blocks, the motion data syntax elements concerning inter-prediction blocks and so on are assumed to be sequentially arranged within the data stream in a prescribed way. Such a prescribed way may be represented in form of a pseudo code as it is done, for example, in the H.264 standard or other video codecs.

In even other words, the above description, primarily dealt with the conversion of media data, here exemplarily video data, to a sequence of syntax elements in accordance with a predefined syntax structure prescribing certain syntax element types, its semantics and the order among them. The entropy encoder and entropy decoder of FIGS. 4 and 5, may be configured to operate, and may be structured, as outlined next. Same are responsible for performing the conversion between syntax element sequence and data stream, i.e. symbol or bit stream.

Figure 7:
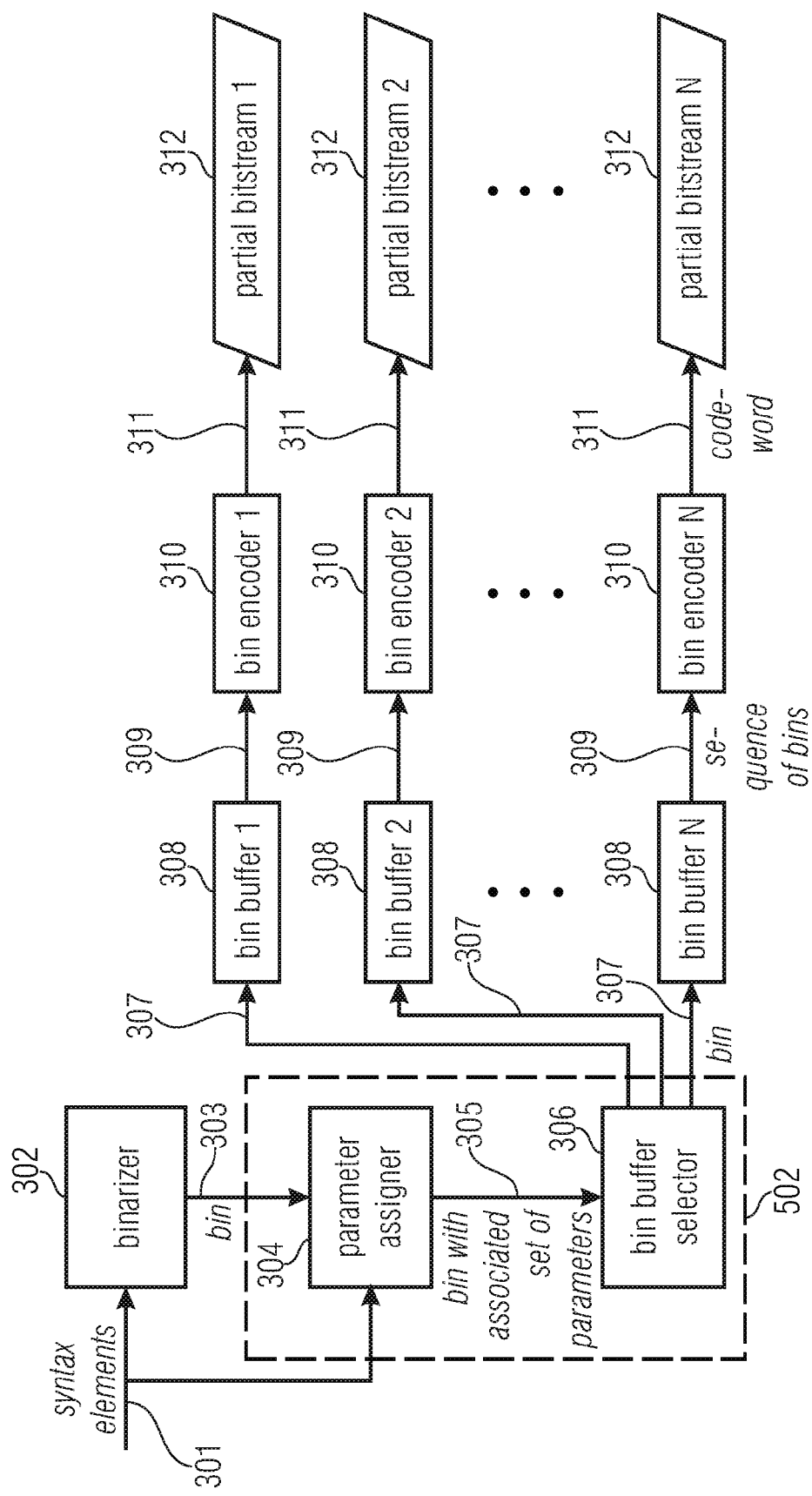
FIG. 7 shows a bock diagram of an encoder according to an embodiment.

An entropy encoder according to an embodiment is illustrated in FIG. 7. The encoder losslessly converts a stream of syntax elements 301 into a set of two or more partial bitstreams 312.

In an embodiment of the invention, each syntax element 301 is associated with a category of a set of one or more categories, i.e. a syntax element type. As an example, the categories can specify the type of the syntax element. In the context of hybrid video coding, a separate category may be associated with macroblock coding modes, block coding modes, reference picture indices, motion vector differences, subdivision flags, coded block flags, quantization parameters, transform coefficient levels, etc. In other application areas such as audio, speech, text, document, or general data coding, different categorizations of syntax elements are possible.

In general, each syntax element can take a value of a finite or countable infinite set of values, where the set of possible syntax element values can differ for different syntax element categories. For example, there are binary syntax elements as well as integer-valued ones.

For reducing the complexity of the encoding and decoding algorithm and for allowing a general encoding and decoding design for different syntax elements and syntax element categories, the syntax elements 301 are converted into ordered sets of binary decisions and these binary decisions are then processed by simple binary coding algorithms. Therefore, the binarizer 302 bijectively maps the value of each syntax element 301 onto a sequence (or string or word) of bins 303. The sequence of bins 303 represents a set of ordered binary decisions. Each bin 303 or binary decision can take one value of a set of two values, e.g. one of the values 0 and 1. The binarization scheme can be different for different syntax element categories. The binarization scheme for a particular syntax element category can depend on the set of possible syntax element values and/or other properties of the syntax element for the particular category.

Table 1 illustrates three example binarization schemes for countable infinite sets. Binarization schemes for countable infinite sets can also be applied for finite sets of syntax element values. In particular for large finite sets of syntax element values, the inefficiency (resulting from unused sequences of bins) can be negligible, but the universality of such binarization schemes provides an advantage in terms of complexity and memory requirements. For small finite sets of syntax element values, it is often advantageous (in terms of coding efficiency) to adapt the binarization scheme to the number of possible symbol values.

Table 2 illustrates three example binarization schemes for finite sets of 8 values. Binarization schemes for finite sets can be derived from the universal binarization schemes for countable infinite sets by modifying some sequences of bins in a way that the finite sets of bin sequences represent a redundancy-free code (and potentially reordering the bin sequences). As an example, the truncated unary binarization scheme in Table 2 was created by modifying the bin sequence for the syntax element 7 of the universal unary binarization (see Table 1). The truncated and reordered Exp-Golomb binarization of order 0 in Table 2 was created by modifying the bin sequence for the syntax element 7 of the universal Exp-Golomb order 0 binarization (see Table 1) and by reordering the bin sequences (the truncated bin sequence for symbol 7 was assigned to symbol 1). For finite sets of syntax elements, it is also possible to use non-systematic/non-universal binarization schemes, as exemplified in the last column of Table 2.

TABLE 1

Binarization examples for countable infinite sets (or large finite sets).

| Symbol value | Unary binarization | Ex-Golomb order 0 binarization | Exp-Golomb order 1 binarization |
|---|---|---|---|
| 0 | 1 | 1 | 10 |
| 1 | 01 | 010 | 11 |
| 2 | 001 | 011 | 0100 |
| 3 | 0001 | 0010 0 | 0101 |
| 4 | 0000 1 | 0010 1 | 0110 |
| 5 | 0000 01 | 0011 0 | 0111 |
| 6 | 0000 001 | 0011 1 | 0010 00 |
| 7 | 0000 0001 | 0001 000 | 0010 01 |
| ... | ... | ... | ... |

TABLE 2

Binarization examples for finite sets.

| Symbol value | Truncated unary binarization | Truncated and reordered Exp-Golomb order 0 binarization | Non-systematic binarization |
|---|---|---|---|
| 0 | 1 | 1 | 000 |
| 1 | 01 | 000 | 001 |
| 2 | 001 | 010 | 01 |
| 3 | 0001 | 011 | 1000 |
| 4 | 0000 1 | 0010 0 | 1001 |
| 5 | 0000 01 | 0010 1 | 1010 |
| 6 | 0000 001 | 0011 0 | 1011 0 |
| 7 | 0000 000 | 0011 1 | 1011 1 |

Each bin 303 of the sequence of bins created by the binarizer 302 is fed into the parameter assigner 304 in sequential order. The parameter assigner assigns a set of one or more parameters to each bin 303 and outputs the bin with the associated set of parameters 305. The set of parameters is determined in exactly the same way at encoder and decoder. The set of parameters may consist of one or more of the following parameters:

In particular, parameter assigner 304 may be configured to assign to a current bin 303 a context model. For example, parameter assigner 304 may select one of available context indices for the current bin 303. The available set of contexts for a current bin 303 may depend on the type of the bin which, in turn, may be defined by the type/category of the syntax element 301, the binarization of which the current bin 303 is part of, and a position of the current bin 303 within the latter binarization. The context selection among the available context set may depend on previous bins and the syntax elements associated with the latter. Each of these contexts has a probability model associated therewith, i.e. a measure for an estimate of the probability for one of the two possible bin values for the current bin. The probability model may in particular be a measure for an estimate of the probability for the less probable or more probable bin value for the current bin, with a probability model additionally being defined by an identifier specifying an estimate for which of the two possible bin values represents the less probable or more probable bin value for the current bin 303. In case of merely one context being available for the current bin, the context selection may be left away. As will be outlined in more detail below, parameter assigner 304 may also perform a probability model adaptation in order to adapt the probability models associated with the various contexts to the actual bin statistics of the respective bins belonging to the respective contexts.

As will also be described in more detail below, parameter assigner 304 may operate differently depending on a high efficiency (HE) mode or low complexity (LC) mode being activated. In both modes the probability model associates the current bin 303 to any of the bin encoders 310 as will be outlined below, but the mode of operation of the parameter assigner 304 tends to be less complex in the LC mode with, however, the coding efficiency being increased in the high efficiency mode due to the parameter assigner 304 causing the association of the individual bins 303 to the individual encoders 310 to be more accurately adapted to the bin statistics, thereby optimizing the entropy relative to the LC mode.

Each bin with an associated set of parameters 305 that is output of the parameter assigner 304 is fed into a bin buffer selector 306. The bin buffer selector 306 potentially modifies the value of the input bin 305 based on the input bin value and the associated parameters 305 and feeds the output bin 307—with a potentially modified value—into one of two or more bin buffers 308. The bin buffer 308 to which the output bin 307 is sent is determined based on the value of the input bin 305 and/or the value of the associated parameters 305.

In an embodiment of the invention, the bin buffer selector 306 does not modify the value of the bin, i.e., the output bin 307 has the same value as the input bin 305. In a further embodiment of the invention, the bin buffer selector 306 determines the output bin value 307 based on the input bin value 305 and the associated measure for an estimate of the probability for one of the two possible bin values for the current bin. In an embodiment of the invention, the output bin value 307 is set equal to the input bin value 305 if the measure for the probability for one of the two possible bin values for the current bin is less than (or less than or equal to) a particular threshold; if the measure for the probability for one of the two possible bin values for the current bin is greater than or equal to (or greater than) a particular threshold, the output bin value 307 is modified (i.e., it is set to the opposite of the input bin value). In a further embodiment of the invention, the output bin value 307 is set equal to the input bin value 305 if the measure for the probability for one of the two possible bin values for the current bin is greater than (or greater than or equal to) a particular threshold; if the measure for the probability for one of the two possible bin values for the current bin is less than or equal to (or less than) a particular threshold, the output bin value 307 is modified (i.e., it is set to the opposite of the input bin value). In an embodiment of the invention, the value of the threshold corresponds to a value of 0.5 for the estimated probability for both possible bin values.

In a further embodiment of the invention, the bin buffer selector 306 determines the output bin value 307 based on the input bin value 305 and the associated identifier specifying an estimate for which of the two possible bin values represents the less probable or more probable bin value for the current bin. In an embodiment of the invention, the output bin value 307 is set equal to the input bin value 305 if the identifier specifies that the first of the two possible bin values represents the less probable (or more probable) bin value for the current bin, and the output bin value 307 is modified (i.e., it is set to the opposite of the input bin value) if identifier specifies that the second of the two possible bin values represents the less probable (or more probable) bin value for the current bin.

In an embodiment of the invention, the bin buffer selector 306 determines the bin buffer 308 to which the output bin 307 is sent based on the associated measure for an estimate of the probability for one of the two possible bin values for the current bin. In an embodiment of the invention, the set of possible values for the measure for an estimate of the probability for one of the two possible bin values is finite and the bin buffer selector 306 contains a table that associates exactly one bin buffer 308 with each possible value for the estimate of the probability for one of the two possible bin values, where different values for the measure for an estimate of the probability for one of the two possible bin values can be associated with the same bin buffer 308. In a further embodiment of the invention, the range of possible values for the measure for an estimate of the probability for one of the two possible bin values is partitioned into a number of intervals, the bin buffer selector 306 determines the interval index for the current measure for an estimate of the probability for one of the two possible bin values, and the bin buffer selector 306 contains a table that associates exactly one bin buffer 308 with each possible value for the interval index, where different values for the interval index can be associated with the same bin buffer 308. In an embodiment of the invention, input bins 305 with opposite measures for an estimate of the probability for one of the two possible bin values (opposite measure are those which represent probability estimates P and 1−P) are fed into the same bin buffer 308. In a further embodiment of the invention, the association of the measure for an estimate of the probability for one of the two possible bin values for the current bin with a particular bin buffer is adapted over time, e.g. in order to ensure that the created partial bitstreams have similar bit rates. Further below, the interval index will also be called pipe index, while the pipe index along with a refinement index and a flag indicating the more probable bin value indexes the actual probability model, i.e. the probability estimate.

In a further embodiment of the invention, the bin buffer selector 306 determines the bin buffer 308 to which the output bin 307 is sent based on the associated measure for an estimate of the probability for the less probable or more probable bin value for the current bin. In an embodiment of the invention, the set of possible values for the measure for an estimate of the probability for the less probable or more probable bin value is finite and the bin buffer selector 306 contains a table that associates exactly one bin buffer 308 with each possible value of the estimate of the probability for the less probable or more probable bin value, where different values for the measure for an estimate of the probability for the less probable or more probable bin value can be associated with the same bin buffer 308. In a further embodiment of the invention, the range of possible values for the measure for an estimate of the probability for the less probable or more probable bin value is partitioned into a number of intervals, the bin buffer selector 306 determines the interval index for the current measure for an estimate of the probability for the less probable or more probable bin value, and the bin buffer selector 306 contains a table that associates exactly one bin buffer 308 with each possible value for the interval index, where different values for the interval index can be associated with the same bin buffer 308. In a further embodiment of the invention, the association of the measure for an estimate of the probability for the less probable or more probable bin value for the current bin with a particular bin buffer is adapted over time, e.g. in order to ensure that the created partial bitstreams have similar bit rates.

Each of the two or more bin buffers 308 is connected with exactly one bin encoder 310 and each bin encoder is only connected with one bin buffer 308. Each bin encoder 310 reads bins from the associated bin buffer 308 and converts a sequence of bins 309 into a codeword 311, which represents a sequence of bits. The bin buffers 308 represent first-in-first-out buffers; bins that are fed later (in sequential order) into a bin buffer 308 are not encoded before bins that are fed earlier (in sequential order) into the bin buffer. The codewords 311 that are output of a particular bin encoder 310 are written to a particular partial bitstream 312. The overall encoding algorithm converts syntax elements 301 into two or more partial bitstreams 312, where the number of partial bitstreams is equal to the number of bin buffers and bin encoders. In an embodiment of the invention, a bin encoder 310 converts a variable number of bins 309 into a codeword 311 of a variable number of bits. One advantage of the above- and below-outlined embodiments of the invention is that the encoding of bins can be done in parallel (e.g. for different groups of probability measures), which reduces the processing time for several implementations.

Another advantage of embodiments of the invention is that the bin encoding, which is done by the bin encoders 310, can be specifically designed for different sets of parameters 305. In particular, the bin encoding and encoding can be optimized (in terms of coding efficiency and/or complexity) for different groups of estimated probabilities. On the one hand side, this allows a reduction of the encoding/decoding complexity, and on the other hand side, it allows an improvement of the coding efficiency. In an embodiment of the invention, the bin encoders 310 implement different encoding algorithms (i.e. mapping of bin sequences onto codewords) for different groups of measures for an estimate of the probability for one of the two possible bin values 305 for the current bin. In a further embodiment of the invention, the bin encoders 310 implement different encoding algorithms for different groups of measures for an estimate of the probability for the less probable or more probable bin value for the current bin.

In an embodiment of the invention, the bin encoders 310—or one or more of the bin encoders—represent entropy encoders that directly map sequences of input bins 309 onto codewords 310. Such mappings can be efficiently implemented and don't necessitate a complex arithmetic coding engine. The inverse mapping of codewords onto sequences of bins (as done in the decoder) should to be unique in order to guarantee perfect decoding of the input sequence, but the mapping of bin sequences 309 onto codewords 310 doesn't necessarily need to be unique, i.e., it is possible that a particular sequence of bins can be mapped onto more than one sequence of codewords. In an embodiment of the invention, the mapping of sequences of input bins 309 onto codewords 310 is bijective. In a further embodiment of the invention, the bin encoders 310—or one or more of the bin encoders—represent entropy encoders that directly map variable-length sequences of input bins 309 onto variable-length codewords 310. In an embodiment of the invention, the output codewords represent redundancy-free codes such as general huffman codes or canonical huffman codes.

Two examples for the bijective mapping of bin sequences to redundancy-free codes are illustrated in Table 3. In a further embodiment of the invention, the output codewords represent redundant codes suitable for error detection and error recovery. In a further embodiment of the invention, the output codewords represent encryption codes suitable for encrypting the syntax elements.

TABLE 3

Examples for mappings between bin sequences and codewords.

| Sequence of binds (bin order is from left to right) | Codewords (bits orders is from left to right) |
|---|---|
| 0000 0000 | 1 |
| 0000 0001 | 0000 |
| 0000 001 | 0001 |
| 0000 01 | 0010 |
| 0000 1 | 0011 |
| 0001 | 0100 |
| 001 | 0101 |
| 01 | 0110 |
| 1 | 0111 |

| Sequent of bins (bin order is from left to right) | Codewords (bits order is from left to right) |
|---|---|
| 000 | 10 |
| 01 | 11 |
| 001 | 010 |
| 11 | 011 |
| 1000 0 | 0001 |
| 1001 | 0010 |
| 1010 | 0011 |
| 1000 1 | 0000 0 |
| 1011 | 0000 1 |

In a further embodiment of the invention, the bin encoders 310—or one or more of the bin encoders—represent entropy encoders that directly map variable-length sequences of input bins 309 onto fixed-length codewords 310. In a further embodiment of the invention, the bin encoders 310—or one or more of the bin encoders—represent entropy encoders that directly map fixed-length sequences of input bins 309 onto variable-length codewords 310.

Figure 8:
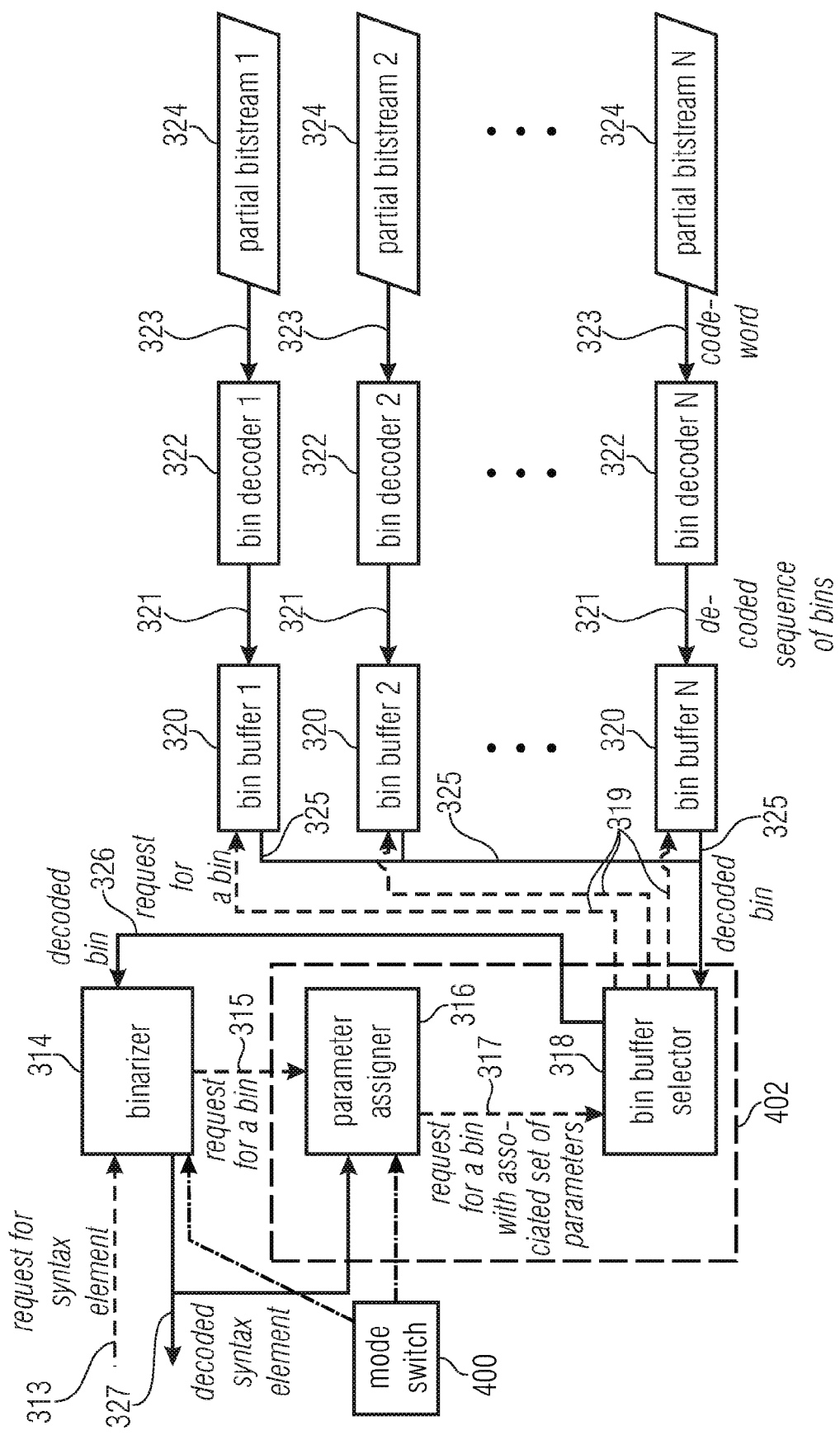
FIG. 8 shows a bock diagram of an decoder suitable for decoding bitstream generated by the encoder of FIG. 8, according to an embodiment.

The decoder according an embodiment of the invention is illustrated in FIG. 8. The decoder performs basically the inverse operations of the encoder, so that the (previously encoded) sequence of syntax elements 327 is decoded from a set of two or more partial bitstreams 324. The decoder includes two different process flows: A flow for data requests, which replicates the data flow of the encoder, and a data flow, which represents the inverse of the encoder data flow. In the illustration in FIG. 8, the dashed arrows represent the data request flow, while the solid arrows represent the data flow. The building blocks of the decoder basically replicate the building blocks of the encoder, but implement the inverse operations.

The decoding of a syntax element is triggered by a request for a new decoded syntax element 313 that is sent to the binarizer 314. In an embodiment of the invention, each request for a new decoded syntax element 313 is associated with a category of a set of one or more categories. The category that is associated with a request for a syntax element is the same as the category that was associated with the corresponding syntax element during encoding.

The binarizer 314 maps the request for a syntax element 313 into one or more requests for a bin that are sent to the parameter assigner 316. As final response to a request for a bin that is sent to the parameter assigner 316 by the binarizer 314, the binarizer 314 receives a decoded bin 326 from the bin buffer selector 318. The binarizer 314 compares the received sequence of decoded bins 326 with the bin sequences of a particular binarization scheme for the requested syntax element and, if the received sequence of decoded bins 26 matches the binarization of a syntax element, the binarizer empties its bin buffer and outputs the decoded syntax element as final response to the request for a new decoded symbol. If the already received sequence of decoded bins does not match any of the bin sequences for the binarization scheme for the requested syntax element, the binarizer sends another request for a bin to the parameter assigner until the sequence of decoded bins matches one of the bin sequences of the binarization scheme for the requested syntax element. For each request for a syntax element, the decoder uses the same binarization scheme that was used for encoding the corresponding syntax element. The binarization scheme can be different for different syntax element categories. The binarization scheme for a particular syntax element category can depend on the set of possible syntax element values and/or other properties of the syntax elements for the particular category.

The parameter assigner 316 assigns a set of one or more parameters to each request for a bin and sends the request for a bin with the associated set of parameters to the bin buffer selector. The set of parameters that are assigned to a requested bin by the parameter assigner is the same that was assigned to the corresponding bin during encoding. The set of parameters may consist of one or more of the parameters that are mentioned in the encoder description of FIG. 7.

In an embodiment of the invention, the parameter assigner 316 associates each request for a bin with the same parameters as assigner 304 did, i.e. a context and its associated measure for an estimate of the probability for one of the two possible bin values for the current requested bin, such as a measure for an estimate of the probability for the less probable or more probable bin value for the current requested bin and an identifier specifying an estimate for which of the two possible bin values represents the less probable or more probable bin value for the current requested bin.

The parameter assigner 316 may determine one or more of the above mentioned probability measures (measure for an estimate of the probability for one of the two possible bin values for the current requested bin, measure for an estimate of the probability for the less probable or more probable bin value for the current requested bin, identifier specifying an estimate for which of the two possible bin values represents the less probable or more probable bin value for the current requested bin) based on a set of one or more already decoded symbols. The determination of the probability measures for a particular request for a bin replicates the process at the encoder for the corresponding bin. The decoded symbols that are used for determining the probability measures can include one or more already decoded symbols of the same symbol category, one or more already decoded symbols of the same symbol category that correspond to data sets (such as blocks or groups of samples) of neighboring spatial and/or temporal locations (in relation to the data set associated with the current request for a syntax element), or one or more already decoded symbols of different symbol categories that correspond to data sets of the same and/or neighboring spatial and/or temporal locations (in relation to the data set associated with the current request for a syntax element).

Each request for a bin with an associated set of parameters 317 that is output of the parameter assigner 316 is fed into a bin buffer selector 318. Based on the associated set of parameters 317, the bin buffer selector 318 sends a request for a bin 319 to one of two or more bin buffers 320 and receives a decoded bin 325 from the selected bin buffer 320. The decoded input bin 325 is potentially modified and the decoded output bin 326—with a potentially modified value—is send to the binarizer 314 as final response to the request for a bin with an associated set of parameters 317.

The bin buffer 320 to which the request for a bin is forwarded is selected in the same way as the bin buffer to which the output bin of the bin buffer selector at the encoder side was sent.

In an embodiment of the invention, the bin buffer selector 318 determines the bin buffer 320 to which the request for a bin 319 is sent based on the associated measure for an estimate of the probability for one of the two possible bin values for the current requested bin. In an embodiment of the invention, the set of possible values for the measure for an estimate of the probability for one of the two possible bin values is finite and the bin buffer selector 318 contains a table that associates exactly one bin buffer 320 with each possible value of the estimate of the probability for one of the two possible bin values, where different values for the measure for an estimate of the probability for one of the two possible bin values can be associated with the same bin buffer 320. In a further embodiment of the invention, the range of possible values for the measure for an estimate of the probability for one of the two possible bin values is partitioned into a number of intervals, the bin buffer selector 318 determines the interval index for the current measure for an estimate of the probability for one of the two possible bin values, and the bin buffer selector 318 contains a table that associates exactly one bin buffer 320 with each possible value for the interval index, where different values for the interval index can be associated with the same bin buffer 320. In an embodiment of the invention, requests for bins 317 with opposite measures for an estimate of the probability for one of the two possible bin values (opposite measure are those which represent probability estimates P and 1−P) are forwarded to the same bin buffer 320. In a further embodiment of the invention, the association of the measure for an estimate of the probability for one of the two possible bin values for the current bin request with a particular bin buffer is adapted over time.

In a further embodiment of the invention, the bin buffer selector 318 determines the bin buffer 320 to which the request for a bin 319 is sent based on the associated measure for an estimate of the probability for the less probable or more probable bin value for the current requested bin. In an embodiment of the invention, the set of possible values for the measure for an estimate of the probability for the less probable or more probable bin value is finite and the bin buffer selector 318 contains a table that associates exactly one bin buffer 320 with each possible value of the estimate of the probability for the less probable or more probable bin value, where different values for the measure for an estimate of the probability for the less probable or more probable bin value can be associated with the same bin buffer 320. In a further embodiment of the invention, the range of possible values for the measure for an estimate of the probability for the less probable or more probable bin value is partitioned into a number of intervals, the bin buffer selector 318 determines the interval index for the current measure for an estimate of the probability for the less probable or more probable bin value, and the bin buffer selector 318 contains a table that associates exactly one bin buffer 320 with each possible value for the interval index, where different values for the interval index can be associated with the same bin buffer 320. In a further embodiment of the invention, the association of the measure for an estimate of the probability for the less probable or more probable bin value for the current bin request with a particular bin buffer is adapted over time.

After receiving a decoded bin 325 from the selected bin buffer 320, the bin buffer selector 318 potentially modifies the input bin 325 and sends the output bin 326—with a potentially modified value—to the binarizer 314. The input/output bin mapping of the bin buffer selector 318 is the inverse of the input/output bin mapping of the bin buffer selector at the encoder side.

In an embodiment of the invention, the bin buffer selector 318 does not modify the value of the bin, i.e., the output bin 326 has the same value as the input bin 325. In a further embodiment of the invention, the bin buffer selector 318 determines the output bin value 326 based on the input bin value 325 and the measure for an estimate of the probability for one of the two possible bin values for the current requested bin that is associated with the request for a bin 317. In an embodiment of the invention, the output bin value 326 is set equal to the input bin value 325 if the measure for the probability for one of the two possible bin values for the current bin request is less than (or less than or equal to) a particular threshold; if the measure for the probability for one of the two possible bin values for the current bin request is greater than or equal to (or greater than) a particular threshold, the output bin value 326 is modified (i.e., it is set to the opposite of the input bin value). In a further embodiment of the invention, the output bin value 326 is set equal to the input bin value 325 if the measure for the probability for one of the two possible bin values for the current bin request is greater than (or greater than or equal to) a particular threshold; if the measure for the probability for one of the two possible bin values for the current bin request is less than or equal to (or less than) a particular threshold, the output bin value 326 is modified (i.e., it is set to the opposite of the input bin value). In an embodiment of the invention, the value of the threshold corresponds to a value of 0.5 for the estimated probability for both possible bin values.

In a further embodiment of the invention, the bin buffer selector 318 determines the output bin value 326 based on the input bin value 325 and the identifier, specifying an estimate for which of the two possible bin values represents the less probable or more probable bin value for the current bin request, that is associated with the request for a bin 317. In an embodiment of the invention, the output bin value 326 is set equal to the input bin value 325 if the identifier specifies that the first of the two possible bin values represents the less probable (or more probable) bin value for the current bin request, and the output bin value 326 is modified (i.e., it is set to the opposite of the input bin value) if identifier specifies that the second of the two possible bin values represents the less probable (or more probable) bin value for the current bin request.

As described above, the bin buffer selector sends a request for a bin 319 to one of the two or more bin buffers 320. The bin buffers 20 represent first-in-first-out buffers, which are fed with sequences of decoded bins 321 from the connected bin decoders 322. As response to a request for a bin 319 that is sent to a bin buffer 320 from the bin buffer selector 318, the bin buffer 320 removes the bin of its content that was first fed into the bin buffer 320 and sends it to the bin buffer selector 318. Bins that are earlier sent to the bin buffer 320 are earlier removed and sent to the bin buffer selector 318.

Each of the two or more bin buffers 320 is connected with exactly one bin decoder 322 and each bin decoder is only connected with one bin buffer 320. Each bin decoder 322 reads codewords 323, which represent sequences of bits, from a separate partial bitstream 324. The bin decoder converts a codeword 323 into a sequence of bins 321 that is sent to the connected bin buffer 320. The overall decoding algorithm converts two or more partial bitstreams 324 into a number of decoded syntax elements, where the number of partial bitstreams is equal to the number of bin buffers and bin decoders and the decoding of syntax elements is triggered by requests for new syntax elements. In an embodiment of the invention, a bin decoder 322 converts codewords 323 of a variable number of bits into a sequence of a variable number of bins 321. One advantage of embodiments of the invention is that the decoding of bins from the two or more partial bitstreams can be done in parallel (e.g. for different groups of probability measures), which reduces the processing time for several implementations.

Another advantage of embodiments of the invention is that the bin decoding, which is done by the bin decoders 322, can be specifically designed for different sets of parameters 317. In particular, the bin encoding and decoding can be optimized (in terms of coding efficiency and/or complexity) for different groups of estimated probabilities. On the one hand side, this allows a reduction of the encoding/decoding complexity relative to state-of-the-art entropy coding algorithms with similar coding efficiency. On the other hand side, it allows an improvement of the coding efficiency relative to state-of-the-art entropy coding algorithms with similar encoding/decoding complexity. In an embodiment of the invention, the bin decoders 322 implement different decoding algorithms (i.e. mapping of bin sequences onto codewords) for different groups of measures for an estimate of the probability for one of the two possible bin values 317 for the current bin request. In a further embodiment of the invention, the bin decoders 322 implement different decoding algorithms for different groups of measures for an estimate of the probability for the less probable or more probable bin value for the current requested bin.

The bin decoders 322 do the inverse mapping of the corresponding bin encoders at the encoder side.

In an embodiment of the invention, the bin decoders 322—or one or more of the bin decoders—represent entropy decoders that directly map codewords 323 onto sequences of bins 321. Such mappings can be efficiently implemented and don't necessitate a complex arithmetic coding engine. The mapping of codewords onto sequences of bins has to be unique. In an embodiment of the invention, the mapping of codewords 323 onto sequences of bins 321 is bijective. In a further embodiment of the invention, the bin decoders 310—or one or more of the bin decoders—represent entropy decoders that directly map variable-length codewords 323 into variable-length sequences of bins 321. In an embodiment of the invention, the input codewords represent redundancy-free codes such as general huffman codes or canonical huffman codes. Two examples for the bijective mapping of redundancy-free codes to bin sequences are illustrated in Table 3.

In a further embodiment of the invention, the bin decoders 322—or one or more of the bin decoders—represent entropy decoders that directly map fixed-length codewords 323 onto variable-length sequences of bins 321. In a further embodiment of the invention, the bin decoders 322—or one or more of the bin decoders—represent entropy decoders that directly map variable-length codewords 323 onto fixed-length sequences of bins 321.

Thus, FIGS. 7 and 8 showed an embodiment for an encoder for encoding a sequence of symbols 3 and a decoder for reconstructing same. The encoder comprises an assigner 304 configured to assign a number of parameters 305 to each symbol of the sequence of symbols. The assignment is based on information contained within previous symbols of the sequence of symbols such as the category of the syntax element 1 to the representation—such as binarization—of which the current symbol belongs and which, according to the syntax structure of the syntax elements 1, is currently be expected which expectation, in turn, is deducible from the history of previous syntax elements 1 and symbols 3. Further, the encoder comprises a plurality of entropy encoders 10 each of which is configured to convert the symbols 3 forwarded to the respective entropy encoder into a respective bitstream 312, and a selector 306 configured to forward each symbol 3 to a selected one of the plurality of entropy encoders 10, the selection depending on the number of parameters 305 assigned to the respective symbol 3. The assignor 304 could be thought of as being integrated into selector 206 in order to yield a respective selector 502.

The decoder for reconstructing a sequence of symbols comprises a plurality of entropy decoders 322, each of which is configured to convert a respective bitstream 323 into symbols 321; an assigner 316 configured to assign a number of parameters 317 to each symbol 315 of a sequence of symbols to be reconstructed based on information contained within previously reconstructed symbols of the sequence of symbols (see 326 and 327 in FIG. 8); and a selector 318 configured to retrieve each symbol of the sequence of symbols to be reconstructed from a selected one of the plurality of entropy decoders 322, the selection depending on the number of parameters defined to the respective symbol. The assigner 316 may be configured such that the number of parameters assigned to each symbol comprises, or is, a measure for an estimate of a probability of distribution among the possible symbol values a respective symbol may assume. Again, assignor 316 and selector 318 may be thought of as integrated into one block, a selector 402. The sequence of symbols to be reconstructed may be of a binary alphabet and the assigner 316 may be configured such that the estimate of the probability distribution consists of a measure for an estimate of a probability of a less probable or more probable bin value of the two possible bin values of the binary alphabet and an identifier specifying an estimate for which of the two possible bin values represents the less probable or more probable bin value. The assigner 316 may further be configured to internally assign a context to each symbol of the sequence of symbols 315 to be reconstructed based on the information contained within previously reconstructed symbols of the sequence of symbols to be reconstructed with each context having a respective probability distribution estimate associated therewith, and to adapt the probability distribution estimate for each context to an actual symbol statistic based on symbol values of previously reconstructed symbols to which the respective context is assigned. The context may take into account a spatial relationship or neighborhood of positions to which the syntax elements belong such as in video or picture coding, or even in tables in case of financial applications. Then, the measure for the estimate of the probability distribution for each symbol may be determined based on the probability distribution estimate associated with the context assigned to the respective symbol such as by quantizing, or using as an index into a respective table, the probability distribution estimate associated with the context assigned with the respective symbol (in the below embodiments indexed by a pipe index along with a refinement index) to one of a plurality of probability distribution estimate representatives (clipping away the refinement index) in order to obtain the measure for the estimate of the probability distribution (the pipe index indexing the partial bitstream 312). The selector may be configured such that a bijective association is defined between the plurality of entropy encoders and the plurality of probability distribution estimate representatives. The selector 18 may be configured to change a quantization mapping from a range of the probability distribution estimates to the plurality of probability distribution estimate representatives in a predetermined deterministic way depending on previously reconstructed symbols of the sequence of symbols, over time. That is, selector 318 may change the quantization step sizes, i.e. the intervals of probability distributions mapped onto the individual probability indices bijectively associated with the individual entropy decoders. The plurality of entropy decoders 322, in turn, may be configured to adapt their way of converting symbols into bit streams responsive to a change in the quantization mapping. For example, each entropy decoder 322 may be optimized for, i.e may have an optimal compression rate for, a certain probability distribution estimate within the respective probability distribution estimate quantization interval, and may change its codeword/symbol sequence mapping so as to adapt the position of this certain probability distribution estimate within the respective probability distribution estimate quantization interval upon a change of the latter so as to be optimized. The selector may be configured to change the quantization mapping such that rates by which the symbols are retrieved from the plurality of entropy decoders, are made less dispersed. As to the binarizer 314 it is noted that same me be left away if the syntax elements are already binary. Further, depending on the type of decoder 322, the existence of the buffers 320 is not necessitated. Further, the buffers may be integrated within the decoders.

Termination of Finite Syntax Element Sequences

In an embodiment of the invention, the encoding and decoding is done for a finite set of syntax elements. Often a certain quantity of data such as a still image, a frame or field of a video sequence, a slice of an image, a slice of a frame or a field of a video sequence, or a set of successive audio samples, etc. is coded. For finite sets of syntax elements, in general, the partial bitstreams that are created at the encoder side have to be terminated, i.e., it has to be ensured that all syntax elements can be decoded from the transmitted or stored partial bitstreams. After the last bin is inserted into the corresponding bin buffer 308, the bin encoder 310 has to ensure that a complete codeword is written to the partial bitstream 312. If the bin encoder 310 represents an entropy encoder that implements a direct mapping of bin sequences onto codewords, the bin sequence that is stored in the bin buffer after writing the last bin to the bin buffer might not represent a bin sequence that is associated with a codeword (i.e., it might represent a prefix of two or more bin sequences that are associated with codewords). In such a case, any of the codewords associated with a bin sequence that contains the bin sequence in the bin buffer as prefix has to be written to the partial bitstream (the bin buffer has to be flushed). This could be done by inserting bins with a particular or an arbitrary value into the bin buffer until a codeword is written. In an embodiment of the invention, the bin encoder selects one of the codewords with minimum length (in addition to the property that the associated bin sequence has to contain the bin sequence in the bin buffer as prefix). At the decoder side, the bin decoder 322 may decode more bins than necessitated for the last codeword in a partial bitstream; these bins are not requested by the bin buffer selector 318 and are discarded and ignored. The decoding of the finite set of symbols is controlled by requests for decoded syntax elements; if no further syntax element is requested for a quantity of data, the decoding is terminated.

Transmission and Multiplexing of the Partial Bitstreams

The partial bitstreams 312 that are created by the encoder can be transmitted separately, or they can be multiplexed into a single bitstream, or the codewords of the partial bitstreams can be interleaved in a single bitstream.

In an embodiment of the invention, each partial bitstream for a quantity of data is written to one data packet. The quantity of data can be an arbitrary set of syntax elements such as a still picture, a field or frame of a video sequence, a slice of a still picture, a slice of a field or frame of a video sequence, or a frame of audio samples, etc.

In another embodiment of the invention, two or more of the partial bitstreams for a quantity of data or all partial bitstreams for a quantity of data are multiplexed into one data packet. The structure of a data packet that contains multiplexed partial bitstreams is illustrated in FIG. 9.

The data packet 400 consists of a header and one partition for the data of each partial bitstream (for the considered quantity of data). The header 400 of the data packet contains indications for the partitioning of the (remainder of the) data packet into segments of bitstream data 402. Beside the indications for the partitioning, the header may contain additional information. In an embodiment of the invention, the indications for the partitioning of the data packet are the locations of the beginning of the data segments in units of bits or bytes or multiples of bits or multiples of bytes. In an embodiment of the invention, the locations of the beginning of the data segments are coded as absolute values in the header of the data packet, either relative to the beginning of the data packet or relative to the end of the header or relative to the beginning of the previous data packet. In a further embodiment of the invention, the locations of the beginning of the data segments are differentially coded, i.e., only the difference between the actual beginning of a data segment and a prediction for the beginning of the data segment is coded. The prediction can be derived based on already known or transmitted information such as the overall size of the data packet, the size of the header, the number of data segments in the data packet, the location of the beginning of preceding data segments. In an embodiment of the invention, the location of the beginning of the first data packet is not coded, but inferred based on the size of the data packet header. At the decoder side, the transmitted partition indications are used for deriving the beginning of the data segments. The data segments are then used as partial bitstreams and the data contained in the data segments are fed into the corresponding bin decoders in sequential order.

There are several alternatives for multiplexing the partial bitstreams into a data packet. One alternative, which can reduce the necessitated side information, in particular for cases in which the sizes of the partial bitstreams are very similar, is illustrated in FIG. 10. The payload of the data packet, i.e., the data packet 410 without its header 411, is partitioned into segments 412 a predefined way. As an example, the data packet payload can be partitioned into segments of the same size. Then each segment is associated with a partial bitstream or with the first part of a partial bitstream 413. If a partial bitstream is greater than the associated data segment, its remainder 414 is placed into the unused space at the end of other data segments. This can be done in a way that the remaining part of a bitstream is inserted in reverse order (starting from the end of the data segment), which reduces the side information. The association of the remainders of the partial bitstreams to data segments and, when more than one remainder is added to a data segment, the start point for one or more of the remainders have to be signaled inside the bitstream, e.g. in the data packet header.

Interleaving of Variable-Length Codewords

For some applications, the above described multiplexing of the partial bitstreams (for a quantity of syntax elements) in one data packet can have the following disadvantages: On the one hand side, for small data packets, the number of bits for the side information that is necessitated for signaling the partitioning can become significant relative to the actual data in the partial bitstreams, which finally reduces the coding efficiency. On the other hand, the multiplexing may not suitable for applications that necessitate a low delay (e.g. for video conferencing applications). With the described multiplexing, the encoder cannot start the transmission of a data packet before the partial bitstreams have been completely created, since the locations of the beginning of the partitions are not known before. Furthermore, in general, the decoder has to wait until it receives the beginning of the last data segment before it can start the decoding of a data packet. For applications as video conferencing systems, these delays can add-up to an additional overall delay of the system of several video pictures (in particular for bit rates that are close to the transmission bit rate and for encoders/decoders that necessitate nearly the time interval between two pictures for encoding/decoding a picture), which is critical for such applications. In order to overcome the disadvantages for certain applications, the encoder of an embodiment of the invention can be configured in a way that the codewords that are generated by the two or more bin encoders are interleaved into a single bitstream. The bitstream with the interleaved codewords can be directly send to the decoder (when neglecting a small buffer delay, see below). At the decoder side, the two or more bin decoders read the codewords directly from the bitstream in decoding order; the decoding can be started with the first received bit. In addition, no side information is necessitated for signaling the multiplexing (or interleaving) of the partial bitstreams. A further way of reducing the decoder complexity can be achieved when the bin decoders 322 don't read variable-length codewords from a global bit buffer, but instead they read fixed-length sequences of bits from the global bit buffer and add these fixed-length sequences of bits to a local bit buffer, where each bin decoder 322 is connected with a separate local bit buffer. The variable-length codewords are then read from the local bit buffer. Hence, the parsing of variable-length codewords can be done in parallel, only the access of fixed-length sequences of bits has to be done in a synchronized way, but such an access of fixed-length sequences of bits is usually very fast, so that the overall decoding complexity can be reduced for some architectures.

The fixed number of bins that are sent to a particular local bit buffer can be different for different local bit buffer and it can also vary over time, depending on certain parameters as events in the bin decoder, bin buffer, or bit buffer. However, the number of bits that are read by a particular access does not depend on the actual bits that are read during the particular access, which is the important difference to the reading of variable-length codewords. The reading of the fixed-length sequences of bits is triggered by certain events in the bin buffers, bin decoders, or local bit buffers. As an example, it is possible to request the reading of a new fixed-length sequence of bits when the number of bits that are present in a connected bit buffer falls below a predefined threshold, where different threshold values can be used for different bit buffers. At the encoder, it has to be insured that the fixed-length sequences of bins are inserted in the same order into the bitstream, in which they are read from the bitstream at the decoder side. It is also possible to combine this interleaving of fixed-length sequences with a low-delay control similar to the ones explained above. In the following, an embodiment for the interleaving of fixed-length sequences of bits is described. For further details regards the latter interleaving schemes, reference is made to WO2011/128268A1.

After having described embodiments according to which the even previously coding is used for compressing video data, is described as an even further embodiment for implementing embodiments of the present invention which renders the implementation especially effective in terms of a good trade-off between compression rate on the one hand and look-up table and computation overhead on the other hand. In particular, the following embodiments enable the use of computationally less complex variable length codes in order to entropy-code the individually bitstreams, and effectively cover portions of the probability estimate. In the embodiments described below, the symbols are of binary nature and the VLC codes presented below effectively cover the probability estimate represented by, for example, $R_{LPS}$, extending within [0;0.5].

In particular, the embodiments outlined below describe possible implementations for the individual entropy coders 310 and decoders 322 in FIGS. 7 to 17, respectively. They are suitable for coding of bins, i.e. binary symbols, as they occur in image or video compression applications. Accordingly, these embodiments are also applicable to image or video coding where such binary symbols are split-up into the one or more streams of bins 307 to be encoded and bit-streams 324 to be decoded, respectively, where each such bin stream can be considered as a realization of a Bernoulli process. The embodiments described below use one or more of the below-explained various so-called variable-to-variable-codes (v2v-codes) to encode the bin streams. A v2v-code can be considered as two prefix-free codes with the same number of code words. A primary, and a secondary prefix-free code. Each code word of the primary prefix-free code is associated with one code word of the secondary prefix-free code. In accordance with the below-outlined embodiments, at least some of the encoders 310 and decoders 322, operate as follows: To encode a particular sequence of bins 307, whenever a code word of the primary prefix-free code is read from buffer 308, the corresponding code-word of the secondary prefix-free code is written to the bit stream 312. The same procedure is used to decode such a bit stream 324, but with primary and secondary prefix-free code interchanged. That is, to decode a bitstream 324, whenever a code word of the secondary prefix-free code is read from the respective bit stream 324, the corresponding code-word of the primary prefix-free code is written to buffer 320.

Advantageously, the codes described below do not necessitate look-up tables. The codes are implementable in form of finite state machines. The v2v-codes presented here, can be generated by simple construction rules such that there is no need to store large tables for the code words. Instead, a simple algorithm can be used to carry out encoding or decoding. Three construction rules are described below where two of them can be parameterized. They cover different or even disjoint portions of the afore-mentioned probability interval and are, accordingly, specifically advantageous if used together, such as all three codes in parallel (each for different ones of the en/decoders 11 and 22), or two of them. With the construction rules described below, it is possible to design a set of v2v-codes, such that for Bernoulli processes with arbitrary probability p, one of the codes performs well in terms of excess code length.

As stated above, the encoding and decoding of the streams 312 and 324 respectively, can either be performed independently for each stream or in an interleaved manner. This, however, is not specific to the presented classes of v2v-codes and therefore, only the encoding and decoding of a particular codeword is described for each of the three construction rules in the following. However, it is emphasized, that all of the above embodiments concerning the interleaving solutions are also combinable with the presently described codes or en- and decoders 310 and 322, respectively.

Construction Rule 1: 'Unary Bin Pipe' Codes or En-/Decoders 310 and 322

Unary bin pipe codes (PIPE=probability interval partitioning entropy) are a special version of the so-called 'bin pipe' codes, i.e. codes suitable for coding of any of the individual bitstreams 12 and 24, each transferring data of a binary symbol statistics belonging to a certain probability sub-interval of the afore-mentioned probability range [0;0.5]. The construction of bin pipe codes is described first. A bin pipe code can be constructed from any prefix-free code with at least three code words. To form a v2v-code, it uses the prefix-free code as primary and secondary code, but with two code words of the secondary prefix-free code interchanged. This means that except for two code words, the bins are written to the bit stream unchanged. With this technique, only one prefix-free code needs to be stored along with the information, which two code words are interchanged and thus, memory consumption is reduced. Note, that it only makes sense to interchange code words of different length since otherwise, the bit stream would have the same length as the bin stream (neglecting effects that can occur at the end of the bin stream).

Due to this construction rule, an outstanding property of the bin pipe codes is, that if primary and secondary prefix-free code are interchanged (while the mapping of the code words is retained), the resulting v2v-code is identical to the original v2v-code. Therefore, the encoding algorithm and decoding algorithm are identical for bin-pipe codes.

A unary bin pipe code is constructed from a special prefix-free code. This special prefix-free code is constructed as follows. First, a prefix-free code consisting of n unary code words is generated starting with '01', '001', '0001', . . . until n code words are produced. n is the parameter for the unary bin pipe code. From the longest code word, the trailing 1 is removed. This corresponds to a truncated unary code (but without the code word '0'). Then, n−1 unary code words are generated starting with '10', '110', '1110', . . . until n−1 code words are produced. From the longest of these code words, the trailing 0 is removed. The union set of these two prefix-free codes are used as input to generate the unary bin pipe code. The two code words that are interchanged are the one only consisting of 0s and the one only consisting of 1s.

Example for n=4:

| Nr | Primary | Secondary |
|----|---------|-----------|
| 1  | 0000    | 111       |
| 2  | 0001    | 0001      |
| 3  | 001     | 001       |
| 4  | 01      | 01        |
| 5  | 10      | 10        |
| 6  | 110     | 110       |
| 7  | 111     | 0000      |

Construction Rule 2: 'Unary to Rice' Codes and Unary to Rice En-/Decoders 10 and 22:

Unary to rice codes use a truncated unary code as primary code. I.e. unary code words are generated starting with '1', '01', '001', . . . until $2^n+1$ code words are generated and from the longest code word, the trailing 1 is removed. n is the parameter of the unary to rice code. The secondary prefix-free code is constructed from the code words of the primary prefix-free code as follows. To the primary code word only consisting of 0s, the code word '1' is assigned. All other code words consist of the concatenation of the code word '0' with the n-bit binary representation of the number of 0s of the corresponding code word of the primary prefix-free code.

Example for n=3:

| Nr | Primary  | Secondary |
|----|----------|-----------|
| 1  | 1        | 0000      |
| 2  | 01       | 0001      |
| 3  | 001      | 0010      |
| 4  | 0001     | 0011      |
| 5  | 00001    | 0100      |
| 6  | 000001   | 0101      |
| 7  | 0000001  | 0110      |
| 8  | 00000001 | 0111      |
| 9  | 00000000 | 1         |

Note, that this is identical to mapping an infinite unary code to a rice code with rice parameter $2^n$.

Construction Rule 3: 'Three Bin' Code

The three bin code is given as:

| Nr | Primary | Secondary |
|----|---------|-----------|
| 1  | 000     | 0         |
| 2  | 001     | 100       |
| 3  | 010     | 101       |
| 4  | 100     | 110       |
| 5  | 110     | 11100     |
| 6  | 101     | 11101     |
| 7  | 011     | 11110     |
| 8  | 111     | 11111     |

It has the property, that the primary code (symbol sequences) is of fixed length (three bins) and the code words are sorted by ascending numbers of 1s.

An efficient implementation of three bin code is described next. An encoder and decoder for the three bin code can be implemented without storing tables in the following way.

In the encoder (any of 10), three bins are read from the bin stream (i.e. 7). If these three bins contain exactly one 1, the code word '1' is written to the bit stream followed by two bins consisting of the binary representation of the position of the 1 (starting from right with 00). If the three bins contain exactly one 0, the code word '111' is written to the bit stream followed by two bins consisting of the binary representation of the position of the 0 (starting from the right with 00). The remaining code words '000' and '111' are mapped to '0' and '11111', respectively.

In the decoder (any of 22), one bin or bit is read from the respective bitstream 24. If it equals '0', the code word '000' is decoded to the bin stream 21. If it equals '1', two more bins are read from the bit stream 24. If these two bits do not equal '11', they are interpreted as the binary representation of a number and two 0s and one 1 is decoded to the bit stream such that the position of the 1 is determined by the number. If the two bits equal '11', two more bits are read and interpreted as binary representation of a number. If this number is smaller than 3, two is and one 0 are decoded and the number determines the position of the 0. If it equals 3, '111' is decoded to the bin stream.

An efficient implementation of unary bin pipe codes is described next. An encoder and decoder for unary bin pipe codes can be efficiently implemented by using a counter. Due to the structure of bin pipe codes, encoding and decoding of bin pipe codes is easy to implement:

In the encoder (any of 10), if the first bin of a code word equals '0', bins are processed until a '1' occurs or until n 0s are read (including the first '0' of the code word). If a '1' occurred, the read bins are written to the bit stream unchanged. Otherwise (i.e. n 0s were read), n−1 1s are written to the bit stream. If the first bin of the code word equals '1', bins are processed until a '0' occurs or until n−1 is are read (including the first '1' of the code word). If a '0' occurred, the read bins are written to the bit stream unchanged. Otherwise (i.e. n−1 is were read), n 0s are written to the bit stream.

In the decoder (any of 322), the same algorithm is used as for the encoder, since this is the same for bin pipe codes as described above.

An efficient implementation of unary to rice codes is described next. An encoder and decoder for unary to rice codes can be efficiently implemented by using a counter as will be described now.

In the encoder (any of 310), bins are read from the bin stream (i.e. 7) until a 1 occurs or until $2^n$ 0s are read. The number of 0s is counted. If the counted number equals $2^n$, the code word '1' is written to the bit stream. Otherwise, '0' is written, followed by the binary representation of the counted number, written with n bits.

In the decoder (any of 322), one bit is read. If it equals '1', $2^n$ 0s are decoded to the bin string. If it equals '0', n more bits are read and interpreted as binary representation of a number. This number of 0s is decoded to the bin stream, followed by a '1'.

In other words, the just-described embodiments describe an encoder for encoding a sequence of symbols 303, comprising an assigner 316 configured to assign a number of parameters 305 to each symbol of the sequence of symbols based on information contained within previous symbols of the sequence of symbols; a plurality of entropy encoders 310 each of which is configured to convert the symbols 307 forwarded to the respective entropy encoder 310 into a respective bitstream 312; and a selector 6 configured to forward each symbol 303 to a selected one of the plurality of entropy encoders 10, the selection depending on the number of parameters 305 assigned to the respective symbol 303. According to the just-outlined embodiments, at least a first subset of the entropy encoders may be a variable length encoder configured to map symbol sequences of variable lengths within the stream of symbols 307 to codewords of variable lengths to be inserted in bitsream 312, respectively, with each of the entropy coders 310 of the first subset using a bijective mapping rule according to which code words of a primary prefix-free code with (2n−1)≥3 code words are mapped to code words of a secondary prefix-free code which is identical to the primary prefix code such that all but two of the code words of the primary prefix-free code are mapped to identical code words of the secondary prefix-free code while the two code words of the primary and secondary prefix-free codes have different lengths and are mapped onto each other in an interchanged manner, wherein the entropy encoders may use different n so as to covers different portions of an interval of the above-mentioned probability interval. The first prefix-free code may be constructed such that the codewords of the first prefix-free code are $(a,b)_2$, $(a,a,b)_3$, . . . , (a, . . . ,a,b)$_n$, (a, . . . ,a)$_n$, $(b,a)_2$, $(b,b,a)_3$, . . . , (b, . . . ,b,a)$_{n-1}$, (b, . . . ,b)$_{n-1}$, and the two codewords mapped onto each other in the interchanged manner are (a, . . . ,a)$_n$ and (b, . . . ,b)$_{n-1}$ with b≠a and a,b∈{0,1}. However, alternatives are feasible.

In other words, each of a first subset of entropy encoders may be configured to, in converting the symbols forwarded to the respective entropy encoder into the respective bitstream, examine a first symbol forwarded to the respective entropy encoder, to determine as to whether (1) the first symbol equals a∈{0,1}, in which case the respective entropy encoder is configured to examine the following symbols forwarded to the respective entropy encoder to determine as to whether (1.1) b with b≠a and b∈{0,1} occurs within the next n−1 symbols following the first symbol, in which case the respective entropy encoder is configured to write a codeword to the respective bitstream, which equals the first symbol followed by the following symbols forwarded to the respective entropy encoder, up to the symbol b; (1.2) no b occurs within the next n−1 symbols following the first symbol, in which case the respective entropy encoder is configured to write a codeword to the respective bitstream, which equals (b, . . . ,b)$_{n-1}$; or (2) the first symbol equals b, in which case the respective entropy encoder is configured to examine the following symbols forwarded to the respective entropy encoder to determine as to whether (2.1) a occurs within the next n−2 symbols following the first symbol, in which case the respective entropy encoder is configured to write a codeword to the respective bitstream, which equals the first symbol followed by the following symbols forwarded to the respective entropy encoder up to the symbol a; or (2.2) no a occurs within the next n−2 symbols following the first symbol, in which case the respective entropy encoder is configured to write a codeword to the respective bitstream, which equals (a, . . . ,a)$_n$.

Additionally or alternatively, a second subset of the entropy encoders 10 may be a variable length encoder configured to map symbol sequences of variable lengths to codewords of fixed lengths, respectively, with each of the entropy coders of the second subset using a bijective mapping rule according to which code words of a primary truncated unary code with $2^n+1$ code words of the type {(a), (ba), (bba), . . . , (b . . . ba), (bb . . . b)} with b≠a and a,b∈{0,1} are mapped to code words of a secondary prefix-free code such that the codeword (bb . . . b) of the primary truncated unary code is mapped onto codeword (c) of the secondary prefix-free code and all other codewords {(a), (ba), (bba), . . . , (b . . . ba)} of the primary truncated unary code are mapped onto codewords having (d) with c≠d and c,d∈{0,1} as a prefix and a n-bit word as suffix, wherein the entropy encoders use different n. Each of the second subset of entropy encoders may be configured such that the n-bit word is an n-bit representation of the number of b's in the respective codeword of the primary truncated unary code. However, alternatives are feasible.

Again, from the perspective of the mode of operation of the respective encoder 10, each of the second subset of entropy encoders may be configured to, in converting the symbols forwarded to the respective entropy encoder into the respective bitstream, count a number of b's in a sequence of symbols forwarded to the respective entropy encoder, until an a occurs, or until the number of the sequence of symbols forwarded to the respective entropy encoder reaches $2^n$ with all $2^n$ symbols of the sequence being b, and (1) if the number of b's equals $2^n$, write c with c∈{0,1} as codeword of a secondary prefix-free code to the respective bitstream, and (2) if the number of b's is lower than $2^n$, write a codeword of the secondary prefix-free code to the respective bitstream, which has (d) with c≠d and d∈{0,1} as prefix and a n-bit word determined depending on the number of b's as suffix.

Also additionally or alternatively, a predetermined one of the entropy encoders 10 may be a variable length encoder configured to map symbol sequences of fixed lengths to codewords of variable lengths, respectively, the predetermined entropy coder using a bijective mapping rule according to which $2^3$ code words of length 3 of a primary code are mapped to code words of a secondary prefix-free code such that the codeword (aaa)$_3$ of the primary code with a∈{0,1} is mapped onto codeword (c) with c∈{0,1}, all three codewords of the primary code having exactly one b with b≠a and b∈{0,1} are mapped onto codewords having (d) with c≠d and d∈{0,1} as a prefix and a respective first 2-bit word out of a first set of 2-bit words as a suffix, all three codewords of the primary code having exactly one a are mapped onto codewords having (d) as a prefix and a concatenation of a first 2-bit word not being an element of the first set and a second 2-bit word out of a second set of 2-bit words, as a suffix, and wherein the codeword (bbb)$_3$ is mapped onto a codeword having (d) as a prefix and a concatenation of the first 2-bit word not being an element of the first set and a second 2-bit word not being an element of the second set, as a suffix. The first 2-bit word of the codewords of the primary code having exactly one b may be a 2-bit representation of a position of the b in the respective codeword of the primary code, and the second 2-bit word of the codewords of the primary code having exactly one a may be a 2-bit representation of a position of the a in the respective codeword of the primary code. However, alternatives are feasible.

Again, the predetermined one of the entropy encoders may be configured to, in converting the symbols forwarded to the predetermined entropy encoder into the respective bitstream, examine the symbols to the predetermined entropy encoder in triplets as to whether (1) the triplet consists of a's, in which case the predetermined entropy encoder is configured to write the codeword (c) to the respective bitstream, (2) the triplet exactly comprises one b, in which case the predetermined entropy encoder is configured to write a codeword having (d) as a prefix and a 2-bit representation of a position of the b in the triplet as a suffix, to the respective bitstream; (3) the triplet exactly comprises one a, in which case the predetermined entropy encoder is configured to write a codeword having (d) as a prefix and a concatenation of the first 2-bit word not being an element of the first set and a 2-bit representation of a position of the a in the triplet as a suffix, to the respective bitstream; or (4) the triplet consists of b's, in which case the predetermined entropy encoder is configured to write a codeword having (d) as a prefix and a concatenation of the first 2-bit word not being an element of the first set and the first 2-bit word not being an element of the second set as a suffix, to the respective bitstream.

Regarding the decoding side, just-described embodiments disclose a decoder for reconstructing a sequence of symbols 326, comprising a plurality of entropy decoders 322, each of which is configured to convert a respective bitstream 324 into symbols 321; an assigner 316 configured to assign a number of parameters to each symbol 326 of a sequence of symbols to be reconstructed based on information contained within previously reconstructed symbols of the sequence of symbols; and a selector 318 configured to retrieve each symbol 325 of the sequence of symbols to be reconstructed from a selected one of the plurality of entropy decoders, the selection depending on the number of parameters defined to the respective symbol. According to the just-described embodiments at least a first subset of the entropy decoders 322 are variable length decoders configured to map codewords of variable lengths to symbol sequences of variable lengths, respectively, with each of the entropy decoders 22 of the first subset using a bijective mapping rule according to which code words of a primary prefix-free code with (2n−1)≥3 code words are mapped to code words of a secondary prefix-free code which is identical to the primary prefix code such that all but two of the code words of the primary prefix-free code are mapped to identical code words of the secondary prefix-free code while the two code words of the primary and secondary prefix-free codes have different lengths and are mapped onto each other in an interchanged manner, wherein the entropy encoders use different n. The first prefix-free code may be constructed such that the codewords of the first prefix-free code are $(a,b)_2$, $(a,a,b)_3$, . . . , $(a, . . . ,a,b)_n$, $(a, . . . ,a)_n$, $(b,a)_2$, $(b,b,a)_3$, . . . , $(b, . . . ,b,a)_{n-1}$, $(b, . . . ,b)_{n-1}$, and the two codewords mapped onto each other in the interchanged manner may be $(a, . . . ,a)_n$, and $(b, . . . ,b)_{n-1}$ with b≠a and a,b∈{0,1}. However, alternatives are feasible.

Each of the first subset of entropy encoders may be configured to, in converting the respective bitstream into the symbols, examine a first bit of the respective bitstream, to determine as to whether (1) the first bit equals a 0{0,1}, in which case the respective entropy encoder is configured to examine the following bits of the respective bitstream to determine as to whether (1.1) b with b≠a and b 0 {0,1} occurs within the next n−1 bits following the first bit, in which case the respective entropy decoder is configured to reconstruct a symbol sequence, which equals the first bit followed by the following bits of the respective bitstream, up to the bit b; or (1.2) no b occurs within the next n−1 bits following the first bit, in which case the respective entropy decoder is configured to reconstruct a symbol sequence, which equals $(b, . . . ,b)_{n-1}$; or (2) the first bit equals b, in which case the respective entropy decoder is configured to examine the following bits of the respective bitstream to determine as to whether (2.1) a occurs within the next n−2 bits following the first bit, in which case the respective entropy decoder is configured to reconstruct a symbol sequence, which equals the first bit followed by the following bits of the respective bitstream up to the symbol a; or (2.2) no a occurs within the next n−2 bits following the first bit, in which case the respective entropy decoder is configured to reconstruct a symbol sequence, which equals $(a, . . . ,a)_n$.

Additionally or alternatively, at least a second subset of the entropy decoders 322 may be a variable length decoder configured to map codewords of fixed lengths to symbol sequences of variable lengths, respectively, with each of the entropy decoders of the second subset using a bijective mapping rule according to which code words of a secondary prefix-free code are mapped onto code words of a primary truncated unary code with $2^n+1$ code words of the type $\{(a), (ba), (bba), \ldots, (b \ldots ba), (bb \ldots b)\}$ with $b \neq a$ and $a, b \in \{0,1\}$ such that codeword (c) of the secondary prefix-free code is mapped onto the codeword (bb . . . b) of the primary truncated unary code and codewords having (d) with $c \neq d$ and $c, d \in \{0,1\}$ as a prefix and a n-bit word as suffix, are mapped to a respective one of the other codewords $\{(a), (ba), (bba), \ldots, (b \ldots ba)\}$ of the primary truncated unary code, wherein the entropy decoders use different n. Each of the second subset of entropy decoders may be configured such that the n-bit word is an n-bit representation of the number of b's in the respective codeword of the primary truncated unary code. However, alternatives are feasible.

Each of a second subset of entropy decoders may be a variable length decoder configured to map codewords of fixed lengths to symbol sequences of variable lengths, respectively, and configured to, in converting the bitstream of the respective entropy decoder into the symbols, examine a first bit of the respective bitstream to determine as to whether (1) same equals c with $c \in \{0,1\}$, in which case the respective entropy decoder is configured to reconstruct a symbol sequence which equals $(bb \ldots b)_{2^n}$ with $b \in \{0,1\}$; or (2) same equals d with $c \neq d$ and $c, d \in \{0,1\}$, in which case the respective entropy decoder is configured to determine a n-bit word from n further bits of the respective bitstream, following the first bit, and reconstruct a symbol sequence therefrom which is of the type $\{(a), (ba), (bba), \ldots, (b \ldots ba), (bb \ldots b)\}$ with $b \neq a$ and $b \in \{0,1\}$ with the number of b's depending on the n-bit word.

Additionally or alternatively, a predetermined one of the entropy decoders 322 may be a variable length decoders configured to map codewords of variable lengths to symbol sequences of fixed lengths, respectively, the predetermined entropy decoder using a bijective mapping rule according to which code words of a secondary prefix-free code are mapped to $2^3$ code words of length 3 of a primary code such that codeword (c) with $c \in \{0,1\}$ is mapped to the codeword $(aaa)_3$ of the primary code with $a \in \{0,1\}$, codewords having (d) with $c \neq d$ and $d \in \{0,1\}$ as a prefix and a respective first 2-bit word out of a first set of three 2-bit words as a suffix are mapped onto all three codewords of the primary code having exactly one b with $b \neq a$ and $b \in \{0,1\}$, codewords having (d) as a prefix and a concatenation of a first 2-bit word not being an element of the first set and a second 2-bit word out of a second set of three 2-bit words, as a suffix are mapped onto all three codewords of the primary code having exactly one a, and a codeword having (d) as a prefix and a concatenation of the first 2-bit word not being an element of the first set and a second 2-bit word not being an element of the second set, as a suffix is mapped onto the codeword $(bbb)_3$. The first 2-bit word of the codewords of the primary code having exactly one b may be a 2-bit representation of a position of the b in the respective codeword of the primary code, and the second 2-bit word of the codewords of the primary code having exactly one a may be a 2-bit representation of a position of the the a in the respective codeword of the primary code. However, alternatives are feasible.

The predetermined one of the entropy decoders may be a variable length decoder configured to map codewords of variable lengths to symbol sequences of three symbols each, respectively, and configured to, in converting the bitstream of the respective entropy decoder into the symbols, examine the first bit of the respective bitstream to determine as to whether (1) the first bit of the respective bitstream equals c with $c \in \{0,1\}$, in which case the predetermined entropy decoder is configured to reconstruct a symbol sequence which equals $(aaa)_3$ with a $0$ $\{0,1\}$, or (2) the first bit of the respective bitstream equals d with $c \neq d$ and $d \in \{0,1\}$, in which case the predetermined entropy decoder is configured to determine a first 2-bit word from 2 further bits of the respective bitstream, following the first bit, and examine the first 2-bit word to determine as to whether (2.1) the first 2-bit word is no element of a first set of three 2-bit words, in which case the predetermined entropy decoder is configured to reconstruct a symbol sequence which has exactly one b with $b \neq a$ and b $0$ $\{0,1\}$, with the position of b in the respective symbol sequence depending on the first 2-bit word, or (2.2) the first 2-bit word is element of the first set, in which case the predetermined entropy decoder is configured to determine a second 2-bit word from 2 further bits of the respective bitstream, following the two bits from which the first 2-bit word has been determined, and examine the second 2-bit word to determine as to whether (3.1) the second 2-bit word is no element of a second set of three 2-bit words, in which case the predetermined entropy decoder is configured to reconstruct a symbol sequence which has exactly one a, with the position of a in the respective symbol sequence depending on the second 2-bit word, or (3.2) the second 2-bit word is element of a second set of three 2-bit words, in which case the predetermined entropy decoder is configured to reconstruct a symbol sequence which equals $(bbb)_3$.

Now, after having described the general concept of a video coding scheme, embodiments of the present invention are described with respect to the above embodiments. In other words, the embodiments outlined below may be implemented by use of the above schemes, and vice versa, the above coding schemes may be implemented using and exploiting the embodiments outlined below.

In the above embodiments described with respect to FIGS. 7 to 9, the entropy encoder and decoders of FIGS. 1 to 6, were implemented in accordance with an PIPE concept. One special embodiment used arithmetic single-probability state an/decoders 310 and 322. As will be described below, in accordance with an alternative embodiment, entities 306-310 and the corresponding entities 318 to 322 may be replaced by a common entropy encoding engine. As an example, imagine an arithmetic encoding engine, which manages merely one common state R and L and encodes all symbols into one common bitstream, thereby giving-up the advantageous aspects of the present PIPE concept regarding parallel processing, but avoiding the necessity of interleaving the partial bitstreams as further discussed below. In doing so, the number of probability states by which the context's probabilities are estimated by update (such as table look-up), may be higher than the number of probability states by which the probability interval sub-division is performed. That is, analogously to quantizing the probability interval width value before indexing into the table Rtab, also the probability state index may be quantized. The above description for a possible implementation for the single en/decoders 310 and 322 may, thus, be extended for an example of an implementation of the entropy en/decoders 318-322/306-310 as context-adaptive binary arithmetic en/decoding engines:

To be more precise, in accordance with an embodiment, the entropy encoder attached to the output of parameter assigner (which acts as a context assigner, here) may operate in the following way:

0. The assigner 304 forwards the bin value along with the probability parameter. The probability is pState_current [bin].

1. Thus, the entropy encoding engine receives: 1) valLPS, 2) the bin and 3) the probability distribution estimate pState_current[bin]. pState_current[bin] may have more states than the number of distinguishable probability state indices of Rtab. If so, pState_current[bin] may be quantized such as, for example, by disregarding m LSBs with m being greater than or equal to 1 and advantageously 2 or 3 so as to obtain an p_state, i.e the index which is then used to access the table Rtab. The quantization may, however, be left away, i.e. p_state may be pState_current[bin].

2. Then, a quantization of R is performed (As mentioned above: either one R (and corresponding L with one common bitstream) is used/managed for all distinguishable values of p_state, or one R (and corresponding L with associated partial bitstream per R/L pair) per distinguishable value of p_state which latter case would correspond to having one bin encoder 310 per such value)

q_index=Qtab[R>>q] (or some other form of quantization)

3. Then, a determination of $R_{LPS}$ and R is performed:
   $R_{LPS}$=Rtab [p_state][q_index]; Rtab has stored therein pre-calculated values for p[p_state] Q[q_index]
   R=R−$R_{LPS}$ [that is, R is preliminarily pre-updated as if "bin" was MPS]

4. Calculation of the new partial interval:
   if (bin=1−valMPS) then
   L ¬ L+R
   R ¬ $R_{LPS}$ 5. Renormalization of L and R, writing bits, Analogously, the entropy decoder attached to the output of parameter assigner (which acts as a context assigner, here) may operate in the following way:

0. The assigner 304 forwards the bin value along with the probability parameter. The probability is pState_current [bin].

1. Thus, the entropy decoding engine receives the request for a bin along with: 1) valLPS, and 2) the probability distribution estimate pState_current[bin]. pState_current [bin] may have more states than the number of distinguishable probability state indices of Rtab. If so, pState_current [bin] may be quantized such as, for example, by disregarding m LSBs with m being greater than or equal to 1 and advantageously 2 or 3 so as to obtain an p_state, i.e the index which is then used to access the table Rtab. The quantization may, however, be left away, i.e. p_state may be pState_current[bin].

2. Then, a quantization of R is performed (As mentioned above: either one R (and corresponding V with one common bitstream) is used/managed for all distinguishable values of p_state, or one R (and corresponding V with associated partial bitstream per R/L pair) per distinguishable value of p_state which latter case would correspond to having one bin encoder 310 per such value)

q_index=Qtab[R>>q] (or some other form of quantization)

3. Then, a determination of $R_{LPS}$ and R is performed:
   $R_{LPS}$=Rtab[p_state][q_index]; Rtab has stored therein pre-calculated values for p[p_state] Q[q_index]
   R=R−$R_{LPS}$ [that is, R is preliminarily pre-updated as if "bin" was MPS]

4. Determination of bin depending on the position of the partial interval:
   if ($V^3R$) then
   bin ¬ 1−valMPS (bin is decoded as LPS; bin buffer selector 18 will obtain the actual bin value by use of this bin information and valMPS)
   V ¬ V−R
   R ¬ $R_{LPS}$
   else
   bin ¬ valMPS (bin is decoded as MPS; the actual bin value is obtained by use of this bin information and valMPS)

5. Renormalization of R, reading out one bit and updating V,

As described above, the assigner 4 assigns pState_current [bin] to each bin. The association may be done based on a context selection. That is, assigner 4 may select a context using an context index ctxIdx which, in turn, has a respective pState_current associated therewith. A probability update may be performed each time, a probability pState_current [bin] has been applied to a current bin. An update of the probability state pState_current[bin] is performed depending on the value of the coded bit:

--- if (bit = 1 − valMPS) then
   pState_current ← Next_State_LPS [pState_current]
   if (pState_current = 0) then valMPS ← 1 − valMPS
else
   pState_current ← Next_State_MPS [pState_current]

---

If more than one context is provided, the adaptation is done context-wise, i.e. pState_current[ctxIdx] is used for coding and then updated using the current bin value (encoded or decoded, respectively).

As will be outlined in more detail below, in accordance with embodiments described now, the encoder and decoder may optionally be implemented to operate in different modes, namely Low complexity (LC), and High efficiency (HE) mode. This is illustrated primarily regarding PIPE coding in the following (then mentioning LC and HE PIPE modes), but the description of the complexity scalability details is easily transferable to other implementations of the entropy encoding/decoding engines such as the embodiment of using one common context-adaptive arithmetic en/decoder.

In accordance with the embodiments outlined below, both entropy coding modes may share
the same syntax and semantics (for the syntax element sequence 301 and 327, respectively)
the same binarization schemes for all syntax elements (as currently specified for CABAC) (i.e. binarizers may operate irrespective of the mode activated)
the usage of the same PIPE codes (i.e. bin en/decoders may operate irrespective of the mode activated)
the usage of 8 bit probability model initialization values (instead of 16 bit initialization values as currently specified for CABAC)

Generally speaking, LC-PIPE differs from HE-PIPE in the processing complexity, such as the complexity of selecting the PIPE path 312 for each bin.

For example, the LC mode may operate under the following constraints: For each bin (binIdx), there may be exactly one probability model, i.e., one ctxIdx. That is, no context selection/adaptation may be provided in LC PIPE. Specific syntax elements such as those used for residual coding may, hover, coded using contexts, as further outlined below. Moreover, all probability models may be non-adaptive, i.e., all models may be initialized at the beginning of each slice with appropriate model probabilities (depending on the choice of slice type and slice QP) and may be kept fixed throughout processing of the slice. For example, only 8 different model probabilities corresponding to 8 different PIPE codes 310/322 may be supported, both for context modelling and coding. Specific syntax elements for residual coding, i.e., significance_coeff_flag and coeff_abs_level_greaterX (with X=1,2), the semantics of which are outlined in more detail below, may be assigned to probability models such that (at least) groups of, for example, 4 syntax elements are encoded/decoded with the same model probability. Compared to CAVLC, the LC-PIPE mode achieves roughly the same R-D performance and the same throughput.

HE-PIPE may be configured to be conceptually similar to CABAC of H.264 with the following differences: Binary arithmetic coding (BAC) is replaced by PIPE coding (same as in the LC-PIPE case). Each probability model, i.e., each ctxIdx, may be represented by a pipeIdx and a refineIdx, where pipeIdx with values in the range from 0 . . . 7 represents the model probability of the 8 different PIPE codes. This change affects only the internal representation of states, not the behavior of the state machine (i.e., probability estimation) itself. As will be outlined in more detail below, the initialization of probability models may use 8 bit initialization values as stated above. Backward scanning of syntax elements coeff_abs_level_greaterX (with X=1, 2), coeff_abs_level_minus3, and coeff_sign_flag (the semantics of which will get clear from the below discussion) may be performed along the same scanning path as the forward scan (used in, for example, the significance map coding). Context derivation for coding of coeff_abs_level_greaterX (with X=1, 2) may also be simplified. Compared to CABAC, the proposed HE-PIPE achieves roughly the same R-D performance at a better throughput.

It is easy to see that the just-mentioned modes are readily generated by rendering, for example, the afore-mentioned context-adaptive binary arithmetic en/decoding engine such that same operates in different modes.

Figure 11:
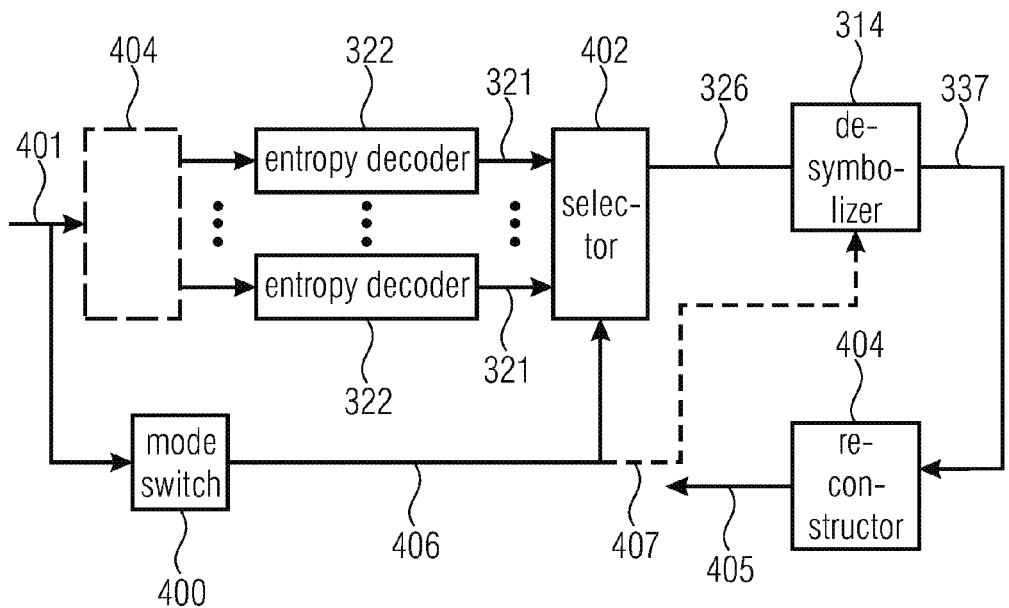
FIG. 11 shows a decoder supporting mode switching according to an embodiment.

Thus, in accordance with an embodiment in accordance with a first aspect of the present invention, a decoder for decoding a data stream may be constructed as shown in FIG. 11. The decoder is for decoding a datastream 401, such as interleaved bitstream 340, into which media data, such as video data, is coded. The decoder comprises a mode switch 400 configured to activate the low-complexity mode or the high efficiency mode depending on the data stream 401. To this end, the data stream 401 may comprise a syntax element such as a binary syntax element, having a binary value of 1 in case of the low-complexity mode being the one to be activated, and having a binary value of 0 in case of the high efficiency mode being the one to be activated. Obviously, the association between binary value and coding mode could be switched, and a non-binary syntax element having more than two possible values could be used as well. As the actual selection between both modes is not yet clear before the reception of the respective syntax element, this syntax element may be contained within some leading header of the datastream 401 encoded, for example, with a fixed probability estimate or probability model or being written into the datastream 401 as it is, i.e., using a bypass mode.

Further, the decoder of FIG. 11 comprises a plurality of entropy decoders 322 each of which is configured to convert codewords in the datastream 401 to partial sequences 321 of symbols. As described above, a de-interleaver 404 may be connected between inputs of entropy decoders 322 on the one hand and the input of the decoder of FIG. 11 where the datastream 401 is applied, on the other hand. Further, as already described above, each of the entropy decoders 322 may be associated with a respective probability interval, the probability intervals of the various entropy decoders together covering the whole probability interval from 0 to 1- or 0 to 0.5 in case of the entropy decoders 322 dealing with MPS and LPS rather than absolute symbol values. Details regarding this issue have been described above. Later on, it is assumed that the number of decoders 322 is 8 with a PIPE index being assigned to each decoder, but any other number is also feasible. Further, one of these coders, in the following this is exemplarily the one having pipe_id 0, is optimized for bins having equi-probable statistics, i.e. their bin value assumes 1 and 0 equally probably. This, decoder may merely pass on the bins. The respective encoder 310 operates the same. Even any bin manipulation depending on the value of the most probable bin value, va1MPS, by the selectors 402 and 502, respectively, may be left away. In other words, the entropy of the respective partial stream is already optimal.

Further, the decoder of FIG. 11 comprises a selector 402 configured to retrieve each symbol of a sequence 326 of symbols from a selected one of the plurality of entropy decoders 322. As mentioned above, selector 402 may be split-up into a parameter assigner 316 and a selector 318. A de-symbolizer 314 is configured to de-symbolize the sequence 326 of symbols in order to obtain a sequence 327 of syntax elements. A reconstructor 404 is configured to reconstruct the media data 405 based on the sequence of syntax elements 327. The selector 402 is configured to perform the selection depending on the activated one of the low complexity mode and the high-efficiency mode as it is indicated by arrow 406.

As already noted above, the reconstructor 404 may be the part of a predictive block-based video decoder operating on a fixed syntax and semantics of syntax elements, i.e., fixed relative to the mode selection by mode switch 400. That is, the construction of the reconstructor 404 does not suffer from the mode switchability. To be more precise, the reconstructor 404 does not increase the implementation overhead due to the mode switchability offered by mode switch 400 and at least the functionality with regard to the residual data and the prediction data remains the same irrespective of the mode selected by switch 400. The same applies, however, with regard to the entropy decoders 322. All these decoders 322 are reused in both modes and, accordingly, there is no additional implementation overhead although the decoder of FIG. 11 is compatible with both modes, the low-complexity and high-efficiency modes.

As a side aspect it should be noted that the decoder of FIG. 11 is not only able to operate on self-contained datastreams either in the one mode or the other mode. Rather, the decoder of FIG. 11 as well as the datastream 401 could be configured such that switching between both modes would even be possible during one piece of media data such as during a video or some audio piece, in order to, for example, control the coding complexity at the decoding side depending on external or environmental conditions such as a battery status or the like with using a feedback channel from decoder to encoder in order to accordingly locked-loop control the mode selection.

Thus, the decoder of FIG. 11 operates similarly in both cases, in case of the LC mode being selected or the HE mode being selected. The reconstructor 404 performs the reconstruction using the syntax elements and requests the current syntax element of a predetermined syntax element type by processing or obeying some syntax structure prescription.

The de-symbolizer 314 requests a number of bins in order to yield a valid binarization for the syntax element requested by the reconstructor 404. Obviously, in case of a binary alphabet, the binarization performed by de-symbolizer 314 reduces down to merely passing the respective bin/symbol 326 to reconstructor 404 as the binary syntax element currently requested.

The selector 402, however, acts independently on the mode selected by mode switch 400. The mode of operation of selector 402 tends to be more complex in case of the high efficiency mode, and less complex in case of the low-complexity mode. Moreover, the following discussion will show that the mode of operation of selector 402 in the less-complex mode also tends to reduce the rate at which selector 402 changes the selection among the entropy decoders 322 in retrieving the consecutive symbols from the entropy decoders 322. In other words, in the low-complexity mode, there is an increased probability that immediately consecutive symbols are retrieved from the same entropy decoder among the plurality of entropy decoders 322. This, in turn, allows for a faster retrieval of the symbols from the entropy decoders 322. In the high-efficiency mode, in turn, the mode of operation of the selector 402 tends to lead to a selection among the entropy decoders 322 where the probability interval associated with the respective selected entropy decoder 322 more closely fits to the actual symbol statistics of the symbol currently retrieved by selector 402, thereby yielding a better compression ratio at the encoding side when generating the respective data stream in accordance with the high-efficiency mode.

For example, the different behavior of the selector 402 in both modes, may be realized as follows. For example, the selector 402 may be configured to perform, for a predetermined symbol, the selection among the plurality of entropy decoders 322 depending on previously retrieved symbols of the sequence 326 of symbols in case of the high-efficiency mode being activated and independent from any previously retrieved symbols of the sequence of symbols in case of the low-complexity mode being activated. The dependency on previously retrieved symbols of the sequence 326 of symbols may result from a context adaptivity and/or a probability adaptivity. Both adaptivities may be switched off during low complexity mode in selector 402.

In accordance with a further embodiment, the datastream 401 may be structured into consecutive portions such as slices, frames, group of pictures, frame sequences or the like, and each symbol of the sequence of symbols may be associated with a respective one of a plurality of symbol types. In this case, the selector 402 may be configured to vary, for symbols of a predetermined symbol type within a current portion, the selection depending on previously retrieved symbols of the sequence of symbols of the predetermined symbol type within the current portion in case of the high-efficiency mode being activated, and leave the selection constant within the current portion in case of the low-complexity mode being activated. That is, selector 402 may be allowed to change the selection among the entropy decoders 322 for the predetermined symbol type, but these changes are restricted to occur between transitions between consecutive portions. By this measure, evaluations of actual symbol statistics are restricted to seldom occurring time instances while coding complexity is reduced within the majority of the time.

Further, each symbol of the sequence 326 of symbols may be associated with a respective one of a plurality of symbol types, and the selector 402 may be configured to, for a predetermined symbol of a predetermined symbol type, select one of a plurality of contexts depending on previously retrieved symbols of the sequence 326 of symbols and perform the selection among the entropy decoders 322 depending on a probability model associated with a selected context along with updating the probability model associated with a selected context depending on the predetermined symbol in case of the high-efficiency mode being activated, and perform selecting the one of the plurality of context depending on the previously retrieved symbols of the sequence 326 of symbols and perform the selection among the entropy decoders 322 depending on the probability model associated with the selected context along with leaving the probability model associated with the selected context constant in case of the low-complexity mode being activated. That is, selector 402 may use context adaptivity with respect to a certain syntax element type in both modes, while suppressing probability adaptation in case of the LC mode.

Alternatively, instead of completely suppressing the probability adaptation, selector 402 may merely reduce an update rate of the probability adaptation of the LC mode relative to the HE mode.

Further, possible LC-pipe-specific aspects, i.e., aspects of the LC mode, could be described as follows in other words. In particular, non-adaptive probability models could be used in the LC mode. A non-adaptive probability model can either have a hardcoded, i.e., overall constant probability or its probability is kept fixed throughout processing of a slice only and thus can be set dependent on slice type and QP, i.e., the quantization parameter which is, for example, signaled within the datastream 401 for each slice. By assuming that successive bins assigned to the same context follow a fixed probability model, it is possible to decode several of those bins in one step as they are encoded using the same pipe code, i.e., using the same entropy decoder, and a probability update after each decoded bin is omitted. Omitting probability updates saves operations during the encoding and decoding process and, thus, also leads to complexity reductions and a significant simplification in hardware design.

The non-adaptive constraint may be eased for all or some selected probability models in such a way that probability updates are allowed after a certain number of bins have been encoded/decoded using this model. An appropriate update interval allows a probability adaptation while having the ability to decode several bins at once.

In the following, a more detailed description of possible common and complexity-scalable aspects of LC-pipe and HE-pipe is presented. In particular, in the following, aspects are described which may be used for LC-pipe mode and HE-pipe mode in the same way or in a complexity-scalable manner. Complexity-scalable means that the LC-case is derived from the HE-case by removing particular parts or by replacing them with something less complex. However, before proceeding therewith, it should be mentioned that the embodiment of FIG. 11 is easily transferable onto the above-mentioned context-adaptive binary arithmetic en/decoding embodiment: selector 402 and entropy decoders 322 would condense into a context-adaptive binary arithmetic decoder which would receive the datastream 401 directly and select the context for a bin currently to be derived from the datastream. This is especially true for context adaptivity and/or probability adaptivity. Both functionalities/adaptivities may be switched off, or designed more relaxed, during low complexity mode.

For example, in implementing the embodiment of FIG. 11, the pipe entropy coding stage involving the entropy decoders 322 could use eight systematic variable-to-variable-codes, i.e., each entropy decoder 322 could be of a v2v type which has been described above. The PIPE coding concept using systematic v2v-codes is simplified by restricting the number of v2v-codes. In case of a context-adaptive binary arithmetic decoder, same could manage the same probability states for the different contexts and use same—or a quantoized version thereof—for the probability sub-division. The mapping of CABAC or probability model states, i.e. the sates used for probability update, to PIPE ids or probability indices for look-up into Rtab may be as depicted in Table A.

TABLE A

Mapping of CABAC states to PIPE indices

| CABAC state | PIPE index |
|---|---|
| 0 | 0 |
| 1 | |
| 2 | |
| 3 | 1 |
| 4 | |
| 5 | |
| 6 | |
| 7 | |
| 8 | |
| 9 | |
| 10 | 2 |
| 11 | |
| 12 | |
| 13 | |
| 14 | |
| 15 | 3 |
| 16 | |
| 17 | |
| 18 | |
| 19 | |
| 20 | |
| 21 | |
| 22 | 4 |
| 21 | 3 |
| 24 | |
| 25 | |
| 26 | |
| 27 | |
| 28 | |
| 29 | |
| 30 | |
| 31 | |
| 32 | 5 |
| 33 | |
| 34 | |
| 35 | |
| 36 | |
| 37 | |
| 38 | |
| 39 | |
| 40 | |
| 41 | |
| 42 | |
| 43 | |
| 44 | |
| 45 | |
| 46 | 6 |
| 47 | |
| 48 | |
| 49 | |
| 50 | |
| 51 | |
| 52 | |
| 53 | |
| 54 | |
| 55 | |
| 56 | |
| 57 | |
| 58 | |
| 59 | |
| 60 | |
| 61 | |
| 62 | 7 |

This modified coding scheme may be used as a basis for the complexity-scalable video coding approach. When performing probability mode adaptation, the selector 402 or context-adaptive binary arithmetic decoder, respectively, would select the PIPE decoder 322, i.e. derive the pipe index, to be used, and the probability index into Rtab, respectively, based on the probability state index—here exemplarily ranging from 0 to 62-associated with the currently to be decoded symbol—such as via a context—using the mapping shown in table A, and would update this probability state index depending on the currently decoded symbol using, for example, specific table walk transition values pointing to the next probability state index to be visited in case of an MPS and a LPS, respectively. In case of LC mode, the latter update could be left away. Even the mapping could be left away in case of globally fixed probability models.

However, an arbitrary entropy coding setup could be used and the techniques in this document can also be used with minor adaptations.

The above description of FIG. 11 rather generally referred to syntax elements and syntax element types. In the following, a complexity configurable coding of transform coefficient levels is described.

For example, the reconstructor 404 may be configured to reconstruct a transform block 200 of transform coefficient levels 202 based on a portion of the sequence of syntax elements independent from the high-efficiency mode or the low-complexity mode being activated, the portion of the sequence 327 of syntax elements comprising, in an un-interleaved manner, significance map syntax elements defining a significance map indicating positions of non-zero transform coefficient levels within the transform block 200, and then (followed by) level syntax elements defining the non-zero transform coefficient levels. In particular, the following elements may be involved: end position syntax elements (last-significant_pos_x, last_significant_pos_y) indicating a position of a last non-zero transform coefficient level within the transform block; first syntax elements (coeff_significant_flag) together defining a significance map and indicating, for each position along a one-dimensional path (274) leading from a DC position to the position of the last non-zero transform coefficient level within the transform block (200), as to whether the transform coefficient level at the respective position is non-zero or not; second syntax elements (coeff_abs_greater1) indicating, for each position of the one-dimensional path (274) where, according to the first binary syntax elements, a non-zero transform coefficient level is positioned, as to whether the transform coefficient level at the respective position is greater than one; and third syntax elements (coeff_abs_greater2, coeff_abs_minus3) revealing, for each position of the one-dimensional path where, according to the first binary syntax elements, a transform coefficient level greater than one is positioned, an amount by which the respective transform coefficient level at the respective position exceeds one.

The order among the end position syntax elements, the first, the second and the third syntax elements may be same for the high-efficiency mode and the low-complexity mode, and the selector 402 may be configured to perform the selection among the entropy decoders 322 for symbols from which the de-symoblizer 314 obtains the end position syntax elements, first syntax elements, second syntax elements and/or the third syntax elements, differently depending on the low-complexity mode or the high-efficiency mode being activated.

In particular, the selector 402 may be configured, for symbols of a predetermined symbol type among a subsequence of symbols from which the de-symbolizer 314 obtains the first syntax elements and second syntax elements, to select for each symbol of the predetermined symbol type one of a plurality of contexts depending on previously retrieved symbols of the predetermined symbol type among the subsequence of symbols and perform the selection depending on a probability model associated with the selected context in case of the high-efficiency mode being activated, and perform the selection in a piece wise constant manner such that the selection is constant over consecutive continuous subparts of the subsequence in case of the low-complexity mode be activated. As described above, the subparts may be measured in the number of positions over which the respective subpart extends when measured along the one-dimensional path 274, or in the number of syntax elements of the respective type already coded with the current context. That is, the binary syntax elements coeff_significant_flag_coeff_abs_greater1 and coeff_abs_greater2, for example, are coded context adaptively with selecting the decoder 322 based on the probability model of the selected context in HE mode. Probability adaptation is used as well. In LC mode, there are also different contexts which are used for each of the binary syntax elements coeff_significant_flag, coeff_abs_greater1 and coeff_abs_greater2. However, for each of these syntax elements, the context is kept static for the first portion along path 274 with changing the context merely at a transition to the next, immediately following portion along the path 274. For example, each portion may defined to be 4, 8, 16 positions of block 200 long, independent from as to whether for the respective position the respective syntax element is present or not. For example, coeff_abs_greater1 and coeff_abs_greater2 are merely present for significant positions, i.e. positions where—or for which—coeff_significant_flag is 1. Alternatively, each portion may defined to be 4, 8, 16 syntax elements long, independent from as to whether for the thus resulting respective portion extends over a higher number of block positions. For example, coeff_abs_greater1 and coeff_abs_greater2 are merely present for significant positions, and thus, portions of four syntax elements each may extend over more than 4 block positions due to positions therebetween along path 274 for which no such syntax element is transmitted such as no coeff_abs_greater1 and coeff_abs_greater2 because the respective level at this position is zero.

The selector 402 may be configured to, for the symbols of the predetermined symbol type among the subsequence of symbols from which the de-symbolizer obtains the first syntax elements and second syntax elements, select for each symbol of the predetermined symbol type the one of a plurality of contexts depending on a number of previously retrieved symbols of the predetermined symbol type within the subsequence of symbols, which have a predetermined symbol value and belong to the same subpart, or a number of previously retrieved symbols of the predetermined symbol type within the sequence of symbols, which belong to the same subpart. The first alternative has been true for coeff_abs_greater1 and the secondary alternative has be true for coeff_abs_greater2 in accordance with the above specific embodiments.

Further, the third syntax elements revealing, for each position of the one-dimensional path where, according to the first binary syntax elements, a transform coefficient level greater than one is positioned, an amount by which the respective transform coefficient level at the respective position exceeds one, may comprise integer-valued syntax elements, i.e. coeff_abs_minus3, and the desymbolizer 314 may be configured to use a mapping function controllable by a control parameter to map a domain of symbol sequence words to a co-domain of the integer-valued syntax elements, and to set the control parameter per integer-valued syntax element depending on integer-valued syntax elements of previous third syntax elements if the high-efficiency mode is activated, and perform the setting in a piecewise constant manner such that the setting is constant over consecutive continuous subparts of the subsequence in case of the low-complexity mode being activated, wherein the selector 402 may configured to select a predetermined one of the entropy decoders (322) for the symbols of symbol sequence words mapped onto the integer-valued syntax elements, which is associated with a equal probability distribution, in both the high-efficiency mode and the low-complexity mode. That is, even the desymbolizer may operate dependent on the mode selected be switch 400 is illustrated by dotted line 407. Instead of a piecewise constant setting of the control parameter, the desymbolizer 314 may keep the control parameter constant during the current slice, for example, or constant globally in time.

Next, a complexity-scalable context modelling is described.

The evaluation of the same syntax element of the top and the left neighbour for the derivation of the context model index is a common approach and is often used in the HE case, e.g. for the motion vector difference syntax element. However, this evaluation necessitates more buffer storage and disallows the direct coding of the syntax element. Also, to achieve higher coding performance, more available neighbours can be evaluated.

In an embodiment, all context modelling stage evaluating syntax elements of neighbor square or rectangle blocks or prediction units are fixed to one context model. This is equal to the disabling of the adaptivity in the context model selection stage. For that embodiment, the context model selection depending on the bin index of the bin string after a binarization is not modified compared to the current design for CABAC. In another embodiment, additional to the fixed context model for syntax elements employ the evaluation of neighbors, also the context model for the different bin index are fixed. Note that the description does not include the binarization and context model selection for the motion vector difference and the syntax elements related to the coding of the transform coefficient levels.

In an embodiment, only the evaluation of the left neighbor is allowed. This leads to reduced buffer in the processing chain because the last block or coding unit line has not to be stored anymore. In a further embodiment, only neighbors lying in the same coding unit are evaluated.

In an embodiment, all available neighbors are evaluated. For example, in addition to the top and the left neighbor, the top left, the top right, and the bottom left neighbor are evaluated in case of availability.

That is, the selector 402 of FIG. 11 may be configured to use, for a predetermined symbol relating to a predetermined block of the media data, previously retrieved symbols of the sequence of symbols relating to a higher number of different neighboring blocks of the media data in case of the high-efficiency mode being activated in order to select one of a plurality of contexts and perform the selection among the entropy decoders 322 depending on a probability model associated with the selected context. That is, the neighboring blocks may neighbor in times and/or spatial domain. Spatially neighboring blocks are visible, for example, in FIGS. 1 to 3. Then, selector 402 may be responsive to the mode selection by mode switch 400 to perform a contact adaptation based on previously retrieved symbols or syntax elements relating to a higher number of neighboring blocks in case of the HE mode compared to the LC mode thereby reducing the storage overhead as just-described.

Next, a reduced-complexity coding of motion vector differences in accordance with an embodiment is described.

In the H.264/AVC video codes standard, a motion vector associated with a macroblock is transmitted by signaling the difference (motion vector difference—mvd) between the motion vector of the current macroblock and the median motion vector predictor. When the CABAC is used as entropy coder, the mvd is coded as follows. The integer-valued mvd is split into an absolute and the sign part. The absolute part is binarized using a combination of truncated unary and 3rd order Exp-Golomb, referred to as the prefix and the suffix of the resulting bin string. The bins related to the truncated unary binarization is coded using context models, while bins related to the Exp-Golomb binarization is coded in a bypass mode, i.e. with a fixed probability of 0.5 with CABAC. The unary binarization works as follows. Let the absolute integer-value of the mvd be n, then the resulting bin string consists of n times '1' and one trailing '0'. As an example, let n=4, then the bin string is '11110'. In case of truncated unary, a limit exists and if the value excesses this limit, the bin string consists of n+1 times '1'. For the case of mvd, the limit is equal to 9. That means if an absolute mvd is equal to or greater than 9 is coded, resulting in 9 times '1', the bin string consists of a prefix and a suffix with Exp-Golomb binarization. The context modelling for the truncated unary part is done as follows. For the first bin of the bin string, the absolute mvd values from the top and the left neighbour macroblocks are taken if available (if not available, the value is inferred to be 0). If the sum for the specific component (horizontal or vertical direction) is greater than 2, the second context model is selected, if the absolute sum is greater than 32, the third context model is selected, otherwise (the absolute sum is smaller than 3) the first context model is selected. Furthermore, the context models are different for each component. For the second bin of the bin string, the fourth context model is used and the fifth context model is employed for the remaining bins of the unary part. When the absolute mvd is equal to or greater than 9, e.g. all bins of the truncated unary part are equal to '1', the difference between the absolute mvd value and 9 is coded in a bypass mode with 3rd order Exp-Golomb binarization. In the last step, the sign of the mvd is coded in a bypass mode.

The latest coding technique for the mvd when using CABAC as entropy coder is specified in the current Test Model (HM) of the High Efficiency Video Coding (HEVC) project. In HEVC, the block sizes are variable and the shape specified by a motion vector is referred to as prediction unit (PU). The PU size of the top and the left neighbor may have other shapes and sizes than the current PU. Therefore, whenever relevant, the definition of top and the left neighbor are referred now as top and left neighbor of the top-left corner of the current PU. For the coding itself, only the derivation process for the first bin may be changed in accordance with an embodiment. Instead of evaluating the absolute sum of the MV from the neighbors, each neighbor may be evaluated separately. If the absolute MV of a neighbor is available and greater than 16, the context model index may be incremented resulting in the same number of context models for the first bin, while the coding of the remaining absolute MVD level and the sign is exactly the same as in H.264/AVC.

In the above outlined technique on coding of the mvd, up to 9 bins have to be coded with a context model, while the remaining value of an mvd can be coded in a low complexity bypass mode together with the sign information. This present embodiment describes a technique to reduce the number of bins coded with context models resulting in increased number of bypass and reduces the number of context models necessitated for the coding of mvd. For that, the cut-off value is decreased from 9 to 1 or 2. That means only the first bin specifying if the absolute mvd is greater than zero is coded using context model or the first and the second bin specifying if the absolute mvd is greater than zero and one is coded using context model, while the remaining value is coded in the bypass mode and/or using a VLC code. All bins resulting from the binarization using the VLC code—not using the unary or truncated unary code—are coded using a low complexity bypass mode. In case of PIPE, a direct insertion into and from the bitstream are possible. Moreover, a different definition of the top and the left neighbor to derive better context model selection for the first bin, may be used, if ever.

In an embodiment, Exp-Golomb codes are used to binarize the remaining part of the absolute MVD components. For that, the order of the Exp-Golomb code is variable. The order of the Exp-Golomb code is derived as follows. After the context model for the first bin, and therefore the index of that context model, is derived and coded, the index is used as the order for the Exp-Golomb binarization part. In this embodiment, the context model for the first bin is ranged from 1-3 resulting in the index 0-2, which are used as the order of the Exp-Golomb code. This embodiment can be used for the HE case.

In an alternative to the above outlined technique of using two times five contexts in coding of the absolute MVD, in order to code the 9 unary code binarization bins, 14 context models (7 for each component) could be used as well. For example, while the first and second bins of the unary part could be could be coded with four different contexts as described before, a fifth context could be used for the third bin and a sixth context could be used with respect to the forth bin, while the fifth to ninth bins are coded using a seventh context. Thus, in this case even 14 contexts would be necessitated, and merely the remaining value can be coded in a low complexity bypass mode. A technique to reduce the number of bins coded with context models resulting in increased number of bypass and reduce the number of context models necessitated for the coding of MVD, is to decrease the cut-off value such as, for example, from 9 to 1 or 2. That means only the first bin specifying if the absolute MVD is greater than zero would be coded using a context model or the first and the second bin specifying if the absolute MVD is greater than zero and one would be coded using a respective context model, while the remaining value is coded with a VLC code. All bins resulting from the binarization using the VLC code are coded using a low complexity bypass mode. In case of PIPE, a direct insertion into and from the bitstream is possible. Furthermore, the presented embodiment uses another definition of the top and the left neighbor to derive better context model selection for the first bin. In addition to this, the context modeling is modified in a way so that the number of context models necessitated for the first or the first and second bin is decreased leading to a further memory reduction. Also, the evaluation of the neighbours such as the above neighbour can be disabled resulting in the saving of the line buffer/ memory necessitated for storage of mvd values of the neighbours. Finally, the coding order of the components may be split in a way allowing the coding of the prefix bins for both components (i.e. bins coded with context models) followed by the coding of bypass bins.

In an embodiment, Exp-Golomb codes are used to binarize the remaining part of the absolute mvd components. For that, the order of the Exp-Golomb code is variable. The order of the Exp-Golomb code may be derived as follows. After the context model for the first bin, and therefore the index of that context model is derived, the index is used as the order for the Exp-Golomb binarization. In this embodiment, the context model for the first bin is ranged from 1-3 resulting in the index 0-2, which is used as the order of the Exp-Golomb code. This embodiment can be used for the HE case and the number of context models is reduced to 6. In order to reduce the number of context models again and therefore to save memory, the horizontal and the vertical components may share the same context models in a further embodiment. In that case, only 3 context models are necessitated. Furthermore, only the left neighbour may be taken into account for the evaluation in a further embodiment of the invention. In this embodiment, the threshold can be unmodified (e.g. only single threshold of 16 resulting in Exp-Golomb parameter of 0 or 1 or single threshold of 32 resulting in Exp-Golomb parameter of 0 or 2). This embodiment saves the line buffer necessitated for the storage of mvd. In another embodiment, the threshold is modified and is equal to 2 and 16. For that embodiment, in total 3 context models are necessitated for the coding of the mvd and the possible Exp-Golomb parameter is ranged from 0-2. In a further embodiment, the threshold is equal to 16 and 32. Again, the described embodiment is suitable for the HE case.

In a further embodiment of the invention, the cut-off value is decreased from 9 to 2. In this embodiment, the first bin and the second bin may be coded using context models. The context model selection for the first bin can be done as in the state-of-the-art or modified in a way described in the embodiment above. For the second bin, a separate context model is selected as in the state-of-the-art. In a further embodiment, the context model for the second bin is selected by evaluating the mvd of the left neighbour. For that case, the context model index is the same as for the first bin, while the available context models are different than those for the first bin. In total, 6 context models are necessitated (note that the components sharing the context models). Again, the Exp-Golomb parameter may depend on the selected context model index of the first bin. In another embodiment of the invention, the Exp-Golomb parameter is depending on the context model index of the second bin. The described embodiments of the invention can be used for the HE case.

In a further embodiment of the invention, the context models for both bins are fixed and not derived by evaluating either the left or the above neighbours. For this embodiment, the total number of context models is equal to 2. In a further embodiment of the invention, the first bin and the second bin shares the same context model. As a result, only one context model is necessitated for the coding of the mvd. In both embodiments of the invention, the Exp-Golomb parameter may be fixed and be equal to 1. The described embodiment of the invention are suitable for both HE and LC configuration.

In another embodiment, the order of the Exp-Golomb part is derived independently from the context model index of the first bin. In this case, the absolute sum of the ordinary context model selection of H.264/AVC is used to derive the order for the Exp-Golomb part. This embodiment can be used for the HE case.

In a further embodiment, the order of the Exp-Golomb codes is fixed and is set to 0. In another embodiment, the order of the Exp-Golomb codes is fixed and set to 1. In an embodiment, the order of the Exp-Golomb codes is fixed to 2. In a further embodiment, the order of the Exp-Golomb codes is fixed to 3. In a further embodiment, the order of the Exp-Golomb codes is fixed according the shape and the size of the current PU. The presented embodiments can be used for the LC case. Note that the fixed order of the Exp-Golomb part are considered with reduced number of bins coded with context models.

In an embodiment, the neighbors are defined as follows. For the above PU, all PUs covers the current PU are taken into account and the PU with the largest MV used. This is done also for the left neighbor. All PUs covers the current PU are evaluated and the PU with the largest MV is used. In another embodiment, the average absolute motion vector value from all PUs cover the top and the left border the current PU is used to derive the first bin.

For the presented embodiments above, it is possible to change the coding order as follows. The mvd have to be specified for the horizontal and vertical direction one after another (or vice versa). Thus, two bin strings have to be coded. In order to minimize the number of mode switching for the entropy coding engine (i.e. the switch between the bypass and the regular mode), it is possible to code the bins coded with context models for both components in the first step followed by the bins coded in bypass mode in the second step. Note that this is a reordering only.

Please note that the bins resulting from the unary or truncated unary binarization can also be represented by an equivalent fixed length binarization of one flag per bin index specifying whether the value is greater than the current bin index. As an example, the cut-off value for truncated unary binarization of mvd is set to 2 resulting in codewords 0, 10, 11 for values 0, 1, 2. In the corresponding fixed length binarization with one flag per bin index, one flag for bin index 0 (i.e. the first bin) specifies whether the absolute mvd value is greater than 0 or not and one flag for the second bin with bin index 1 specifies whether the absolute mvd value is greater than 1 or not. When the second flag is only coded when the first flag is equal to 1, this results in the same codewords 0, 10, 11.

Next, complexity-scalable representation of the internal state of probability models in accordance with an embodiment as described.

In the HE-PIPE setup, the internal state of a probability model is updated after encoding a bin with it. The updated state is derived by a state transition table lookup using the old state and the value of the coded bin. In the case of CABAC, a probability model can take 63 different states where each state corresponds to a model probability in the interval (0.0, 0.5). Each of these states is used to realize two model probabilities. In addition to the probability assigned to the state, 1.0 minus the probability is also used and a flag called valMps stores the information whether the probability or 1.0 minus the probability is used. This leads to a total of 126 states. To use such a probability model with the PIPE coding concept, each of the 126 states needs to be mapped to one of the available PIPE coders. In current implementations of PIPE coders, this is done by using a lookup-table. An example of such a mapping is depicted in Table A.

In the following, an embodiment is described how the internal state of a probability model can be represented to avoid using a lookup table to convert the internal state to a PIPE index. Solely some simple bit masking operations are needed to extract the PIPE index from the internal state variable of the probability model. This novel complexity-scalable representation of the internal state of a probability model is designed in a two level manner. For applications where low complexity operation is mandatory only the first level is used. It describes only the pipe index and the flag valMps that is used to encode or decode the associated bins. In the case of the described PIPE entropy coding scheme, the first level can be used to differentiate between 8 different model probabilities. Thus, the first level would need 3 bit for the pipeIdx and one further bit for the valMps flag. With the second level each of the coarse probability ranges of the first level is refined into several smaller intervals that support the presentation of probabilities at higher resolutions. This more detailed presentation enables the more exact operation of probability estimators. In general, it is suitable for coding applications that aim towards high RD-performances. As an example this complexity-scaled representation of the internal state of probability models with the usage of PIPE is illustrated as follows:

| First Level | | | | Second Level | | | |
|---|---|---|---|---|---|---|---|
| $b_7$ | $b_6$ | $b_5$ | $b_4$ | $b_3$ | $b_2$ | $b_1$ | $b_0$ |
| MPS PIPE Idx (0-7) | | | | Refinement Idx (0-15) | | | |

The first and the second level are stored in a single 8 bit memory. 4 bits are necessitated to store the first level—an index that defines the PIPE index with the value of the MPS on the most significant bit- and another 4 bits are used to store the second level. To implement the behaviour of the CABAC probability estimator, each PIPE index has a particular number of allowed refinement indices depending on how many CABAC states were mapped on the PIPE index. E.g. for the mapping in Table A, the number of CABAC states per PIPE index is depicted in Table B.

TABLE B

Number of CABAC states per PIPE index for the example of Table A.

| PIPE idx | 0 | 1 | 2 | 3 | 4 | 5 | 6 | 7 |
|---|---|---|---|---|---|---|---|---|
| Number of CABAC states | 3 | 7 | 5 | 7 | 10 | 14 | 16 | 1 |

During the encoding or decoding process of a bin the PIPE index and valMps can be accessed directly by employing simple bit mask or bit shift operations. Low complexity coding processes necessitate the 4 bits of the first level only and high efficiency coding processes can additionally utilize the 4 bits of the second level to perform the probability model update of the CABAC probability estimator. For carrying out this update, a state transition lookup-table can be designed that does the same state transitions as the original table, but using the complexity-scalable two-level representation of states. The original state transition table consists of two times 63 elements. For each input state, it contains two output states. When using the complexity-scalable representation, the size of the state transition table does not exceed two times 128 elements which is an acceptable increase of table size. This increase depends on how many bits are used to represent the refinement index and to exactly emulate the behavior of the CABAC probability estimator, four bits are needed. However, a different probability estimator could be used, that can operate on a reduced set of CABAC states such that for each pipe index no more than 8 states are allowed. Therefore memory consumption can be matched to the given complexity level of the coding process by adapting the number of bits used to represent the refinement index. Compared to the internal state of model probabilities with CABAC—where 64 probability state indices exist—the usage of table lookups to map model probabilities to a specific PIPE code is avoided and no further conversion is necessitated.

Next, a complexity-scalable context model updating in accordance with an embodiment is described.

For updating a context model, its probability state index may be updated based on one or more previously coded bins. In the HE-PIPE setup, this update is done after encoding or decoding of each bin. Conversely, in the LC-PIPE setup, this update may never be done.

However, it is possible to do an update of context models in a complexity-scalable way. That is, the decision whether to update a context model or not may be based on various aspects. E.g., a coder setup could do no updates for particular context models only like e.g. the context models of syntax element coeff_significant_flag, and do updates for all other context models.

In other words, the selector 402 could be configured to, for symbols of each of a number of predetermined symbol types, perform the selection among the entropy decoders 322 depending on a respective probability model associated the respective predetermined symbol such that the number of predetermined symbol types is lower in the low complexity mode than compared to the high-efficiency mode Furthermore, criteria for controlling whether to update a context model or not could be, e.g. the size of a bitstream packet, the number of bins decoded so far, or the update is done only after coding a particular fixed or variable number of bins for a context model.

With this scheme for deciding whether to update context models or not, complexity-scalable context model updating can be implemented. It allows for increasing or decreasing the portion of bins in a bitstream for which context model updates are done. The higher the number of context model updates, the better is the coding efficiency and the higher the computational complexity. Thus, complexity-scalable context model updating can be achieved with the described scheme.

In an embodiment, the context model update is done for bins of all syntax elements except the syntax elements coeff_significant_flag, coeff_abs_greater1, and coeff_abs_greater2.

In a further embodiment, the context model update is done for bins of the syntax elements coeff_significant_flag, coeff_abs_greater1, and coeff_abs_greater2 only.

In a further embodiment, the context model update is done for all context models when encoding or decoding of a slice starts. After a particular predefined number of transform blocks being processed, context model update is disabled for all context models until the end of the slice is reached.

For example, the selector 402 may be configured to, for symbols of a predetermined symbol type, perform the selection among the entropy decoders 322 depending on a probability model associated with the predetermined symbol type along with or without updating the associated probability model, such that a length of a learning phase of the sequence of symbols over which the selection for the symbols of the predetermined symbol type is performed along with the update, is shorter in the low complexity mode than compared to the high-efficiency mode.

A further embodiment is identical to the previously described embodiment, but it uses the complexity-scalable representation of the internal state of context models in a way, such that one table stores the "first part" (valMps and pipeIdx) of all context models and a second table stores the "second part" (refineIdx) of all context models. At the point, where the context model updating is disabled for all context models (as described in the previous embodiment), the table storing the "second part" is not needed any longer and can be discarded.

Next, context model updating for a sequence of bins in accordance with an embodiment is described.

In the LC-PIPE configuration, the bins of syntax elements of type coeff_significant_flag, coeff_abs_greater1, and coeff_abs_greater2 are grouped into subsets. For each subset, a single context model is used to encode its bins. In this case, a context model update may be done after coding of a fixed number of bins of this sequence. This is denoted multi-bin update in the following. However, this update may differ from the update using only the last coded bin and the internal state of the context model. E.g., for each bin that was coded, one context model update step is conducted.

In the following, examples are given for the encoding of an exemplary subset consisting of 8 bins. The letter 'b' denotes the decoding of a bin and the letter 'u' denotes the update of the context model. In the LC-PIPE case only the bin decoding is done without doing context model updates:
b b b b b b b b In the HE-PIPE case, after decoding of each bin, a context model update is done:
b u b u b u b u b u b u b u b u In order to somewhat decrease the complexity, the context model update may be done after a sequence of bins (in this example after each 4 bins, the updates of these 4 bins are done):
b bb b u u u u b b b b u u u u That is, the selector 402 may be configured to, for symbols of a predetermined symbol type, perform the selection among the entropy decoders 322 depending on a probability model associated with the predetermined symbol type along with or without updating the associated probability model such that a frequency at which the selection for the symbols of the predetermined symbol type is performed along with the update, is lower in the low complexity mode than compared to the high-efficiency mode.

In this case, after the decoding of 4 bins, 4 update steps follow based on the 4 bins just-decoded. Note that these four update steps can be conducted in one single step by using a lookup special lookup-table. This lookup table stores for each possible combination of 4 bins and each possible internal state of the context model the resulting new state after the four conventional update steps.

In a certain mode, the multi-bin update is used for syntax element coeff_significant_flag. For bins of all other syntax elements, no context model update is used. The number of bins that are coded before a multi-bin update step is done is set to n. When the number of bins of the set is not divisible by n, 1 to n−1 bins remain at the end of the subset after the last multi-bin update. For each of these bins, a conventional single-bin update is done after coding all of these bins. The number n may be any positive number greater than 1. Another mode could be identical to the previous mode, except that multi-bin update is done for arbitrary combinations of coeff_significant_flag, coeff_abs_greater1 and coeff_abs_greater2 (instead of coeff_significant_flag only). Thus, this mode would be more complex than the other. All other syntax elements (where multi-bin update is not used) could be divided into two disjoint subsets where for one of the subsets, single bin update is used and for the other subset no context model update is used. Any possible disjoint subsets are valid (including the empty subset).

In an alternative embodiment, the multi-bin update could be based on the last m bins only that are coded immediately before the multi-bin update step. m may be any natural number smaller than n. Thus, decoding could be done like:
b b b b u u b b b b u u b b b b u u b b b b . . .
with n=4 and m=2.

That is, the selector 402 may be configured to, for symbols of a predetermined symbol type, perform the selection among the entropy decoders 322 depending on a probability model associated with the predetermined symbol type, along with updating the associated probability model every n-th symbol of the predetermined type based on m most recent symbols of the predetermined symbol type such that the ratio n/m is higher in the low complexity mode than compared to the high-efficiency mode.

In a further embodiment, for syntax element coeff_significant_flag, the context modeling scheme using a local template as described above for the HE-PIPE configuration may be used to assign context models to bins of the syntax element. However, for these bins, no context model update is used.

Further, the selector 402 may be configured to, for symbols of a predetermined symbol type, select one of a number of contexts depending on a number of previously retrieved symbols of the sequence of symbols and perform the selection among the entropy decoders 322 depending on a probability model associated with the selected context, such that the number of contexts, and/or the number of previously retrieved symbols, is lower in the low complexity mode than compared to the high-efficiency mode.

Probability Model Initialization Using 8 Bit Initialization Values

This section describes the initialization process of the complexity-scalable internal state of probability models using a so-called 8 bit initialization value instead of two 8 bit values as is the case in the state-of-the-art video coding standard H.265/AVC. It consists of two parts which are comparable to the initialization value pairs used for probability models in CABAC of H.264/AVC. The two parts represent the two parameters of a linear equation to compute the initial state of a probability model, representing a particular probability (e.g. in form of a PIPE index) from a QP:

The first part describes the slope and it exploits the dependency of the internal state in respect to the quantization parameter (QP) that is used during encoding or decoding.

The second part defines a PIPE index at a given QP as well as the valMps.

Two different modes are available to initialize a probability model using the given initialization value. The first mode is denoted QP-independent initialization. It only uses the PIPE index and valMps defined in the second part of the initialization value for all QPs. This is identical to the case where the slope equals 0. The second mode is denoted QP-dependent initialization and it additionally uses the slope of the first part of the initialization value to alter the PIPE index and to define the refinement index. The two parts of an 8 bit initialization value is illustrated as follows:

| First Part | | | | Second Part | | | |
|---|---|---|---|---|---|---|---|
| $b_7$ | $b_6$ | $b_5$ | $b_4$ | $b_3$ | $b_2$ | $b_1$ | $b_0$ |
| Slope Index | | | | PIPE Probability Index | | | |

It consists of two 4 bit parts. The first part contains an index that points to 1 out of 16 different predefined slopes that are stored in an array. The predefined slopes consist of 7 negative slopes (slope index 0-6), one slope that equals zero (slope index 7) and 8 positive slopes (slope index 8-15). The slopes are depicted in Table C.

TABLE C

| Slope Index | 0 | 1 | 2 | 3 | 4 | 5 | 6 | 7 |
|---|---|---|---|---|---|---|---|---|
| Slope Value | −239 | −143 | −85 | −51 | −31 | −19 | −11 | 0 |
| Slope Index | 8 | 9 | 10 | 11 | 12 | 13 | 14 | 15 |
| Slope Value | 11 | 19 | 31 | 51 | 85 | 143 | 239 | 399 |

All values are scaled by a factor of 256 to avoid the usage of floating point operations. The second part is the PIPE index which embodies the ascending probability of valMps=1 between the probability interval p=0 and p=1. In other words, PIPE coder n has to operate at a higher model probability than PIPE coder n−1. For every probability model one PIPE probability index is available and it identifies the PIPE coder whose probability interval contains the probability of $p_{valMPs}$=1 for QP=26.

TABLE D

Mapping of the second part of the initialization value to PIPE coders and valMps: UR = unary-to-rice-code, TB = three-bin-code, BP = bin-pipe-code, EP = equal probability (uncoded)

| PIPE Probability Index | 0 | 1 | 2 | 3 | 4 | 5 | 6 | 7 |
|---|---|---|---|---|---|---|---|---|
| PIPE Coder | UR5 | UR4 | UR3 | UR2 | TB | BP2 | BP3 | EP |
| MPS | 0 | 0 | 0 | 0 | 0 | 0 | 0 | 0 |
| PIPE Probability Index | 8 | 9 | 10 | 11 | 12 | 13 | 14 | 15 |
| PIPE Coder | EP | BP3 | BP2 | TB | UR2 | UR3 | UR4 | UR5 |
| MPS | 1 | 1 | 1 | 1 | 1 | 1 | 1 | 1 |

The QP and the 8 bit initialization value are necessitated to calculate the initialization of the internal state of the probability models by computing a simple linear equation in the form of y=m*(QP−QPref)+256*b. Note m defines the slope that is taken from Table C by using the slope index (the first part of the 8 bit initialization value) and b denotes the PIPE coder at QPref=26 (the second part of the 8 bit initialization value: "PIPE Probability Index"). Then, valMPS is 1 and the pipeIdx equals (y−2048)>>8 if y is greater than 2047. Otherwise, valMPS is 0 and pipeIdx equals (2047−y)>>8. The refinement index equals (((y−2048) & 255)*numStates)>>8 if valMPS equals 1. Otherwise, the refinement index equals (((2047−y) & 255)*numStates)>>8. In both cases, numStates equals the number of CABAC states of the pipeIdx as depicted in Table B.

The above scheme can not only be used in combination with PIPE coders, but also in connection with the above-mentioned CABAC schemes. In the absence of PIPE, the number of CABAC states, i.e. the probability states between which the state transition in the probability update is performed (pState_current[bin]), per PIPE Idx (i.e. the respective most significant bits of pState_current[bin]) is then only a set of parameters which realizes, in fact, a piece-wise linear interpolation of the CABAC state depending on the QP. Furthermore, this piece-wise linear interpolation can also virtually be disabled in the case where the parameter numStates uses the same value for all PIPE Idx. For example, setting numStates to 8 for all cases yields a total of 16*8 states and the computation of the refinement index simplifies to ((y−2048) & 255)>>5 for valMPS equal 1 or ((2047−y)&255)>>5 for valMPS equal 0. For this case, mapping the representation using valMPS, PIPE idx, and refinement idx back to the representation used by the original CABAC of H.264/AVC is very simple. The CABAC state is given as (PIPE Idx<<3)+refinement Idx. This aspect is described further below with regard to FIG. 16.

Unless the slope of the 8 bit initialization value equals zero or unless the QP equals 26 it is necessitated to compute the internal state by employing the linear equation with the QP of the encoding or decoding process. In the case of the slope equaling to zero or that the QP of the current coding process equals 26 the second part of 8 bit initialization value can be used directly for initializing the internal state of a probability model. Otherwise the decimal part of the resulting internal state can be further exploited to determine a refinement index in high efficiency coding applications by linear interpolation between the limits of the specific PIPE coder. In this embodiment the linear interpolation is executed by simply multiplying the decimal part with the total number of refinement indices available for the current PIPE coder and mapping the result to the closest integer refinement index.

The process of initialization of the internal state of the probability models could be varied with regard to the number of PIPE probability index states. In particular, the double occurrence of the equal probable mode using PIPE coder El, i.e. the use of two different PIPE indices to distinguish between MPS being 1 or 0, could be avoided as follows. Again, the process could be invoked during the start of parsing of the slice data, and the input of this process could an 8 bit initialization value as depicted in Table E, which would be, for example, transmitted within the bit stream for every context model to be initialized.

TABLE E

Setup of the 8 bits of initValue for a probability model

| | First 4 bits | | | | Last 4 bits | | | |
|---|---|---|---|---|---|---|---|---|
| initValue bits | $b_7$ | $b_6$ | $b_5$ | $b_4$ | $b_3$ | $b_2$ | $b_1$ | $b_0$ |
| Variable | slopeIdx | | | | propIdx | | | |

The first 4 bits define a slope index and are retrieved by masking the bits $b4$-$b7$. For every slope index a slope (m) is specified and displayed in Table F.

TABLE F

Values of variable m for slopeIdx

| slopeIdx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| m | −239 | −143 | −85 | −51 | −31 | −19 | −11 | 0 | 11 | 19 | 31 | 51 | 85 | 143 | 239 | 399 |

Bits $b0$-$b3$, the last 4 bits of the 8 bit initialization value, identify the probIdx and describe the probability at a predefined QP. probIdx 0 indicates the highest probability for symbols with value 0 and respectively, probIdx 14 indicates the highest probability for symbols with value 1. Table G shows for each probIdx the corresponding pipeCoder and its valMps.

TABLE G

Mapping of the last 4 bits part of the initialization value to PIPE coders and valMps: UR = unary-to-rice-code, TB = three-bin-code, BP = bin-pipe-code, EP = equal probability (uncoded)

| probIdx | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| pipeCoder | UR5 | UR4 | UR3 | UR2 | TBC | BP2 | BP3 | EP | BP3 | BP2 | TBC | UR2 | UR3 | UR4 | UR5 |
| valMPs | 0 | 0 | 0 | 0 | 0 | 0 | 0 | 0 | 1 | 1 | 1 | 1 | 1 | 1 | 1 |

With both values the calculation of the internal state could be done by using a linear equation like $y=m*x+256*b$, where m denotes the slope, x denotes the QP of the current slice and b is derived from the probIdx as shown in the following description. All values in this process are scaled by a factor of 256 to avoid the usage of floating point operations. The output (y) of this process represents the internal state of the probability model at the current QP and is stored in a 8 bit memory. As shown in G the internal state consists of the valMPs, the pipeIdx and the refineIdx.

TABLE H

Setup of the internal state of a probability model

| | First 4 bits | | | | Last 4 bits | | | |
|---|---|---|---|---|---|---|---|---|
| initValue bits | $b_7$ | $b_6$ | $b_5$ | $b_4$ | $b_3$ | $b_2$ | $b_1$ | $b_0$ |
| Variable | valMps | pipeIdx | | | refineIdx | | | |

The assignment of the refineIdx and pipeIdx is similar to the internal state of the CABAC probability models (pStateCtx) and is presented in H.

TABLE I

Assignement of pipeIdx, refineIdx and pStateCtx

| pipeIdx | 0 | | | 1 | | | | | | 2 | | | | |  |
|---|---|---|---|---|---|---|---|---|---|---|---|---|---|---|---|
| refineIdx | 0 | 1 | 2 | 0 | 1 | 2 | 3 | 4 | 5 | 6 | 0 | 1 | 2 | 3 | 4 |
| pStateCtx | 0 | 1 | 2 | 3 | 4 | 5 | 6 | 7 | 8 | 9 | 10 | 11 | 12 | 13 | 14 |

| pipeIdx | 3 | | | | | | | 4 | | | | | | | |
|---|---|---|---|---|---|---|---|---|---|---|---|---|---|---|---|
| refineIdx | 0 | 1 | 2 | 3 | 4 | 5 | 6 | 0 | 1 | 2 | 3 | 4 | 5 | 6 | 7 | 8 | 9 |
| pStateCtx | 15 | 16 | 17 | 18 | 19 | 20 | 21 | 22 | 23 | 24 | 25 | 26 | 27 | 28 | 29 | 30 | 31 |

| pipeIdx | 5 |
|---|---|

| refineIdx | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| pStateCtx | 32 | 33 | 34 | 35 | 36 | 37 | 38 | 39 | 40 | 41 | 42 | 43 | 44 | 45 |

| pipeIdx | 6 | | | | | | | | | | | | | | | 7 |
|---|---|---|---|---|---|---|---|---|---|---|---|---|---|---|---|---|

| refineIdx | 0 | 1 | 2 | 3 | 4 | 5 | 6 | 7 | 8 | 9 | 10 | 11 | 12 | 13 | 14 | 15 | 0 |
|---|---|---|---|---|---|---|---|---|---|---|---|---|---|---|---|---|---|
| pStateCtx | 46 | 47 | 48 | 49 | 50 | 51 | 52 | 53 | 54 | 55 | 56 | 57 | 58 | 59 | 60 | 61 | 62 |

In an embodiment the probIdx is defined at QP26. Based on the 8 bit initialization value the internal state (valMps, pipeIdx and refineIdx) of a probability model is processed as described in the following pseudo-code:

```
n = (probIdx <<8) – m * 26
fullCtxState = max(0, min (3839, (m * max (0, min (51, SliceQP_y)
) ) ) + n + 128)
remCtxState = fullCtxState & 255
preCtxState = fullCtxState >> 8
if (preCtxState < 8) {
pipeIdx = 7 – preCtxState
valMPS = 0
} else {
pipeIdx = preCtxState – 8
valMPS = 1
}
offset = { 3, 7, 5, 7, 10, 14, 16, 1 }
if (pipeIdx = = 0 ) {
if (remCtxState <= 127)
remCtxState = 127 – remCtxState
else
remCtxState = remCtxState – 128
refineIdx = ( (remCtxState 1) * offset) >> 8
} else {
if (valMPS = = 0)
remCtxState = 255 – remCtxState
refineIdx = (remCtxState * offset[pipeIdx] ) >> 8
}
```

As shown in the pseudo code the refineIdx is calculated by linearly interpolating between the interval of the pipeIdx and quantizing the result to the corresponding refineIdx. The offset specifies the total number of refineIdx for each pipeIdx. The interval [7, 8) of fullCtxState/256 is divided in half The interval [7, 7.5) is mapped to pipeIdx=0 and valMps=0 and the interval [7.5, 8) is mapped to pipeIdx=0 and valMps=1. FIG. 16 depicts the process of deriving the internal state and displays the mapping of fullCtxState/256 to pStateCtx.

Note the slope indicates the dependency of the probIdx and the QP. If the slopeIdx of the 8 bit initialization value equals 7 the resulting internal state of the probability model is the same for all slice QPs—hence the initialization process of the internal state is independent from the current QP of the slice.

That is, selector 402 may initialize the pipe indices to be used in decoding the following portion of the datastream such as the whole stream or the next slice, using the syntax element indicating the quantization step size QP used in order to quantize the data of this portion, such as the transform coefficient levels contained therein using this syntax element as an index into a table which may be common for both modes, LC and HE. The table such as table D may comprise pipe indices for each symbol type, for a respective reference QPref, or other data for each symbol type. Depending on the actual QP of the current portion, the selector may compute a pipe index value using the respective table entry a indexed by the actual QP and QP itself, such as by multiplication a with (QP-QPref). The only difference in LC and HE mode: The selector computes the result merely at a lower accuracy in case of LC compared to HE mode. The selector may, for example, merely use the integer part of the computation result. In HE mode, the higher accuracy remainder, such as the fractional part, is used to select one of available refinement indices for the respective pipe index as indicated by the lower accuracy or integer part. The refinement index is used in HE mode (in portentially more seldomly also in LC mode) in order to perform the probability adaptation such as by using the above-mentioned table walk. When leaving the available indices for the current pipe index at the higher bound, then the higher pipe index is selected next with minimizing the refinement index. When leaving the available indices for the current pipe index at the lower bound, then the next lower pipe index is selected next with maximizing the refinement index to the maximum available for the new pipe index. The pipe index along with the refinement index define the probability state, but for the selection among the partial streams, the selector merely uses the pipe index. The refinement index merely serves for tracking the probability more closely, or in a finer accuracy.

Figure 12:
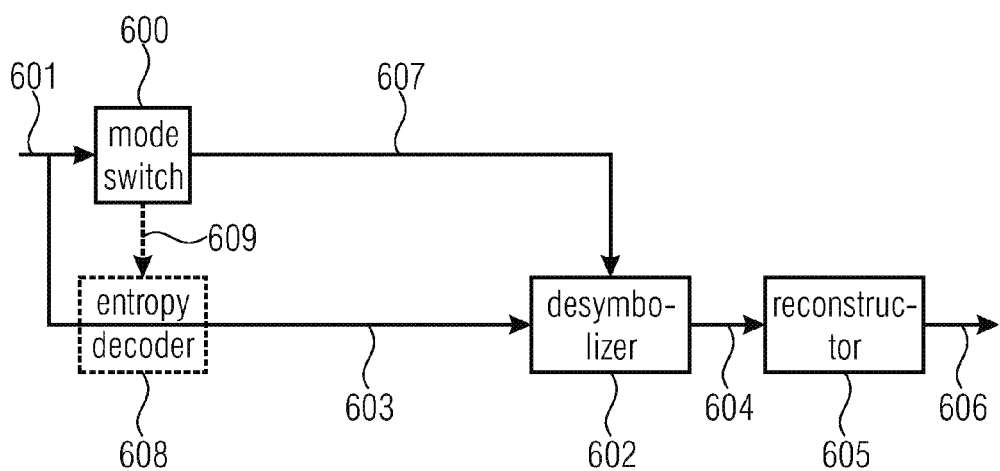
FIG. 12 shows a decoder supporting mode switching according to a further embodiment.

The above discussion also showed, however, that a complexity scalability may be achieved independent from the PIPE coding concept of FIG. 7-10 or CABAC, using a decoder as shown in FIG. 12. The Decoder of FIG. 12 is for decoding a data stream 601 into which media data is coded, and comprises a mode switch 600 configured to activate a low-complexity mode or a high efficiency mode depending on the data stream 601, as well as a desymbolizer 602 configured to desymbolize a sequence 603 of symbols obtained—either directly or by entropy decoding, for example—from the data stream 601 to obtain integer-valued syntax elements 604 using a mapping function controllable by a control parameter, for mapping a domain of symbol sequence words to a co-domain of the integer-valued syntax elements. A reconstructor 605 is configured to reconstruct the media data 606 based on the integer-valued syntax elements. The desymbolizer 602 is configured to perform the desymbolization such that the control parameter varies in accordance with the data stream at a first rate in case of the high-efficiency mode being activated and the control parameter is constant irrespective of the data stream or changes depending on the data stream, but at a second rate lower than the first rate in case of the low-complexity mode being activated—as it is illustrated by arrow 607. For example, the control parameter may vary in accordance with previously desymbolized symbols.

Figure 19:
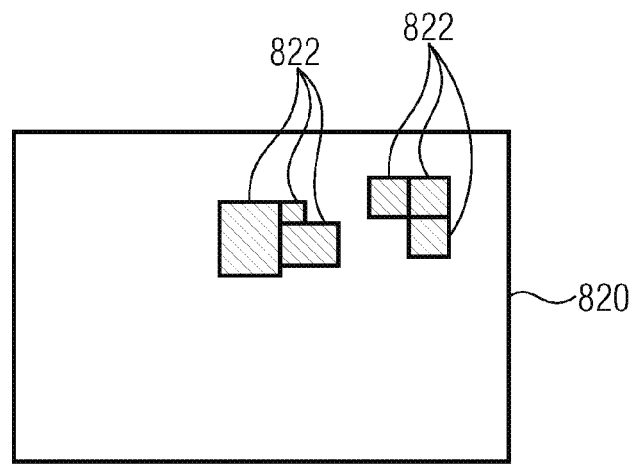
FIG. 19 schematically illustrates a merge concept in accordance with an embodiment.

Some of the above embodiments made use of the aspect of FIG. 12. The syntax elements coeff_abs_minus3 and MVD within sequence 327 were, for example, binarized in desymbolizer 314 depending on the mode selected as indicated by 407, and the reconstructor 605 used these syntax elements for reconstruction. Obviously, both aspects of FIGS. 11 and 19 are readily combinable, but the aspect of FIG. 12 may also be combined with other coding environments.

See, for example, the motion vector difference coding denoted above. The desymbolizer 602 may be configured such that the mapping function uses a truncated unary code to perform the mapping within a first interval of the domain of integer-valued syntax elements below a cutoff value and a combination of a prefix in form of the truncated unary code for the cutoff value and a suffix in form of a VLC codeword within a second interval of the domain of integer-valued syntax elements inclusive and above the cutoff value, wherein the decoder may comprise an entropy decoder 608 configured to derive a number of first bins of the truncated unary code from the data stream 601 using entropy decoding with varying probability estimation and a number of second bins of the VLC codeword using a constant equi-probability bypass mode. In HE mode, the entropy coding may be more complex than in LC coding as illustrated by arrow 609. That is, context-adaptivity and/or probability adaptation may be applied in HE mode and suppressed in LC mode, or the complexity may be scaled in other terms, as set out above with respect to the various embodiments.

Figure 13:
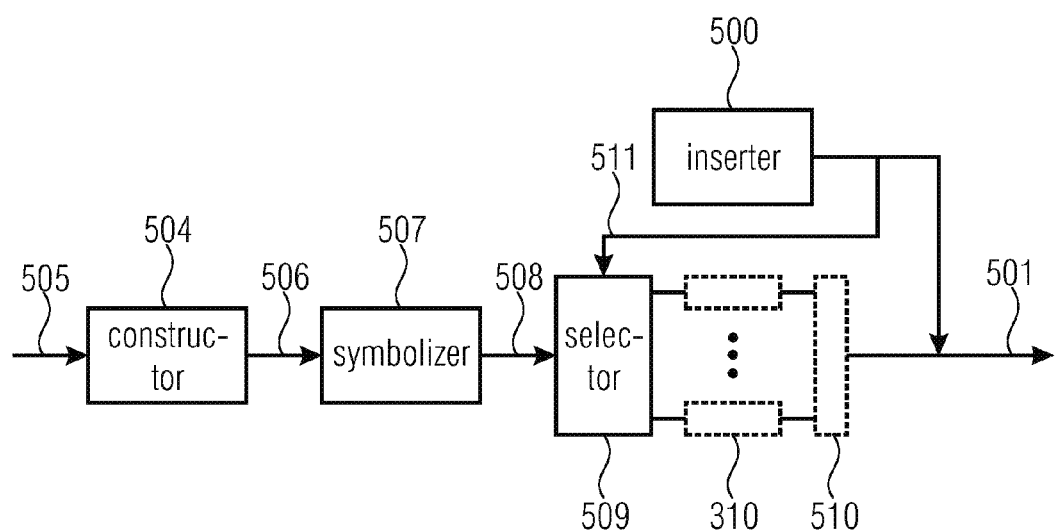
FIG. 13 shows an encoder fitting to decoder of FIG. 11 according to an embodiment.

An encoder fitting to decoder of FIG. 11, for encoding media data into a data stream is shown in FIG. 13. It may comprise an inserter 500 configured to signal within the data stream 501 an activation of a low-complexity mode or a high efficiency mode, a constructor 504 configured to precode the media data 505 into a sequence 506 of syntax elements, a symbolizer 507 configured to symbolize the sequence 506 of syntax elements into a sequence 508 of symbols, a plurality of entropy encoders 310 each of which is configured to convert partial sequences of symbols into codewords of the data stream, and a selector 502 configured to forward each symbol of the sequence 508 of symbols to a selected one of the plurality of entropy encoders 310, wherein the selector 502 is configured to perform the selection depending on the activated one of the low complexity mode and the high-efficiency mode as illustrated by arrow 511. An interleaver 510 may be optionally provided for interleaving the codewords of the encoders 310.

Figure 14:
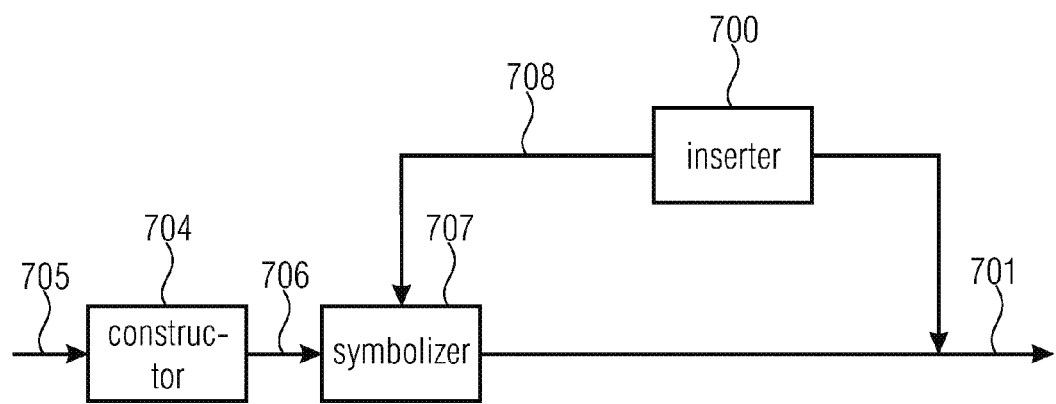
FIG. 14 shows an encoder fitting to decoder of FIG. 12 according to an embodiment.

An encoder fitting to decoder of FIG. 12, for encoding media data into a data stream is shown in FIG. 14 as comprising an inserter 700 configured to signal within the data stream 701 an activation of a low-complexity mode or a high efficiency mode, a constructor 704 configured to precode the media data 705 into a sequence 706 of syntax elements comprising an integer-valued syntax element, and a symbolizer 707 configured to symbolize the integer-valued syntax element using a mapping function controllable by a control parameter, for mapping a domain of integer-valued syntax elements to a co-domain of the symbol sequence words, wherein the symbolizer 707 is configured to perform the symbolization such that the control parameter varies in accordance with the data stream at a first rate in case of the high-efficiency mode being activated and the control parameter is constant irrespective of the data stream or changes depending on the data stream, but at a second rate lower than the first rate in case of the low-complexity mode being activated as illustrated by arrow 708. The symbolization result is coded into the datastream 701.

Again, it should be mentioned that the embodiment of FIG. 14 is easily transferable onto the above-mentioned context-adaptive binary arithmetic en/decoding embodiment: selector 509 and entropy encoders 310 would condense into a context-adaptive binary arithmetic encoder which would output the datastream 401 directly and select the context for a bin currently to be derived from the datastream. This is especially true for context adaptivity and/or probability adaptivity. Both functionalities/adaptivities may be switched off, or designed more relaxed, during low complexity mode.

It has briefly been noted above that the mode switching ability explained with respect to some of the above embodiments may, in accordance with alternative embodiments, be left away. To make this clear, reference is made to FIG. 16, which summarizes the above description insofar as merely the removal of the mode switching ability differentiates the embodiment of FIG. 16 from the above embodiments. Moreover, the following description will reveal the advantages resulting from initializing the probability estimates of the contexts using less accurate parameters for slope and offset compared to, for example, H.264.

In particular, FIG. 16 shows a decoder for decoding a video 405 from a data stream 401 to which horizontal and vertical components of motion vector differences are coded using binarizations of the horizontal and vertical components, the binarizations equaling a truncated unary code of the horizontal and vertical components, respectively, within a first interval of the domain of the horizontal and vertical components below a cutoff value, and a combination of a prefix in form of the truncated unary code. The cutoff value and a suffix in form of an exponential Golomb code of the horizontal and vertical components, respectively, within a second interval of the domain of the horizontal and vertical components inclusive and above the cutoff value, wherein the cutoff value is 2 and the exponential Golomb code has an order of 1. The decoder comprises an entropy decoder 409 configured to, for the horizontal and vertical components of the motion vector differences, derive the truncated unary code from the data stream using context-adaptive binary entropy decoding with exactly one context per bin position of the truncated unary code, which is common for the horizontal and vertical components of the motion vector differences, and the exponential Golomb code using a constant equi-probability bypass mode to obtain the binarizations of the motion vector differences. To be more precise, as described above the entropy decoder 409 may be configured to derive the number of bins 326 of the binarizations from the data stream 401 using binary entropy decoding such as the above-mentioned CABAC scheme, or binary PIPE decoding, i.e. using the construction involving several parallel operating entropy decoders 322 along with a respective selector/assignerA desymbolizer 314 debinarizes the binarizations of the motion vector difference syntax elements to obtain integer values of the horizontal and vertical components of the motion vector differences, and a reconstructor 404 reconstructs the video based on the integer values of the horizontal and vertical components of the motion vector differences.

Figure 18:
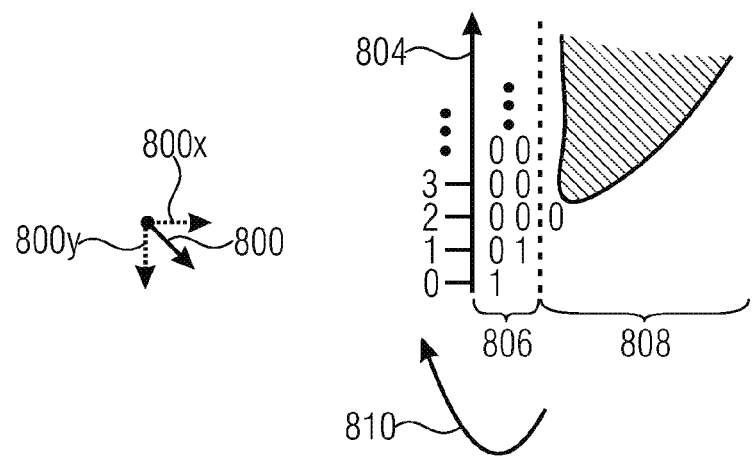
FIG. 18 schematically shows a motion vector difference binarization in accordance with an embodiment of the present invention.

In order to explain this in more detail, reference is briefly made to FIG. 18. 800 representatively shows one motion vector difference, i.e. a vector representing a prediction residual between a predicted motion vector and an actual/reconstructed motion vector. The horizontal and vertical components 802x and 802y are also illustrated. They might be transmitted in units of pixel positions, i.e. pixel pitch, or sub-pel positions such as the half of the pixel pitch or a fourth thereof or the like. The horizontal and vertical components 802, are integer valued. Their domain reaches from zero to infinity. The sign value may be handled separately and is not considered here further. In other words, the description outlined herein focuses on the magnitude of the motion vector differences 802x, y. The domain is illustrated at 804. On the right-hand side of the domain axis 804, FIG. 19 illustrates, associated with the possible values of component 802x,y vertically arranged upon each other, the binarizations onto which the respective possible value is mapped (binarized). As can be seen, below the cutoff value of 2, merely the truncated unary code 806 occurs, whereas the binarization has, as a suffix, also the exponential Golomb code of order 808 from possible values equal to or greater than the cutoff value of 2 on in order to continue the binarization for the reminder of the integer value above cutoff value minus 1. For all the bins, merely two contexts are provided: one for the first bin position of binarizations of horizontal and vertical components 802x,y, and a further one for the second bin position of the truncated unary code 806 of both horizontal and vertical components 802x,y. For the bin position of the exponential Golomb code 808, the equi-probability bypass mode is used by the entropy decoder 409. That is, both bin values are assumed to occur equally probable. The probability estimation for these bins is fixed. Compared thereto, the probability estimation associated with the just-mentioned two contexts of the bins of the truncated unary code 806 is adapted continuously during decoding.

Before describing in more detail, as to how the entropy decoder 409 could, in accordance with the above description, be implemented in order to perform the just-mentioned tasks, the description now focuses on a possible implementation of the reconstructor 404 which uses the motion vector differences 800 and the integer values thereof as obtained by the desymbolizor 314 by re-binarizing the bins of codes 106 and 108 with the re-binarization being illustrated in FIG. 18 using arrow 810. In particular, the reconstructor 404 may, as described above, retrieve from the data stream 401 information concerning a subdivision of a currently reconstructed picture into blocks among which at least some are subject to motion-compensated prediction. FIG. 19 shows a picture to be reconstructed representatively at 820 and blocks of the just-mentioned subdivision of picture 120 for which motion-compensated prediction is used to predict the picture content therein at 822. As described with respect to FIGS. 2A-2C, there are different possibilities for the subdivision and the sizes of the blocks 122. In order to avoid a transmission for a motion vector difference 800 for each of these blocks 122, reconstructor 404 may exploit a merge concept according to which the data stream additionally transmits merge information in addition to the subdivision information or, in the absence of subdivision information, in addition to the fact that the subdivision is fixed. The merge information signals to reconstructor 404 as to which of blocks 822 form a merge groups. By this measure, it is possible for reconstructor 404 to apply a certain motion vector difference 800 to a whole merge group of blocks 822. Naturally, at the encoding side, the transmission of the merge information is subject to a tradeoff between subdivision transmission overhead (if present), the merge information transmission overhead and the motion vector difference transmission overhead which decreases with increasing size of the merge groups. On the other hand, increasing the number of blocks per merge group reduces the adaptation of the motion vector difference for this merge group to the actual needs of the individual blocks of the respective merge group thereby yielding less accurate motion-compensated predictions of the motion vector differences of these blocks and necessitating a higher transmission overhead for transmitting the prediction residual in form of, for example, transform coefficient level. Accordingly, a tradeoff is found on the encoding side in an appropriate manner. In any case, however, the merge concept results in the motion vector differences for the merge groups showing less spatial inter-correlation. See, for example, FIG. 19 which illustrates by shading a membership to a certain merge group. Obviously, the actual motion of the picture content in these blocks has been so similar that the encoding side decided to merge the respective blocks. The correlation with the motion of the picture content in other merge groups, however, is low. Accordingly, the restriction to use merely one context per bin of the truncated unary code 806 does not negatively impact the entropy coding efficiency as the merge concept already accommodates for the spatial inter-correlation between neighboring picture content motion sufficiently. The context may merely be selected based on the fact that the bin is part of the binarization of a motion vector difference component 802, and the bin position which is either 1 or 2 due to the cutoff value being two. Accordingly, other already decoded bins/syntax elements/mvd components 802, do not influence the context selection.

Likewise, the reconstructor 404 may be configured to reduce the information content to be transferred by way of the motion vector differences further (beyond the spatial and/or temporal prediction of motion vectors) by using a multi-hypothesis prediction concept according to which, firstly, a list of motion vector predictors is generated for each block or merge group, with then, explicitly or implicitly transmitting within the data stream information on the index of the predictor to be actually used to predict the motion vector difference. See, for example, the non-shaded block 122 in FIG. 20. The reconstructor 404 may provide different predictors for the motion vector of this block such as by predicting the motion vector spatially such as from the left, from the top, a combination of both and so forth, and temporally predicting the motion vector from the motion vector of a co-located portion of a previously-decoded picture of the video and further combinations of the aforementioned predictors. These predictors are sorted by reconstructor 404 in a predictable manner which is forecastable at the encoding side. Some information is conveyed to this end within the datastream and used by the reconstructor. That is, some hint is contained in the data stream, as to which predictor out of this ordered list of predictors shall be actually used as a predictor for the motion vector of this block. This index may be transmitted within the data stream for this block explicitly. However, it is also possible that the index is firstly predicted and then merely a prediction of that transmitted. Other possibilities exist as well. In any case, the just-mentioned prediction scheme enables a very accurate prediction of the motion vector of the current block and accordingly, the information content requirement imposed into the motion vector difference is reduced. Accordingly, the restriction of the context-adaptive entropy coding onto merely two bins of the truncated unary code and a reduction of the cutoff value down to 2 as described with respect to FIG. 18, as well as the selection of the order of the exponential Golomb code to be 1, does not negatively affect the coding efficiency since the motion vector differences show, due to the high prediction efficiency, a frequency histogram according to which higher values of the motion vector difference components 802x,y are less frequently visited. Even the omission of any distinguishing between horizontal and vertical components fits to the efficient prediction, as the prediction tends to operate equally well in both directions of the prediction accuracy is high.

It is essential to note that in the above description, the whole details provided with the FIGS. 1-15 are also transferable onto the entities shown in FIG. 16 such as, for example, as far as the functionality of the desymbolizer 314, the reconstructor 404 and the entropy decoder 409 is concerned. Nevertheless, for the sake of completeness, some of these details are again outlined below.

Figure 20:
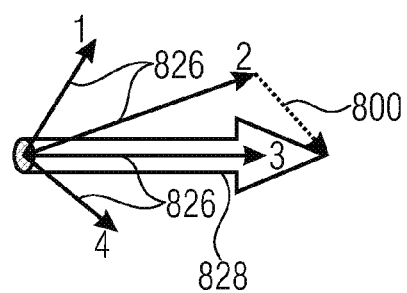
FIG. 20 schematically illustrates a motion vector prediction scheme in accordance with an embodiment.

For a better understanding of the just-outlined prediction scheme, see FIG. 20. As just-described, the constructor 404 may obtain different predictors for a current block 822 or a current merge group of blocks, with these predictors being shown by solid-line vectors 824. The predictors may be obtained by spatial and/or temporal prediction wherein, additionally, arithmetic mean operations or the like may be used so that the individual predictors may have been obtained by reconstructor 404 in a way so that the same correlate with each other. Independent from the way vectors 826 have been obtained, reconstructor 404 sequentializes or sorts these predictors 126 into an ordered list. This is illustrated by numbers 1 to 4 in FIG. 21. It is advantageous if the sorting process is uniquely determinable so that encoder and decoder may operate synchronously. Then, the just-mentioned index may be obtained by reconstructor 404 for the current block, or merge group, out of the data stream, explicitly or implicitly. For example, the second predictor "2" may have been selected and the reconstructor 404 adds the motion vector difference 800 to this selected predictor 126, thereby yielding the finally reconstructed motion vector 128 which is then used to predict, by motion-compensated prediction, the content of the current block/merge group. In case of the merge group, it would be possible that the reconstructor 404 comprises further motion vector differences provided for blocks of the merge group, in order to further refine the motion vector 128 with respect to the individual blocks of the merge group.

Thus, proceeding further with the description of the implementations of the entities shown in FIG. 16, it may be that entropy decoder 409 is configured to derive the truncated unary code 806 from the data stream 401 using binary arithmetic decoding or binary PIPE coding. Both concepts have been described above. Further, the entropy decoder 409 may be configured to use different contexts for the two bin positions of the truncated unary code 806 or, alternatively, even the same context for both bins. The entropy decoder 409 could be configured to perform a probability state update. The entropy decoder 409 could do this by, for a bin currently derived out of the truncated unary code 806, transitioning from a current probability state associated with the context selected for the bin currently derived, to a new probability state depending on the bin currently derived. See above tables Next_State_LPS and Next_State_MPS the table look-up with respect to which is performed by the entropy decoder in addition to the other steps 0 to 5 listed above. In the above discussion, the current probability state has been mentioned by pState_current. It is defined for the respective context of interest. The entropy decoder 409 may be configured to binary arithmetically decode a bin currently to be derived out of the truncated unary code 806 by quantizing a current probability interval width value, i.e. R, representing a current probability interval to obtain a probability interval index, q_index, and performing an interval subdivision by indexing a table entry among table entries using the probability interval index and a probability state index, i.e. p_state, which, in turn, depends on the current probability state associated with the context selected for the bin currently to be derived, to obtain a subdivision of the current probability interval into two partial intervals. In the above-outlined embodiments, these partial intervals were associated with the most probable and least probable symbol. As described above, the entropy decoder 409 may be configured to use an eight-bit representation for the current probability interval width value R with grabbing-out, for example, two or three, most significant bits of the eight-bit representation and quantizing the current probability interval width value. The entropy decoder 409 may further be configured to select among the two partial intervals based on an offset state value from an interior of the current probability interval, namely V, update the probability interval width value R and the offset state value, and infer a value of the bin currently to be derived, using the selected partial interval and perform a renormalization of the updated probability interval width value R and the offset state value V including a continuation of reading bits from the data stream 401. The entropy decoder 409 may, for example, be configured to binary arithmetic decode a bin out of the exponential Golomb code by halving the current probability interval width value to obtain a subdivision of the current probability interval into two partial intervals. The halving corresponds to a probability estimate which is fixed and equal to 0.5. It may be implemented by a simple bit shift. The entropy decoder may further be configured to, for each motion vector difference, derive the truncated unary code of the horizontal and vertical components of the respective motion vector difference from the data stream 401, prior to the exponential golomb code of the horizontal and vertical components of the respective motion vector difference. By this measure, the entropy decoder 409 may exploit that a higher number of bins together form a run of bins for which the probability estimate is fixed, namely 0.5. This may speed up the entropy decoding procedure. On the other hand, the entropy decoder 409 may maintain the order among the motion vector differences by firstly deriving horizontal and vertical components of one motion vector difference with merely then proceeding to derive the horizontal and vertical components of the next motion vector difference. By this measure, the memory requirements imposed onto the decoding entity, i.e. decoder of FIG. 16, is reduced as the desymbolizer 314 may proceed with debinarizing the motion vector differences immediately without having to wait for a scan to further motion vector differences. This is enabled by the context selection: as merely exactly one context is available per bin position of the code 806, no spatial interrelationship has to be inspected.

The reconstructor 404 may, as described above, spatially and/or temporally predict the horizontal and vertical components of motion vectors so as to obtain predictors 126 for the horizontal and vertical components of the motion vector and reconstruct the horizontal and vertical components of the motion vectors by refining the predictors 826 using the horizontal and vertical components of the motion vector differences, such as simply by adding the motion vector difference to the respective predictor.

Further, the reconstructor 404 may be configured to predict the horizontal and vertical components of motion vectors in different manners so as to obtain an ordered list of predictors for the horizontal and vertical component of motion vectors, obtain an list index from the data stream and reconstruct the horizontal and vertical components of motion vectors by refining the predictor to which a predictor of the list to which the list index points using the horizontal and vertical components of the motion vector differences.

Further, as has already been described above, the reconstructor 404 may be configured to reconstruct the video using the motion-compensated prediction by applying the horizontal and vertical component $802x,y$ of the motion vectors at a spatial granularity defined by a subdivision of the video's pictures into blocks wherein the reconstructor 404 may use merging syntax elements present in the data stream 401 so as to group the blocks into merge groups and apply the integer values of the horizontal and vertical components $802x,y$ of the motion vector differences obtained by the binarizer 314, in units of merge groups.

The reconstructor 404 may derive the subdivision of the video's pictures into blocks from a portion of the data stream 401 which excludes the merging syntax elements. The reconstructor 404 may also adapt the horizontal and vertical components of the predetermined motion vector for all blocks of an associated merge group, or refine same by the horizontal and vertical components of the motion vector differences associated with the blocks of the merge group.

For sake of completeness only, FIG. 17 shows an encoder fitting to the decoder of FIG. 16. The encoder of FIG. 17 comprises a constructor 504, a symbolizer 507 and an entropy encoder 513. The encoder comprises a constructor 504 configured to predictively code the video 505 by motion compensated prediction using motion vectors and predictively coding the motion vectors by predicting the motion vectors and setting integer values 506 of horizontal and vertical components of motion vector differences to represent a prediction error of the predicted motion vectors; a symbolizer 507 configured to binarize the integer values to obtain binarizations 508 of the horizontal and vertical components of the motion vector differences, the binarizations equaling a truncated unary code of the horizontal and vertical components, respectively, within a first interval of the domain of the horizontal and vertical components below a cutoff value, and a combination of a prefix in form of the truncated unary code for the cutoff value and a suffix in form of a Exp-Golomb code of the horizontal and vertical components, respectively, within a second interval of the domain of the horizontal and vertical components inclusive and above the cutoff value, wherein the cutoff value is two and the Exp-Golomb code has order one; and an entropy encoder 513 configured to, for the horizontal and vertical components of the motion vector differences, encode the truncated unary code into the data stream using context-adaptive binary entropy encoding with exactly one context per bin position of the truncated unary code, which is common for the horizontal and vertical components of the motion vector differences, and the Exp-Golomb code using a constant equi-probability bypass mode. Further possible implementation details are directly transferable from the description regarding the decoder of FIG. 16 onto the encoder of FIG. 17.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The inventive encoded signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A decoder for decoding a video from a data stream, wherein the video is predictively decoded by motion compensated prediction using motion vectors and motion vector differences representing a prediction error with respect to the motion vectors, the decoder comprising:
    an entropy decoder configured to, for horizontal and vertical components of each of the motion vector differences,
        obtain, from the data stream, a truncated unary code and an Exp-Golomb code,
        decode the truncated unary code using context-adaptive binary entropy decoding with exactly one context per bin position of the truncated unary code, wherein the context is shared by the horizontal and vertical components of the motion vector difference, and
        decode the Exp-Golomb code using a constant equi-probability bypass mode, to obtain the horizontal and vertical components of the motion vector difference; and
    a reconstructor configured to reconstruct the video based on the horizontal and vertical components of the motion vector differences.

2. The decoder according to claim 1, wherein the entropy decoder is configured to use different contexts for the different bin positions of the truncated unary code.

3. The decoder according to claim 1, wherein the entropy decoder is configured to perform a probability state update by, for a bin currently derived out of the truncated unary code, transitioning from a current probability state associated with the context selected for the bin being currently derived, to a new probability state depending on the bin being currently derived.

4. The decoder according to claim 1, wherein the entropy decoder is configured to binary arithmetic decode a bin currently to be derived out of the truncated unary code by quantizing a current probability interval width value representing a current probability interval to acquire a probability interval index and performing an interval subdivision by indexing a table entry among table entries using the probability interval index and a probability state index depending on a current probability state associated with the context selected for the bin currently to be derived, to acquire a sub-division of the current probability interval into two partial intervals.

5. The decoder according to claim 4, wherein the entropy decoder is configured to use an 8-bit representation for the current probability interval width value and to obtain 2 or 3 most significant bits of the 8-bit representation in quantizing the current probability interval width value.

6. The decoder according to claim 4, wherein the entropy decoder is configured to select a partial interval from the two partial intervals based on an offset state value from an interior of the current probability interval, update the probability interval width value and the offset state value, and infer a value of the bin currently to be derived, using the selected partial interval and perform a renormalization of the updated probability interval width value and the offset state value comprising a continuation of reading bits from the data stream.

7. The decoder according to claim 4, wherein the entropy decoder is configured to, in the constant equi-probability bypass mode, binary arithmetic decode a bin out of the Exp-Golomb code by halving the current probability interval width value to acquire a sub-division of the current probability interval into two partial intervals.

8. The decoder according to claim 1, wherein the entropy decoder is configured to, for each motion vector difference, derive the truncated unary code of the horizontal and vertical components of the respective motion vector difference from the data stream, prior to deriving the Exp-Golomb code of the horizontal and vertical components of the respective motion vector difference.

9. The decoder according to claim 1, wherein the reconstructor is configured to spatially and/or temporally predict the horizontal and vertical components of motion vectors so as to acquire predictors for the horizontal and vertical components of the motion vectors and reconstruct the horizontal and vertical components of the motion vectors by refining the predictors using the horizontal and vertical components of the motion vector differences.

10. The decoder according to claim 1, wherein the reconstructor is configured to predict the horizontal and vertical components of motion vectors in different manners so as to obtain an ordered list of predictors for the horizontal and vertical components of motion vectors, obtain from the data stream a list index corresponding to a predictor in the ordered list, and reconstruct the horizontal and vertical components of motion vectors by refining the predictor indicated by the list index using the horizontal and vertical components of the motion vector differences.

11. The decoder according to claim 9, wherein the reconstructor is configured to reconstruct the video using motion-compensated prediction by use of the horizontal and vertical components of motion vectors.

12. The decoder according to claim 11, wherein the reconstructor is configured to reconstruct the video using the motion-compensated prediction by applying the horizontal and vertical components of motion vectors at a spatial granularity defined by a sub-division of the video's pictures in blocks, wherein the reconstructor uses merging syntax elements present in the data stream so as to group the blocks into merge groups and apply the horizontal and vertical components of the motion vector differences, in units of merge groups.

13. The decoder according to claim 1, wherein the data stream comprises at least a portion associated with color samples.

14. The decoder according to claim 1, wherein the data stream comprises at least a portion associated with depth values related to a depth map.

15. An encoder for encoding a video into a data stream, comprising:
- a constructor configured to predictively code the video by motion compensated prediction using motion vectors and horizontal and vertical components of motion vector differences representing a prediction error with respect to the motion vectors; and
- an entropy encoder configured to, for horizontal and vertical components of each of the motion vector differences,
  - encode, into the data stream, a truncated unary code coded using context-adaptive binary entropy encoding with exactly one context per bin position of the truncated unary code, wherein the context is shared by the horizontal and vertical components of the motion vector difference, and
  - encode, into the data stream, an Exp-Golomb code coded using a constant equi-probability bypass mode.

16. The encoder according to claim 15, wherein the entropy encoder is configured to use different contexts for the different bin positions of the truncated unary code.

17. The encoder according to claim 15, wherein the entropy encoder is configured to perform a probability state update by, for a bin currently encoded out of the truncated unary code, transitioning from a current probability state associated with the context selected for the bin currently encoded, to a new probability state depending on the bin currently encoded.

18. The encoder according to claim 15, wherein the entropy encoder is configured to binary arithmetic encode a bin currently to be encoded out of the truncated unary code by quantizing a current probability interval width value representing a current probability interval to obtain a probability interval index and performing an interval subdivision by indexing a table entry among tables entries using the probability interval index and a probability state index depending on a current probability state associated with the context selected for the bin currently to be encoded, to obtain a sub-division of the current probability interval into two partial intervals.

19. The encoder according to claim 15, wherein the constructor is configured to predict the horizontal and vertical components of the motion vectors in different manners so as to obtain a ordered list of predictors for the horizontal and vertical components of motion vectors, obtain from the data stream a list index corresponding to a predictor in the ordered list, and determine the horizontal and vertical components of the motion vector differences so as to refine the predictor indicated by the list index towards the horizontal and vertical components of motion vectors.

20. The encoder according to claim 15, wherein the entropy encoder is configured to, for each motion vector difference, encode the truncated unary code of the horizontal and vertical components of the respective motion vector difference into the data stream, prior to encoding the Exp-Golomb code of the horizontal and vertical components of the respective motion vector difference.

21. The encoder according to claim 15, wherein the constructor is configured to spatially and/or temporally predict the horizontal and vertical components of the motion vectors so as to obtain predictors for the horizontal and vertical components of motion vectors and determine the horizontal and vertical components of the motion vector differences so as to refine the predictors towards the horizontal and vertical components of motion vectors.

22. The encoder according to claim 19, wherein the entropy encoder is configured to select among the two partial intervals based on the integer value of the bin currently to be encoded, update the probability interval width value and a probability interval offset using the selected partial interval and perform a renormalization of the probability interval width value and the probability interval offset comprising a continuation of writing bits to the data stream.

23. The encoder according to claim 15, wherein the constructor is configured to code the video using the motion-compensated prediction by applying the horizontal and vertical components of motion vectors at a spatial granularity defined by a sub-division of the video's pictures in blocks, wherein the constructor is further configured to determine and insert into the data stream, merging syntax elements so as to group the blocks into merge groups and apply the horizontal and vertical components of the motion vector differences, in units of merge groups.

24. The encoder according to claim 15, wherein the data stream comprises at least a portion associated with color samples.

25. The encoder according to claim 15, wherein the data stream comprises at least a portion associated with depth values related to a depth map.

26. A method for decoding a video from a data stream, wherein the video is predictively coded by motion compensated prediction using motion vectors and motion vector differences representing a prediction error with respect to the motion vectors, the method comprising:
- for horizontal and vertical components of each of the motion vector differences,
  - obtaining, from the data stream, a truncated unary code and an Exp-Golomb code,
  - decoding the truncated unary code using context-adaptive binary entropy decoding with exactly one context per bin position of the truncated unary code, wherein the context is shared by the horizontal and vertical components of the motion vector difference, and
  - decoding the Exp-Golomb code using a constant equi-probability bypass mode, to obtain the horizontal and vertical components of the motion vector difference; and
- reconstructing the video based on the horizontal and vertical components of the motion vector differences.

27. A computer program stored on a non-transitory computer-readable medium comprising a program code for performing, when executed on a computer, a method according to claim 26.

28. A non-transitory computer-readable medium for storing data associated with a video, comprising:
- a data stream stored in the non-transitory computer-readable medium, the data stream comprising encoded horizontal and vertical components of motion vector differences, wherein the video is predictively coded by motion compensated prediction using motion vectors encoded in the data stream and the horizontal and vertical components of motion vector differences represent a prediction error with respect to the motion vectors,
- wherein, for horizontal and vertical components of each of the motion vector differences, a truncated unary code is encoded using context-adaptive binary entropy encoding with exactly one context per bin position of the truncated unary code, the context is shared by the horizontal and vertical components of the motion vector difference, and an Exp-Golomb code is encoded using a constant equi-probability bypass mode.

* * * * *